VERY HIGH FREQUENCY COMPUTING CIRCUIT

Filed Aug. 31, 1956 50 Sheets-Sheet 1

INVENTORS
ROBERT M. WALKER
ARTHUR G. ANDERSON
DONALD E. ROSENHEIM
BY Dwight D. Mooney
Wesley De Bruin
ATTORNEYS

VERY HIGH FREQUENCY COMPUTING CIRCUIT

Filed Aug. 31, 1956 50 Sheets-Sheet 2

INVENTORS
ROBERT M. WALKER
ARTHUR G. ANDERSON
DONALD E. ROSENHEIM
BY Dwight D. Mooney
Wesley De Bruin
ATTORNEYS

MULTIPLICAND=10111 (FIRST OR LOWEST ORDER AT LEFT)

Jan. 30, 1962 R. M. WALKER ETAL 3,018,958

VERY HIGH FREQUENCY COMPUTING CIRCUIT

Filed Aug. 31, 1956 50 Sheets-Sheet 12

RESISTANCES IN OHMS } UNLESS SHOWN
CAPACITANCE IN μμfd

VERY HIGH FREQUENCY COMPUTING CIRCUIT

VERY HIGH FREQUENCY COMPUTING CIRCUIT

ADDEND RESHAPER AND RETIMER WAVEFORMS

RESISTANCES IN OHMS
CAPACITANCE IN μμfd } UNLESS SHOWN

VERY HIGH FREQUENCY COMPUTING CIRCUIT

Filed Aug. 31, 1956 50 Sheets-Sheet 20

Jan. 30, 1962 R. M. WALKER ETAL 3,018,958

VERY HIGH FREQUENCY COMPUTING CIRCUIT

Filed Aug. 31, 1956 50 Sheets-Sheet 22

Jan. 30, 1962 R. M. WALKER ETAL 3,018,958

VERY HIGH FREQUENCY COMPUTING CIRCUIT

Filed Aug. 31, 1956 50 Sheets-Sheet 25

VERY HIGH FREQUENCY COMPUTING CIRCUIT

Jan. 30, 1962 R. M. WALKER ETAL 3,018,958

VERY HIGH FREQUENCY COMPUTING CIRCUIT

Filed Aug. 31, 1956 50 Sheets-Sheet 30

VERY HIGH FREQUENCY COMPUTING CIRCUIT

VERY HIGH FREQUENCY COMPUTING CIRCUIT

PUSH BUTTON CONTROLLED SINGLE SHOT M.V. (FIG.11)

VERY HIGH FREQUENCY COMPUTING CIRCUIT

Filed Aug. 31, 1956 50 Sheets-Sheet 38

Jan. 30, 1962 R. M. WALKER ETAL 3,018,958

VERY HIGH FREQUENCY COMPUTING CIRCUIT

Filed Aug. 31, 1956 50 Sheets-Sheet 42

VERY HIGH FREQUENCY COMPUTING CIRCUIT

Filed Aug. 31, 1956

VERY HIGH FREQUENCY COMPUTING CIRCUIT

Filed Aug. 31, 1956 50 Sheets-Sheet 44

Jan. 30, 1962 R. M. WALKER ETAL 3,018,958

VERY HIGH FREQUENCY COMPUTING CIRCUIT

Filed Aug. 31, 1956 50 Sheets-Sheet 49

$2^0\ 2^1\ 2^2\ 2^3\ 2^4$

↓ ↓ ↓ ↓ ↓

| | | |
|---|---|---|
| | 1 0 1 1 1 - MULTIPLICAND | |
| | 1 1 0 1 1 - MULTIPLIER | |
| 1ST PARTIAL PRODUCT | 1 0 1 1 1 | ADDER OUTPUT (TERM. 109) FOR 1ST LOOP PERIOD |
| | 1 0 1 1 1 | |
| SUM OF 1ST & 2ND P.P. | 1 1 1 0 1 0 1 | ADDER OUTPUT (TERM. 109) FOR 2ND LOOP PERIOD |
| | 0 0 0 0 0 | |
| SUM OF 1ST, 2ND & 3RD P.P. | 1 1 1 0 1 0 1 | ADDER OUTPUT (TERM. 109) FOR 3RD LOOP PERIOD. |
| | 1 0 1 1 1 | |
| SUM OF 1ST, 2ND, 3RD & 4TH P.P. | 1 1 1 1 1 1 0 0 1 | ADDER OUTPUT (TERM 109) FOR 4TH LOOP PERIOD |
| | 1 0 1 1 1 | |
| SUM OF 1ST, 2ND, 3RD, 4TH & 5TH P.P. (i.e. PRODUCT) | 1 1 1 1 0 0 0 0 1 1 | ADDER OUTPUT (TERM 109) FOR 5TH LOOP PERIOD |

MULTIPLICAND = $2^0 + 2^2 + 2^3 + 2^4 = 1 + 4 + 8 + 16 = 29$

MULTIPLIER = $2^0 + 2^1 + 2^3 + 2^4 = 1 + 2 + 8 + 16 = 27$

PRODUCT = 783

(PRODUCT) RESULT = $2^0 + 2^1 + 2^2 + 2^3 + 2^8 + 2^9$
$= 1 + 2 + 4 + 8 + 256 + 512 = 783$

FIG. 13D 3,018,958
Patented Jan. 30, 1962

3,018,958

VERY HIGH FREQUENCY COMPUTING CIRCUIT

Robert M. Walker, Closter, N.J., and Arthur G. Anderson, New York, and Donald E. Rosenheim, Long Beach, N.Y., assignors to International Business Machines Corporation, New York, N.Y., a corporation of New York Filed Aug. 31, 1956, Ser. No. 607,970
8 Claims. (Cl. 235—164)

This invention relates to high speed electronic digital computer circuits and more particularly to a binary adder and binary multiplier operable in the very high frequency range.

In the prior art, there is a lack of teaching as to how to provide and combine components to produce a practical embodiment of a very high speed digital computing circuit operable at a pulse repetition rate of substantially upwards of one megacycle.

In order to provide a digital computer operable in a very high frequency range, it is necessary in addition to providing components operable in this range to provide means properly combining the functions of these components. The techniques which apply to the provision of the individual circuit components and to the combining of these components to provide such a computer include the provision of means satisfying the stringent requirements as to pulse rise time, impedance level, geometric circuit layout, pulse transmission, pulse shaping and limiting, and optimum pulse timing for maximum speed of operation.

Accordingly, a principal object of the invention is to provide novel and improved computing circuit operable in the very high frequency range.

Another object is to provide novel computer circuitry operable in response to variable phase clock pulses.

Another object is to provide novel electronic computing circuitry wherein the phase of information pulses determines the phase of clock pulses.

Another object is to provide computing circuitry wherein the delay of an information pulse caused by the inherent characteristics of the circuit does not, because of this delay, require additional operating time.

Another object is to provide a computer wherein clock pulses are caused to occur at the same time that corresponding information pulses occur.

A further object is to provide a novel computing circuit wherein the arrival of different clock pulses is determined by the time occurrence of an information pulse corresponding to the clock pulse.

A still further object is the provision of a high speed digital computer circuit wherein an optimum overall operating time is achieved by employing asynchronous components and obtaining optimum timing between the various components, and for the overall system by the employment of lengths of delay lines each of which render a predetermined time delay and wherein logical operations are performed in an optimum or minimum elapsed time.

A further object is to provide a novel multiplier wherein a product having a predetermined number of digits is obtained in a time equal to the product of the value of the number of digits of the multiplier and 320 millimicroseconds.

A further object is the teaching of techniques employable in the very high frequency range for providing relatively simple and reliable digital computing circuits.

A still further object is to provide a very high speed serial computing system that requires only a very small percentage of the amount of equipment in circuitry necessitated by prior art parallel systems of comparable speed.

A further object is to provide a novel delay circuit wherein the output pulse has a shorter rise time and a shorter fall time than accomplished by delay circuits of the prior art and thereby providing a shorter predetermined delay in the transmission of a pulse.

A further object is to provide an improved delay circuit wherein the information pulse transferred therethrough is formed to permit optimum use of an information period.

A further object is to provide a novel delay circuit for getting information into information periods of substantially one-third microsecond durations.

A further object is to provide a novel delay circuit for gating information at the rate of approximately 3.125 megacycles.

A further object is to provide a novel shifting register for storing information and shifting information at the rate of a small fraction of a microsecond for each digit of information.

A further object is to provide a novel multivibrator which produces an output pulse having a rise time less than 10 millimicroseconds.

A further object is to provide a novel secondary emission multivibrator circuit.

A further object is to provide a novel multivibrator circuit wherein a dynode is coupled to a grid whose voltage excursion is limited by diodes and timing is determined by the cathode circuit.

A still further object is to provide a novel binary adder adapted to operate in the very high frequency range and wherein the input pulses may vary in amplitude over a wide range and the sum and carry manifestations are of substantially constant amplitude.

A still further object is to provide a novel amplifier-limiter circuit capable of operating in the very high frequency range and producing outputs of substantially constant amplitude in response to inputs having substantial variation in amplitude.

A further object is to provide a novel dynamic accumulating storage loop comprising an adder, reshaper and delay line.

A further object is to provide a novel dynamic accumulating storage loop operable in the very high frequency range.

A further object is to provide a novel accumulator wherein clock pulses are supplied to predetermined elements thereof at a time determined by the inherent characteristcs of those elements.

A still further object is to provide a high speed pulse generator adapted to produce a train of accurately timed pulses in response to a single input pulse.

A still further object is to provide a novel multiplicand generator operable in the very high frequency range to produce a binary pulse train wherein the presence of a pulse manifests a binary 1 and the absence of a pulse manifests a binary 0, or vice versa, in response to a single input pulse.

A further object is to provide a novel partial product generator circuit for serially receiving manifestations of multiplicand digits and including means under the dynamic control of a multiplier generator for permitting the selective transfer of the multiplicand in accordance with corresponding values of the multiplier digits.

A further object is to provide an output pulse synchronous with a predetermined megacycle repetition rate in response to a randomly-timed input pulse.

A still further object is to provide a novel single shot electronic gate adapted to operate within the very high frequency range in a synchronized pulse system to provide a single synchronized output pulse which is synchronized with respect to the occurrence of an event occuring at a random time.

Another object is to provide a novel synchronized gating circuit for providing an output pulse wherein a random pulse is controlled by a plurality of synchronized pulses to provide an accurately timed output pulse.

A further object is to provide a novel pulse reshaping circuit including a secondary emission type tube operable in the very high frequency range.

A further object is to provide a novel non-inverting reshaping, amplifying and limiting circuit.

A further object is to provide a novel storage register for receiving information to be stored serially and providing means for storing and reading out the information in parallel.

A further object is to provide a novel indicator register for storing information and including a plurality of storage elements switchable at very high frequency speeds, means for receiving in serial form the information to be stored, and means interposed between the means for receiving information and the storage elements for synchronously conditioning the storage elements to effect storage of the information.

Other objects of the invention will be pointed out in the following description and claims and illustrated in the accompanying drawings, which disclose, by way of example, the principle of the invention and the best mode, which has been contemplated, of applying that principle.

DEFINITIONS

Figure 1A:
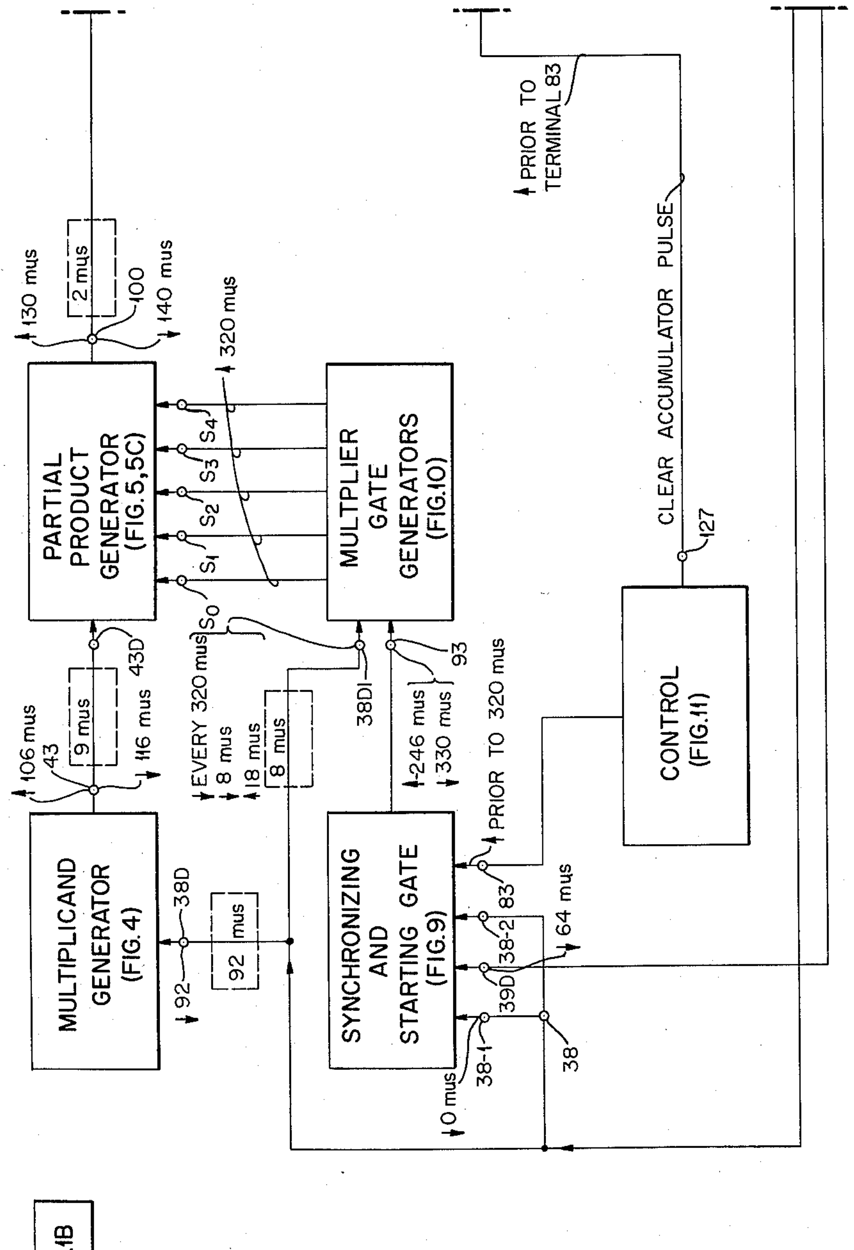
FIG. 1 illustrates the arrangement of FIGS. 1A and 1B to form a block diagram of an embodiment of the novel multiplier and adder of the invention.

As used herein:

Very High Frequency refers to a frequency between 30 and 300 megacycles.

Pulse Repetition Rate is defined as 1 divided by the time interval between a pulse and the next possible successive pulse.

The term UP as applied to a voltage or current indicates a change in a positive direction from a normal level or magnitude.

The term DOWN as applied to a voltage or current indicates a change in a negative direction from a normal level or magnitude.

In the drawings an UP condition is indicated by an arrow pointing in the upward direction and a DOWN condition is indicated by an arrow pointing in the downward direction.

A frequency of a certain number of megacycles per second is set forth in the specification by a number followed by mc.

An elapsed time is referred to in the drawing and in the description by a number followed by mus when the elapsed time is expressed in millimicroseconds, and by a number followed by us when the elapsed time is expressed in microseconds.

ON refers to a conductive circuit condition employable to effect operation of another device.

OFF refers to a non-conductive circuit condition or one not used to effect operation of another device.

A digit period is the time consumed in manifesting a single digit of information and is usually 20 millimicroseconds.

A padding delay is a delay used to delay arrival of a certain pulse at a predetermined destination to bring it into time coincidence with a second pulse.

GENERAL DESCRIPTION

Figure 1:
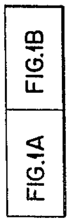
Figure 1B:
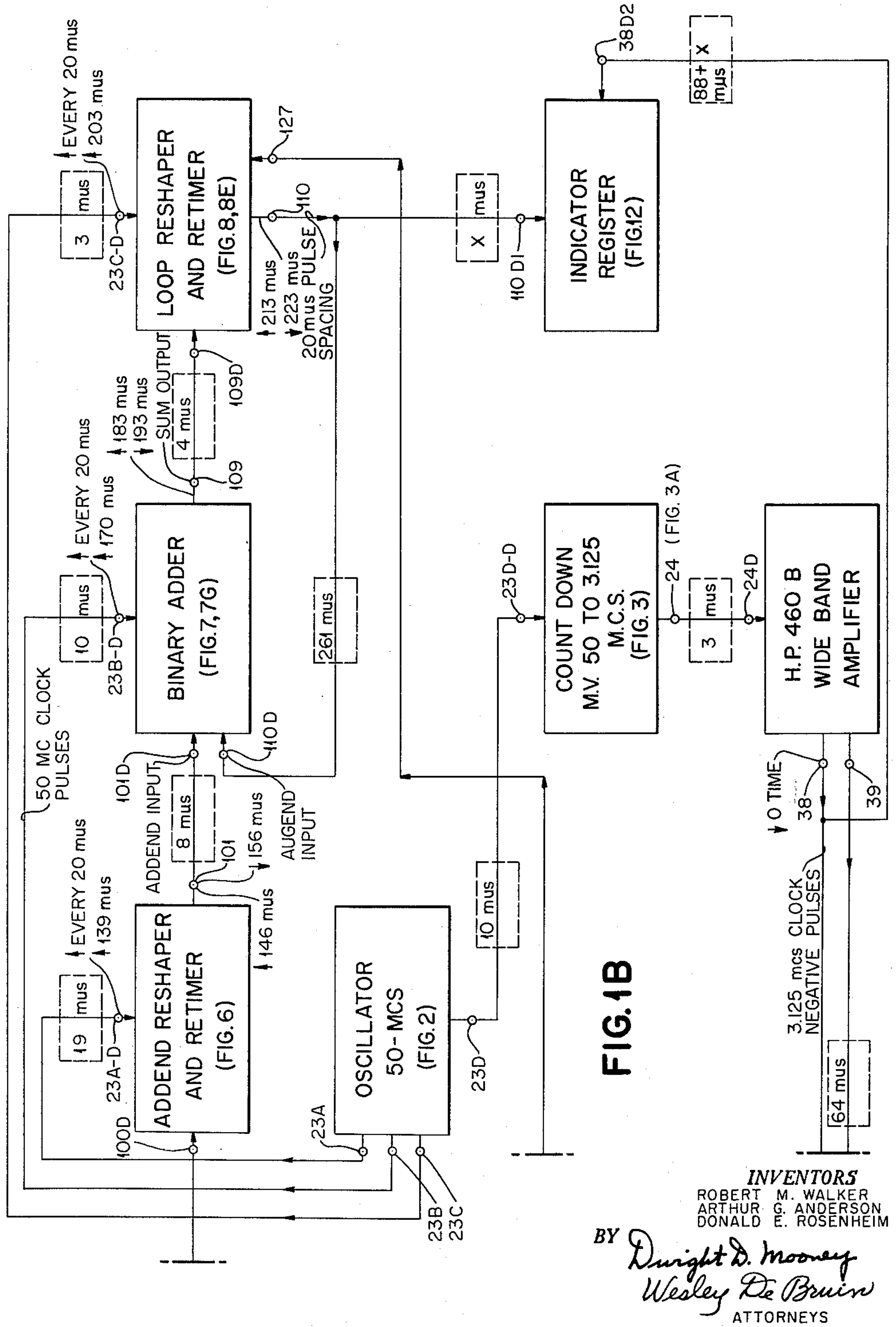

Briefly, FIGS. 1A and 1B arranged as shown in FIG. 1 is a block diagram of an embodiment of the very high frequency adder, multiplier, and 16 binary bit storage loop operable at a pulse repetition rate of 50 megacycles. The transfer time between separate units, indicated on the drawing by solid line blocks, is shown by the time designation or delay written within the appropriate dotted line blocks. It is understood that the times indicated in the dotted blocks are not necessarily fixed times, but are intended merely to illustrate one operative embodiment of the invention. No time so indicated is fixed other than in its relation to other times so indicated and in some instances may be changed without regard to other indicated times.

The invention employs 50 megacycle primary clock pulses which are provided by a 50 megacycle oscillator. These 50 megacycle clock pulses are also counted down and amplified to provide 3.125 megacycle secondary clock pulses. The 50 megacycle primary clock pulses are transferred through delay lines of appropriate lengths to the addend reshaper, the adder, and the loop reshaper. The 3.125 megacycle secondary clock pulses are transferred through appropriate delay lines to the indicator register, synchronizing and start gate, the multiplicand generator and the multiplier generator. The length of the delay line transferring the primary clock pulses to the units enumerated above and hence the actual delay of the primary clock pulses is determined in each instance by the time occurrence of the information input pulses to those units. This is to say that the delay introduced in the primary clock pulses is such that the information pulses are effective when applied to each unit without any delay being introduced by waiting for the arrival of a clock pulse. In a fixed-phased computing system such a waiting is essential. In other words, circuit operation herein occurs in an optimum time or in accordance with a variable phase operation determined by the phase occurrence of the information pulses.

The binary digits of the multiplier are set up by switches in the multiplier gate generators and the binary digits of the multiplicand are set up by switches in the multiplicand generators. The control unit supplies a conditioning pulse to the synchronizing and starting gate so that subsequent secondary clock pulses will cause the synchronizing and starting gate to supply a pulse to the lowest namely $2^0$ order of the multiplier gate generator. The coincidence of this pulse and a secondary clock pulse initiates operation of the multiplier gate generators and causes each digit of the multiplier to be manifested, during a 320 millimicrosecond period, to the partial product generator. The lowest order multiplier digit is manifested during the first 320 millimicrosecond period, the next higher digit during the next 320 millimicrosecond period and so forth.

A secondary clock pulse causes digits of the multiplicand to be transferred to the partial product generator once for each order of the multiplier. A single secondary clock pulse causes all five digits of the multiplicand, lowest order first, to be transferred into the partial product generator during a period of 100 millimicroseconds. This transfer of the multiplicand occurs one time during each 320 millimicrosecond period or in response to each secondary clock pulse received by the multiplicand generators. During the first transfer of the multiplicand or 320 millimicrosecond period, the presence of a binary 1 in the lowest order of the multiplier permits transfer of the multiplicand through the partial product generator to the addend reshaper. Similarly, the presence of a binary 1 in the second, third, fourth or fifth 320 millimicrosecond period due to the presence of a binary 1 in the second, third, fourth or fifth orders, respectively, of the multiplier permits transfer of the multiplicand through the partial product generators to the addend reshaper.

When the multiplicand is first transferred through the product generator, it represents the $2^0$ order of the multiplier times the multiplicand or the first partial product and is therefore transferred without any delay or digital shift; the second transfer of the multiplicand through the partial product generator represents the $2^1$ order of the multiplier times the multiplicand or the second partial product and is therefore shifted one digit position or period to the right relative to the first partial product which means that it is delayed 20 millimicroseconds in its transfer through the partial product generator; similarly, the third transfer of the multiplicand represents the $2^2$ order of the multiplier times the multiplicand or the third partial product and is shifted 40 millimicroseconds relative to the first partial product; the fourth transfer of the multiplicand represents the $2^3$ order of the multiplier times the multiplicand or the fourth partial product and is shifted 60 millimicroseconds relative to the first partial product; and the fifth transfer of the multiplicand represents the $2^4$ order of the multiplier times the multiplicand or the fifth partial product and is delayed 80 millimicroseconds relative to the first partial product. Each pulse representing digits of the partial product is reshaped in the addend reshaper. During the presence of each partial product pulse in the addend reshaper and retimer, a primary clock pulse is provided thereto to permit the reshaping of each partial product pulse without providing any padding delays within the addend reshaper and retimer. Hence, reshaping of all partial product pulses is effected in an optimum time.

These partial product pulses are transferred through the addend reshaper and retimer to the upper input of the adder. These pulses are then transferred through the adder, the loop reshaper and retimer, and the delay line connected to the output of the loop reshaper and retimer to the lower input of the adder. The adder, loop reshaper and retimer, and delay line constitute a recirculation or dynamic storage loop which provides a total delay of 320 millimicroseconds or one period of the secondary clock. The first or lowest order of the first partial product arrives at the lower input of the adder 20 millimicroseconds before the first or lowest order digit of the second partial product arrives at the upper input thereof. Hence, the first and second partial products are added in proper shifted relation by the adder, and the sum thereof recirculated in the recirculation loop. Operation of the binary adder requires the formation and addition of the carries to arrive at the proper sum. These carries are formed and added to the two numbers from which they are derived. The carry pulses are provided by the adder circuitry, reshaped, retimed and added to the numbers from which they are derived. A primary clock pulse is provided to permit reshaping and retiming of each carry pulse. This clock pulse is provided every 20 millimicrosecond period and is applied to a reshaper circuit to permit reshaping of the carry without any padding delay in the operation of the adder.

Similarly, the sum of the first and second partial products is added to the third partial product properly shifted in time to provide the sum thereof, the sum of the first three partial products is added to the fourth partial product, and the sum of the first four partial products is added to the fifth partial product to provide the product of the multiplicand and multiplier at the output of the binary adder.

When each digit of a sum is applied to the loop reshaper and retimer from the output of the adder, it is reshaped and retimed without any padding delay because of the presence of a primary clock pulse at the loop reshaper and retimer. Hence, operation of the addend reshaper and retimer, binary adder, and loop reshaper and timer all are provided with primary clock pulses at such times that they effect their operations at an optimum or maximum speed, that is, without any additional transfer time after the manifestation of the information pulses to the respective units. Hence occurrence in time of the respective clock pulses is determined by the time during which the respective information pulses are manifested at the units concerned. This means that the time occurrence of the respective information pulses determines the length of the delay line connected from the 50 megacycle oscillator.

The output of the loop reshaper and retimer is also applied to the indicator register which permits storage of the contents of the circulation loop. The contents of the circulation loop is read out serially to the indicator register which effects storage thereof and permits read out in parallel therefrom.

COMPONENT CIRCUITS

The component circuits represented by the solid line blocks of the embodiment of FIG. 1 are individually described hereinbelow. The particular tube types employed and the values of the circuit components used are designated on the drawings to facilitate the description thereof, it being understood that the scope of the invention is not limited thereby.

*50 megacycle oscillator, primary clock source*

Figure 2:
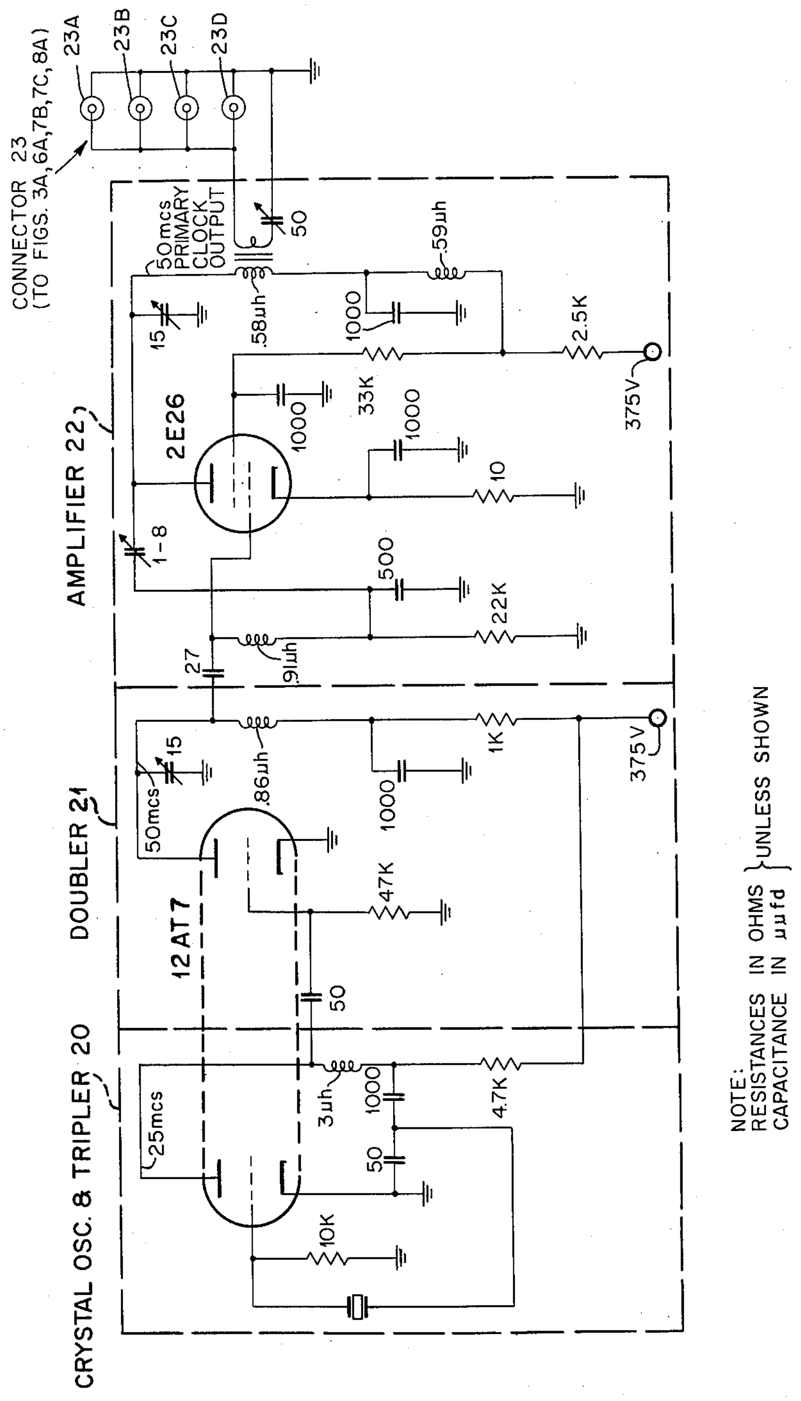
FIG. 2 is a circuit diagram of the 50 megacycle oscillator of FIG. 1B.

The circuit diagram of the 50 megacycle oscillator, used as a source of primary clock pulses, is shown in FIG. 2.

Referring more particularly to FIG. 2, the crystal oscillator 20 and the doubler circuit 21 each employ one half of a 12AT7 twin triode. Crystal oscillator 20 oscillates at a frequency of 8⅓ megacycles per second. The third harmonic of this frequency, or 25 megacycles per second, is transferred to the input of doubler circuit 21 which supplies a sine wave output voltage at a frequency of 50 megacycles to the input of amplifier 22 employing a 2E26 beam tetrode tube. The output of amplifier 22 is applied to the parallel connected terminals 23A, 23B, 23C and 23D of connector 23. Terminals 23A, 23B, 23C and 23D are connected through delay lines to terminals 23A–D, 23B–D, 23C–D and 23D–D, respectively (FIG. 1B) to provide primary clock pulses at predetermined times dependent upon the arrival of information pulses at the respective units to which the latter group of terminals are connected. Hence, with the known arrival time of the information pulses and the known time of occurrence of the clock pulses, the delay is determined which must be afforded by each delay line to cause the simultaneous presence of the two pulses at a predetermined circuit. Also, knowing the delay of the clock pulse which must be effected and the rate of propagation provided by the delay line used, the length of that delay line is determined. However, in determining the rate of propagation, electrical characteristics of the delay lines other than the characteristic impedance must also be considered, such as, for example, the inductance per unit length, capacity per unit length, dielectric constant and permeability. As one example, when a certain coaxial line having a characteristic impedance of 50 ohms is properly terminated at the terminals 23C and 23C–D (FIG. 1B) the length of the line is equal to two feet.

*Count-down circuit—50 megacycles to 3.125 megacycles*

Figures 3, 3A:
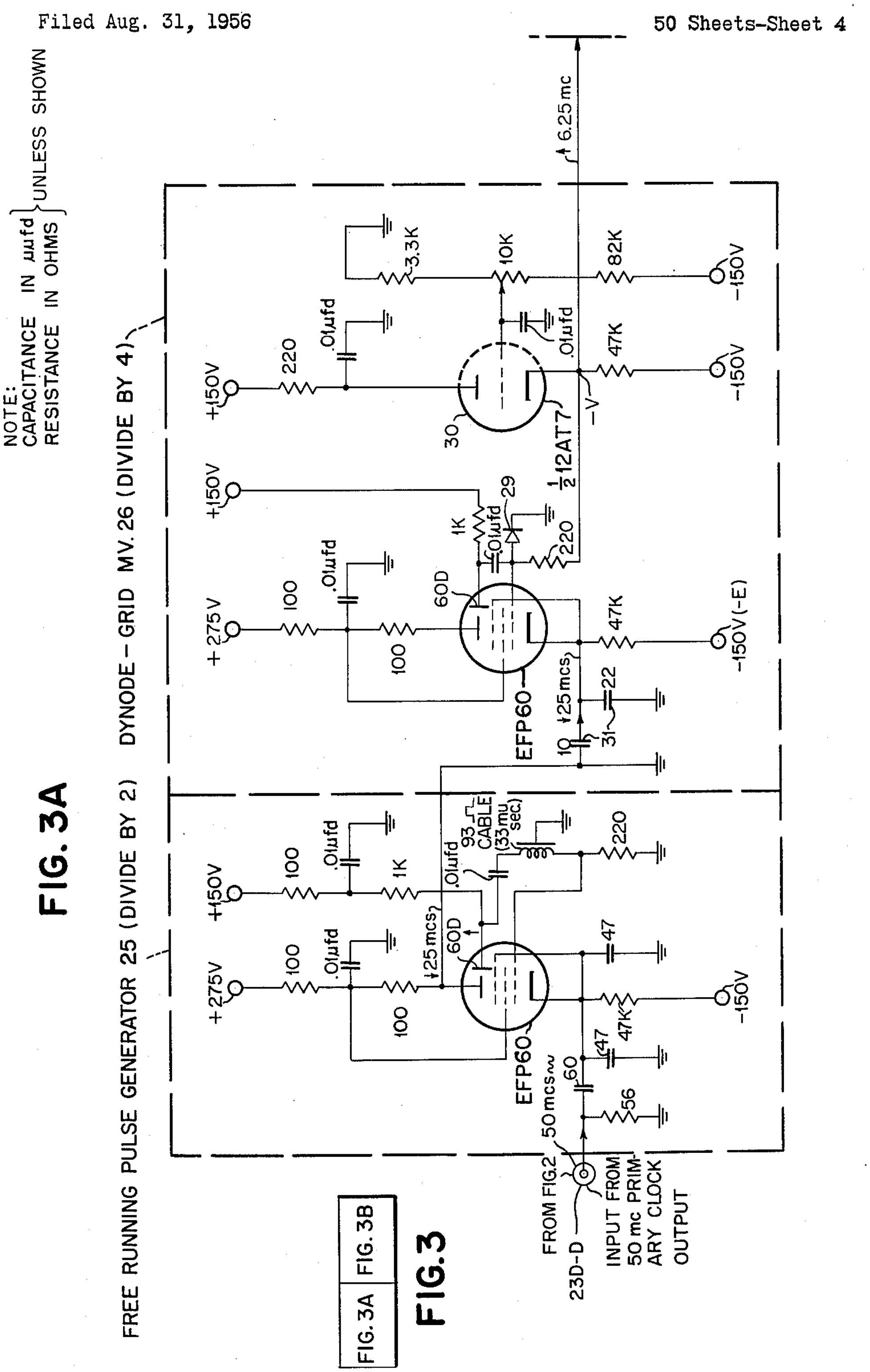
FIG. 3 illustrates the arrangement of FIGS. 3A and 3B to form the circuit diagram of the count-down circuit illustrated in FIG. 1B.
Figure 3B:
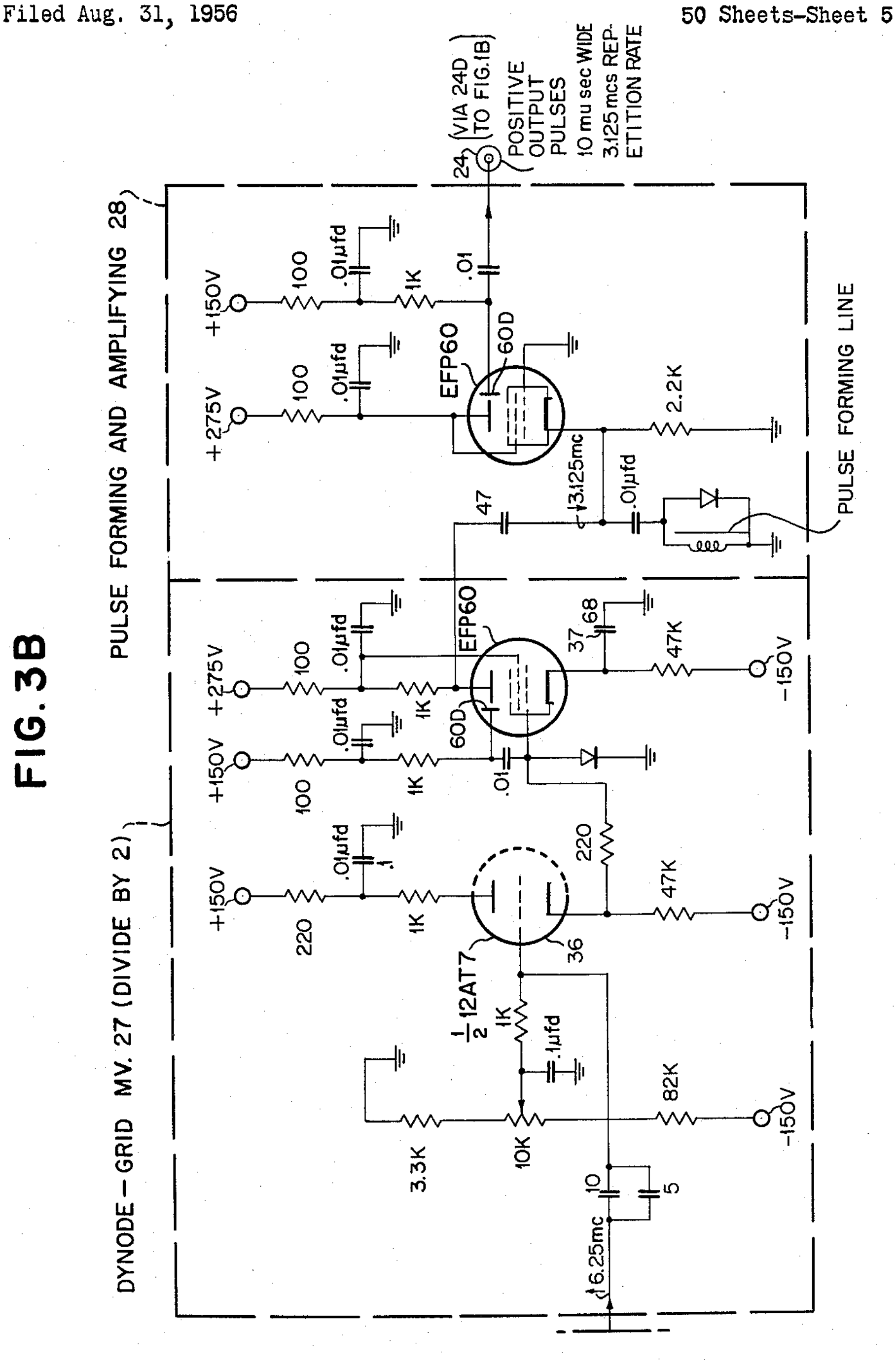
FIG. 3C shows idealized waveforms illustrating the operation of the count-down circuit of FIGS. 3A and 3B.

The circuit diagram of the count-down circuit is formed by FIGS. 3A and 3B arranged as shown in FIG. 3. A 50 megacycle sine wave is applied to terminal 23D–D (FIG. 3A) and provides positive pulses having a repetition rate of 3.125 megacycles and a width of 10 millimicroseconds at terminal 24 (FIG. 3B). The count-down circuit includes a regenerative or free running pulse generator 25 (FIG. 3A) which provides negative pulses having a 25 megacycle repetition rate and a width of 10 millimicroseconds to the dynode-grid multivibrator 26 (FIG. 3A). The multivibrator 26 provides positive pulses having a repetition rate of 6.25 megacycles and a width of 20 millimicroseconds to the dynode-grid multivibrator 27 (FIG. 3B). The multivibrator 27 (FIG. 3B) provides pulses having a repetition rate of 3.125 megacycles and a width of approximately 30 millimicroseconds to the input of the pulse forming and amplifying circuit 28 (FIG. 3B) which provides a positive pulse at terminal 24 (FIG. 3B) having a repetition rate of 3.125 megacycles and a width of approximately 10 millimicroseconds.

The regenerative pulse generator 25 (FIG. 3A) provides negative output pulses having a repetition rate of 25 megacycles and comprises a secondary emission type pentode having a dynode electrode 60D which receives electrons emitted from the cathode. The dynode has a secondary emission ratio greater than 1 and emits approximately five electrons for each incident electron. The secondary electrons are collected at the plate of the tube. Consequently, a positive voltage at the control grid (first grid from cathode) which produces the flow of electrons to the dynode causes the dynode voltage to go positive and the plate voltage to go negative. The pulse generator 25 is free running at a frequency determined by the delay through the secondary emission pentode, the delay through a 93 ohm cable coupled between the dynode and control grid, and by rise time delays at the dynode and the control grid.

The RC circuit in the cathode circuit of the secondary emission pentode causes the tube to perform as a peak sensing device so that it is more sensitive to the largest amplitude pulse circulating in the loop. This loop comprises the interelectrode path of the secondary emission pentode between the control grid and dynode and the 93 ohm cable coupled therebetween. In operation, this increase in sensitivity to large amplitude pulses causes the production of a single recirculating pulse in this loop. This single pulse then recirculates at the output frequency. The delay provided in the loop comprising the interelectrode space and 93 ohm cable is such that the circulating pulse would traverse the loop at approximately 25 megacycles. The 50 megacycle sinusoidal input at terminal 23D–D varies the voltage at the cathode so as to cause the circulating pulse to traverse the loop at exactly 25 megacycles to thereby provide negative output pulses at the plate having a repetition rate of exactly 25 megacycles.

Figure 3C:
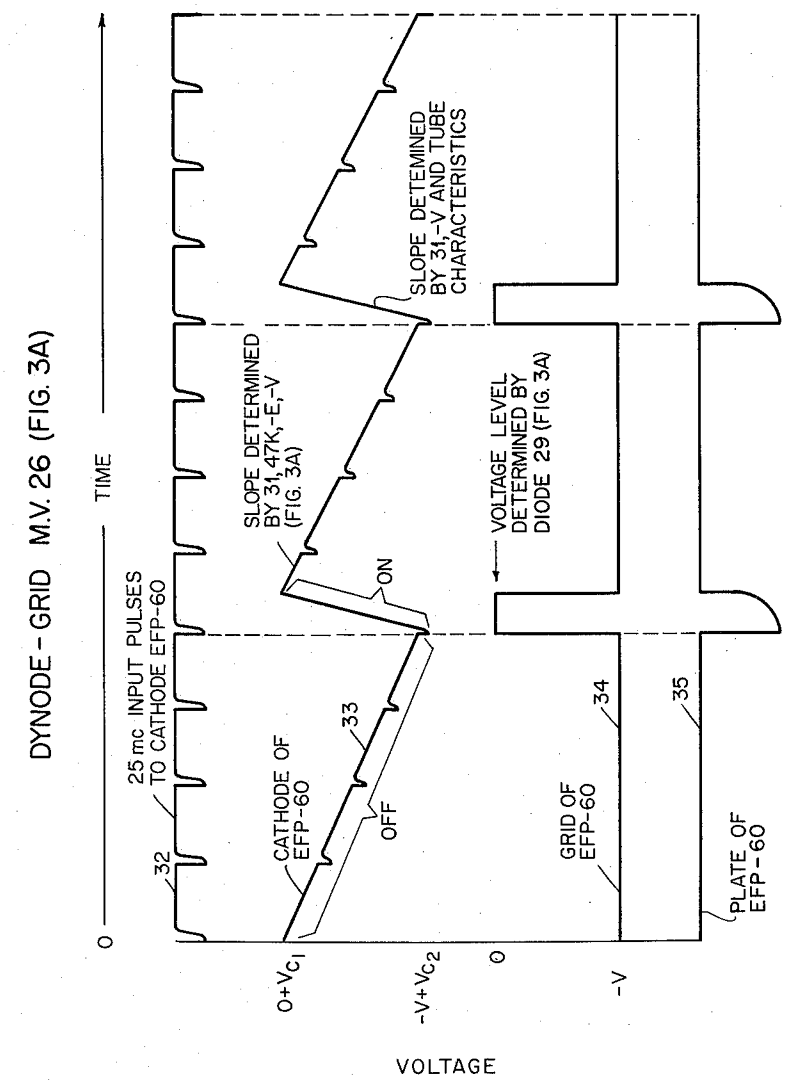

The 25 megacycle negative pulses provided by pulse generator 25 are transferred to the count-down dynode grid multivibrator 26 (FIG. 3A). The waveforms illustrating the operation of the dynode-grid multivibrator 26 are shown in FIG. 3C. As seen from above, dynode to grid feedback in the secondary emission pentode can be used to produce regeneration. Dynode to grid feedback in the dynode-grid multivibrator 26 is used to provide regeneration during the ON and OFF transitions of the circuit while the diode 29 (FIG. 3A) and the cathode follower 30 (FIG. 3A) are used to determine reference voltage levels. The OFF period, i.e., the time during which the secondary emission pentode is non-conducting, is determined by the capacitors 31 (FIG. 3A), by the 47K cathode resistor, by the negative voltage applied thereto, by the tube characteristics and by the reference voltage $-V$ which is determined by the 3.3K resistor, 10K resistor, and the 82K resistor in the grid circuit of the cathode follower 30.

The waveforms of dynode-grid multivibrator 26 shown in FIG. 3C include cathode, grid, plate and input waveforms 33, 34, 35 and 32, respectively. The circuit 26 is an astable multivibrator with a natural period slightly greater than the operating period as a count-down multivibrator. As indicated by the cathode and grid waveforms, the tube is biased such that it can be triggered into conduction by each fourth input pulse. The points of triggering are indicated in FIG. 3C by vertical dotted lines. In FIG. 3C, the cathode waveform 33 varies between $+V_{c_1}$ and $-V+V_{c_2}$. The voltages $V_{c_1}$ and $V_{c2}$ are determined by design considerations. $V_{c1}$ is the voltage at which regeneration provided by the capacitive coupling of the dynode and control grid is no longer sufficient to hold the grid at ground potential. When the voltage $-V+V_{c2}$ is present at the cathode of the EFP 60 tube, the receipt of an input pulse triggers the tube into conduction. The rate of decrease of this cathode voltage is determined by the 22 micro micro farad condenser and the 47K resistor in the cathode circuit of the tube. During the period that the voltage represented by the waveform 33 is decreasing from $V_{c1}$ to $-V+V_{c2}$, the input pulses are ineffective to trigger the multivibrator. However, during this period, these pulses after attenuation are added to the cathode waveform 33 (FIG. 3C). Each fourth 25 megacycle input pulse causes the multivibrator 26 to be triggered into a conductive condition, i.e., the voltage at the plate of the secondary emission tube goes DOWN as shown by curve 35 (FIG. 3C) and the voltage at the grid goes UP as shown by curve 34 (FIG. 3C).

When the EFP 60 tube conducts, i.e., multivibrator 26 is in the ON condition, regeneration from the dynode to the control grid causes the voltage at the control grid to increase until it is clamped at substantially ground potential by diode 29. The value of the positive voltage at the dynode is substantially equal to the difference between the voltage designated as —V (FIG. 3A) at the cathode follower and ground. When the multivibrator 26 is ON, the 22 micro micro farad condenser in the cathode circuit of the tube is charged until it is above ground potential due to the increase of the voltage at the cathode. The multivibrator 26 then switches back to the OFF condition and the voltage at the control grid starts to decrease. The time the multivibrator remains OFF is determined by discharge rate of the 22 micro micro farad condenser and the bias voltage at the control grid. The presence of diode 29 ensures that the OFF time is substantially constant.

The actual frequency division effected by the multivibrator may be changed by changing the value of the grid bias and the 22 micro micro farad condenser.

The dynode-grid multivibrator 26 (FIG. 3A) is particularly advantageous for use at high frequency because of its proper operation with substantial independence of high voltage variation and tube characteristics over a wide range of high frequencies. The EFP 60 secondary emission pentode is operable between limits determined by the diode 29 and the cathode follower 30. The use of these voltage setting devices makes the circuit substantially independent of gain changes in the secondary emission pentode. With the secondary emission pentode, gain changes and variations in the +150 and +275 voltages are of relatively small importance. Variations in the minus supply voltage, —E, produce a change in the rate at which the cathode voltage decreases during the OFF period (i.e., during the period when the secondary emission pentode is non-conducting) and causes compensating changes in the voltage, —V. Consequently, variations in the minus supply voltage, —E, are also of relatively small importance in the operation of the multivibrator. Variations in tube characteristics are exhibited by a variation during the ON time, i.e., during the time when the secondary emission pentode is conducting. In a typical operation, the total period of a cycle of circuit operation is 320 millimicroseconds and the ON time is 30 millimicroseconds. Consequently, a variation in tube characteristics which produced a ten percent variation in ON time would produce a variation in total time of less than one percent; this amount of variation is well within that which can be locked in by the count-down synchronization. This is to say that the synchronization is maintained and the multivibrator is not permitted to free run.

The dynode-grid multivibrator 27 (FIG. 3B) is substantially similar to the dynode-grid multivibrator 26 (FIG. 3A). The synchronizing voltage of 6.25 megacycle repetition rate is applied to the grid of the cathode follower 36 of multivibrator 27 from the cathode follower 30 of multivibrator 26 (FIG. 3A), and the output of the EFP 60 secondary emission tube of multivibrator 27 is transferred from the plate thereof to the cathode of of the EFP 60 secondary emission tube of multivibrator ing and amplifying circuit 28 (FIG. 3B). The value of the capacitor 37 (FIG. 3B) is determined by the desired repetition rate of 3.125 megacycles to be provided by the multivibrator 27. The negative 3.125 megacycle pulses from the plate of the secondary emission pentode have a width of approximately 30 millimicroseconds. The presence of the 47 micro micro farad differentiating capacitor and the pulse forming line (FIG. 3B) causes a 10 millimicrosecond negative pulse to be produced at the cathode of the grounded grid secondary emission amplifier circuit 28 (FIG. 3B). This 10 millimicrosecond pulse is amplified and appears at the output terminal 24.

*Wide band amplifier.*—The wide band amplifier (FIG. 1B) is a standard Hewlett-Packard amplifier, model 460-B, sold by Hewlett-Packard, Inc., California. This amplifier is an inverting amplifier with a gain of 18 db with 200 ohm output impedances. This amplifier is described in the Hewlett-Packard Journal, vol. 1, No. 11, dated July 1950 and published by the Hewlett-Packard Company, Palo Alto, California. The output of terminal 24 of the count-down multivibrator (FIG. 1B) is connected through a 3 millimicrosecond delay (FIG. 1B) to the terminal 24D (FIG. 1B) which represents the input of the wide band amplifier (FIG. 1B). The output of the wide band amplifier is provided at terminals 38 and 39 at which negative pulses having a repetition rate of 3.125 megacycles appear.

Figures 4, 4A:
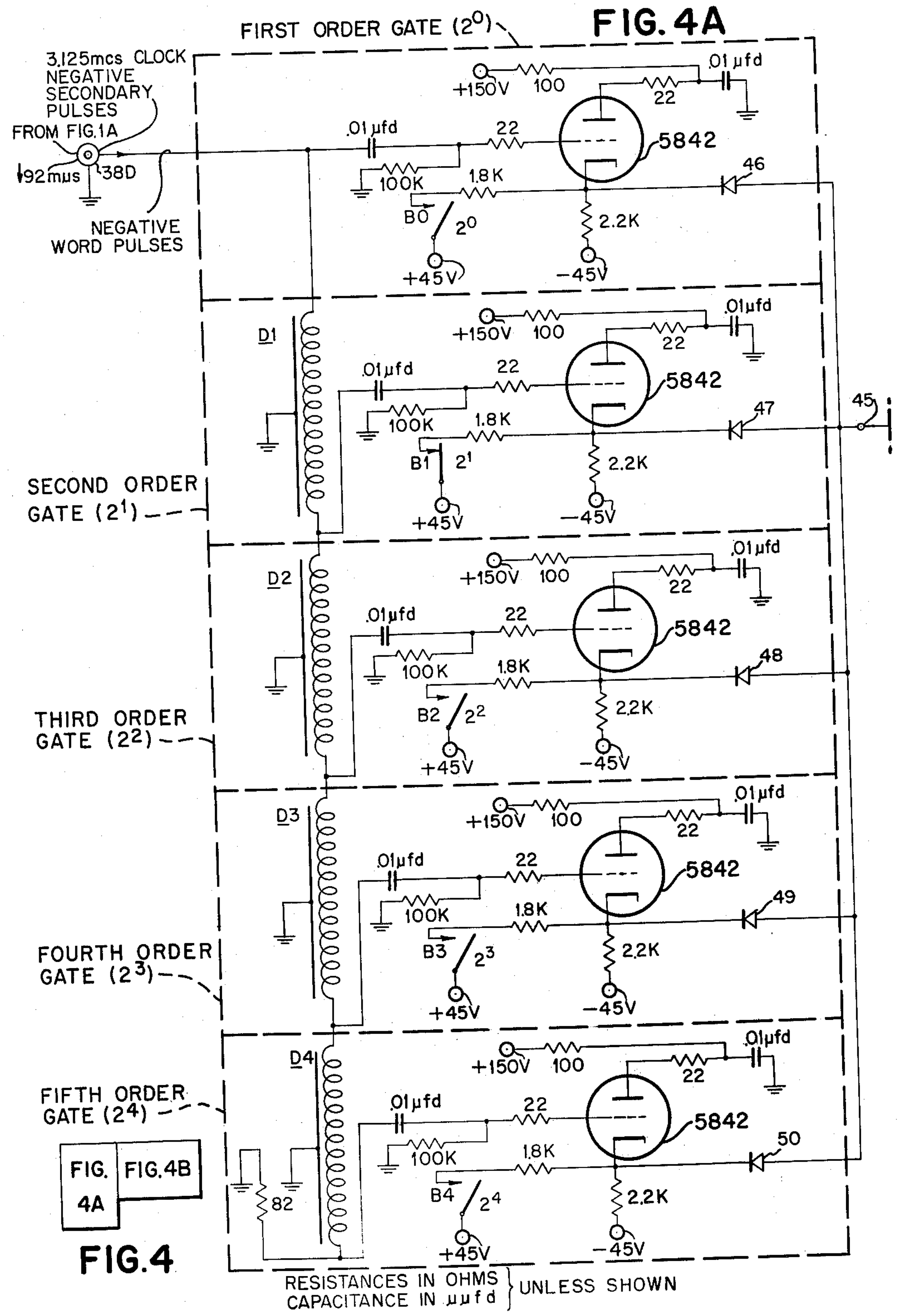
FIG. 4 shows the arrangement of FIGS. 4A and 4B to form a circuit diagram of the multiplicand generator illustrated in FIG. 1A.
Figure 4B:
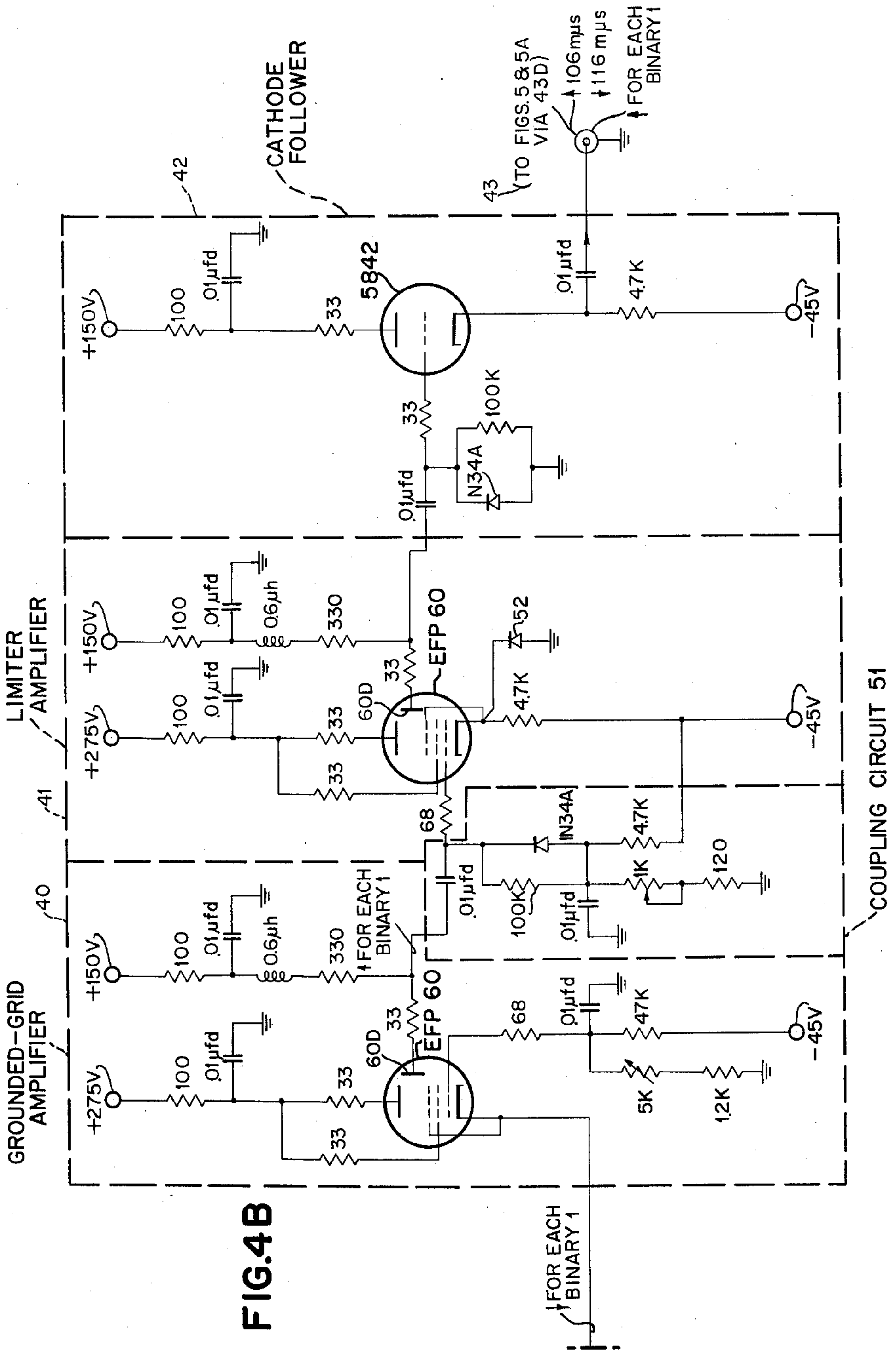
FIG. 4C is a timing chart illustrating the operation of the multiplicand generator shown in FIGS. 4A and 4B.
Figure 4C:
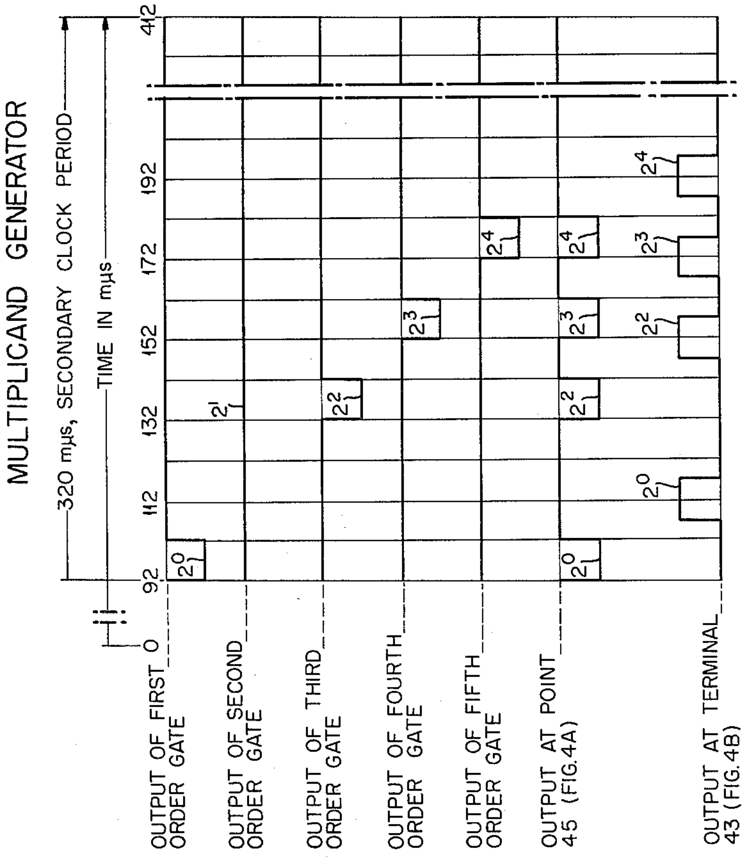

*Multiplicand generator.*—A circuit diagram of the multiplicand generator is shown in FIGS. 4A and 4B arranged as shown in FIG. 4. Idealized pulses illustrating the operation of the multiplicand generator of FIG. 4 are shown in FIG. 4C. Description of the operation of the multiplicand generator is undertaken by conjoint reference to FIGS. 4A, 4B and 4C.

Negative secondary clock pulses are received from the wide band amplifier at terminal 38D (FIG. 4A) after being delayed 92 millimicroseconds. The multiplicand generator includes a gate circuit (FIG. 4A) corresponding to each of the five binary bits of the multiplicand, a grounded grid amplifier 40 (FIG. 4B), a limiter amplifier 41 (FIG. 4B) and a cathode follower 42 (FIG. 4B).

A secondary clock pulse received at terminal 38D is transferred through the first order gate (FIG. 4A) without substantial delay. This same pulse is transferred serially through delay lines D1, D2, D3 and D4 to the second, third, fourth and fifth order gates, respectively. Each delay line affords a delay of 20 millimicroseconds in the transfer of a pulse applied to terminal 38D. Hence, at the end of 20 millimicroseconds after a pulse is applied to terminal 38D, it is applied to the second order gate and so forth until this pulse is applied to the fifth order gate after an elapsed time of 80 millimicroseconds following its arrival at terminal 38D.

Each of the gates (FIG. 4A) includes a switch which is closed when the multiplicand digit of that order is a binary 0 and is opened when the binary digit of that order is a binary 1. If it is desired to enter a multiplicand of 10111, representing increasing powers of two from the left, the switches B0–B4 will be placed in the positions shown in FIG. 4A. That is, switch B0 of the first gate is opened to indicate that the $2^0$ digit is a binary 1. Switch B1 of the second order gate is closed to indicate that the binary digit corresponding to $2^1$ is a binary 0 and switches B2, B3 and B4 corresponding to the third, fourth and fifth order gates, respectively, are opened to indicate that the binary digits corresponding to $2^2$, $2^3$ and $2^4$ are each a binary 0. A secondary clock pulse appears at terminal 38D during each secondary clock period or 320 millimicroseconds.

When the switches B0–B4 (FIG. 4A) are in the positions shown four negative pulses appear serially at terminal 45 (FIG. 4A) representing the binary number 10111. These pulses cause four positive pulses to appear at the output terminal 43 (FIG. 4B) after a transit time delay of 14 millimicroseconds through the amplifiers 40 and 41 and cathode follower 42 (FIG. 4B).

The circuit of each order gate (FIG. 4A) is similar and the operation of the multiplicand generator may be understood by considering the first order gate (FIG. 4A). The appearance of a negative secondary clock pulse at terminal 38D (FIG. 4A) produces a negative pulse at the grid of the first order cathode follower including a high transconductance triode such as the Western Electric type 5842. This cathode follower is illustrated with a parasitic suppressor of 22 ohms in the grid and plate circuit of the triode to prevent spurious oscillations. The negative pulse appearing at the grid of this triode is gated through the cathode follower by the switch B0. In operation, the tube is biased to the cutoff or non-conducting condition when switch B0 is closed. As a result, negative pulses at the control grid do not appear at the diode 46 (FIG. 4A) or at the terminal 45 (FIG. 4A) comprising the output of the OR circuit which includes diodes 46–50.

When the switch B0 is open, the appearance of a negative pulse at the grid of the first order cathode follower causes the voltage at the cathode of the cathode follower triode to decrease and a negative pulse is produced at the cathode of the diode 46 and at the output of the OR circuit, terminal 45. In a similar manner, the outputs of the second order, third order, fourth order and fifth order gates appear as gated by the switches B1, B2, B3 and B4 at the output of the OR circuit, terminal 45.

The output of the OR circuit, terminal 45 (FIG. 4A), is transferred to the grounded grid amplifier 40 (FIG. 4B). In operation, this amplifier including an EFP 60 secondary emission pentode is normally biased to cut off. The appearance of negative pulses at the cathode of this tube causes the tube to conduct and provide a positive output to the grid of the limiter amplifier 41 (FIG. 4B). Positive pulses appearing at the cathode of amplifier 40 (FIG. 4B) would have no effect on the operation of the amplifier because the tube is normally biased to cut off.

The output of the grounded grid amplifier 40 (FIG. 4B) is transferred to the limiter amplifier 41 (FIG. 4B) through the coupling circuit 51 which provides capacitor coupling, D.C. restoration and variable tube bias. In operation, limiter amplifier 41 (FIG. 4B) is normally biased to cut off so that the EFP 60 tube is non-conducting, the diode 52 is conducting and current is flowing through the 4.7K resistor to −45 volts. When a positive pulse sufficient to overcome the tube bias is transferred from the coupling circuit 51, this secondary emission pentode tube conducts current between the cathode and dynode and between the dynode and plate. The diode 52 is a low impedance diode with fast recovery characteristics such as Raytheon type CK741, sold by Raytheon Manufacturing Company, Waltham, Massachusetts. This gold bonded diode permits the tube to operate essentially as a grounded cathode amplifier so long as the cathode current is less than the current through the 4.7K cathode resistor. However, when the cathode current through the tube reaches the value such that the diode 52 ceases to conduct, the 4.7K resistor provides degeneration and the cathode current is substantially limited. The secondary emission pentode causes this limited cathode current to appear at the dynode terminal as an amplified limited current. Consequently, the operation of the limiter amplifier 41 is such that signals below the bias level of the tube have no effect upon its operation and signals larger than that needed to cut off diode 52 provided limited output pulses to the cathode follower 42 (FIG. 4B). Hence, pulse amplitude variations which may arise in preceding circuitry are compensated for by the limiter amplifier.

The cathode follower 42 (FIG. 4B) includes A.C. coupling to the input and output thereof, D.C. restoration, and parasitic suppressors in the grid and plate circuit. The cathode follower 42 uses a high transconductance triode such as, for example, Western Electric type 5842 sold by Western Electric Corporation, Cincinnati, Ohio.

FIG. 4C shows the time occurence of pulses in the multiplicand generator (FIG. 4) when a multiplicand of 10111 is to be exhibited thereby at the output terminal 43 (FIG. 4B). The first secondary clock pulse is supplied by the wide band amplifier (FIG. 1B) at zero time and is applied to the terminal 38D (FIGS. 1A, 4A) 92 millimicroseconds later. Since the first order gate exhibits the binary digit determined by the setting of its switch B0 at its cathode without substantial relay, the left hand or $2^0$ order of the multiplicand is exhibited by a negative pulse at the cathode of the first order gate (FIG. 4A) at the beginning of the first secondary clock period or at 92 millimicroseconds after terminal 38 of the wide band amplifier (FIG. 1B) provides the first secondary clock pulse. For brevity this is referred to as 92 time. This pulse appears at terminal 45 (FIGS. 4A, 4C) without substantial delay and the corresponding inverted or positive pulse appears at the output terminal 43 (FIGS. 4B, 4C) approximately 14 millimicroseconds after the input to terminal 38D (FIG. 4A) or at 106 times. Since each information or digit pulse has a duration of 10 millimicroseconds, the cathode of the first order gate (FIG. 4A) goes UP at 102 time, terminal 45 goes UP at 102 time, and the output terminal 43 (FIGS. 4B, 4C) goes UP at 106 time. Since delay line D1 (FIG. 4A) provides a delay of 20 millimicroseconds in transferring a clock pulse from terminal 38D to the input of the second order gate, a binary 1 in the $2^1$ or second order would appear 20 millimicroseconds later than that for the first order. However, in the example shown (FIG. 4C), the second order digit is a binary 0, hence is represented by the absence of a pulse. The binary digit of the third, fourth and fifth binary orders is a binary 1 in each instance. Hence, these pulses occur at the output of the multiplicand generator 40, 60 and 80 millimicroseconds, respectively, later than the pulse representing the binary 1 digit of the first order of the multiplicand.

Hence, each secondary clock pulse applied to the input terminal 38D (FIG. 4A) of the multiplicand generator causes the multiplicand to be serially exhibited one time at the output terminal 43 (FIG. 4B) thereof. The multiplicand will be so exhibited once during each secondary clock period of 320 millimicroseconds as long as that multiplicand is indicated or called for by the setting of the switches B0–B4 (FIG. 4A). Hence, if multiplication is to be effected by the process of over and over addition as in the embodiment shown herein, the multiplicand must be exhibited at the output terminal 43 (FIG. 4B) a number of times at least equal to the number of addition periods required by the process.

*Partial product generator*

Figure 5:
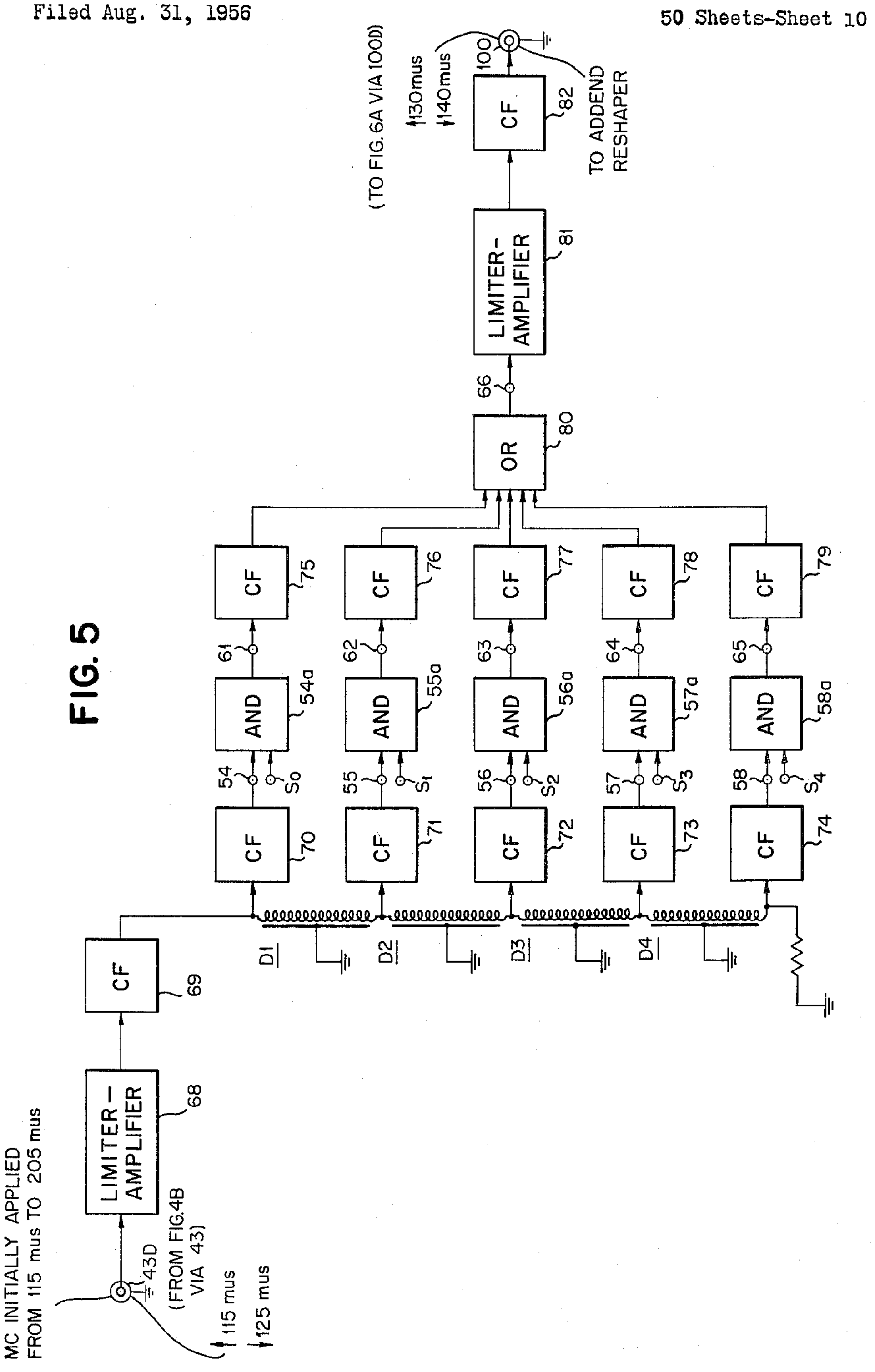
FIG. 5 is a block diagram of the partial product generator illustrated in FIG. 1A.
Figures 5A, 5C:
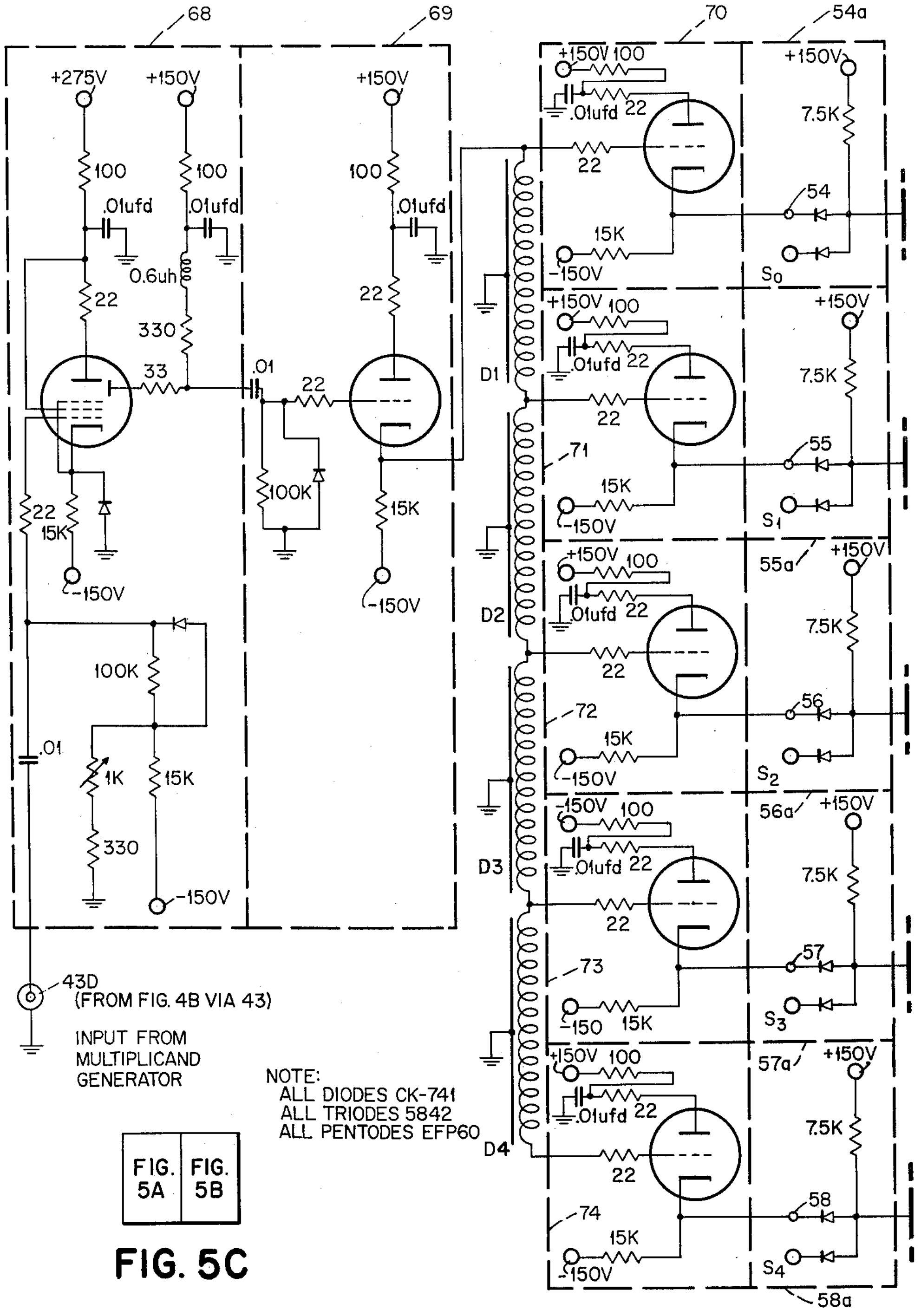
FIG. 5C shows the arrangement of FIGS. 5A and 5B to form a circuit diagram of the partial product generator shown in FIG. 5.
Figure 5B:
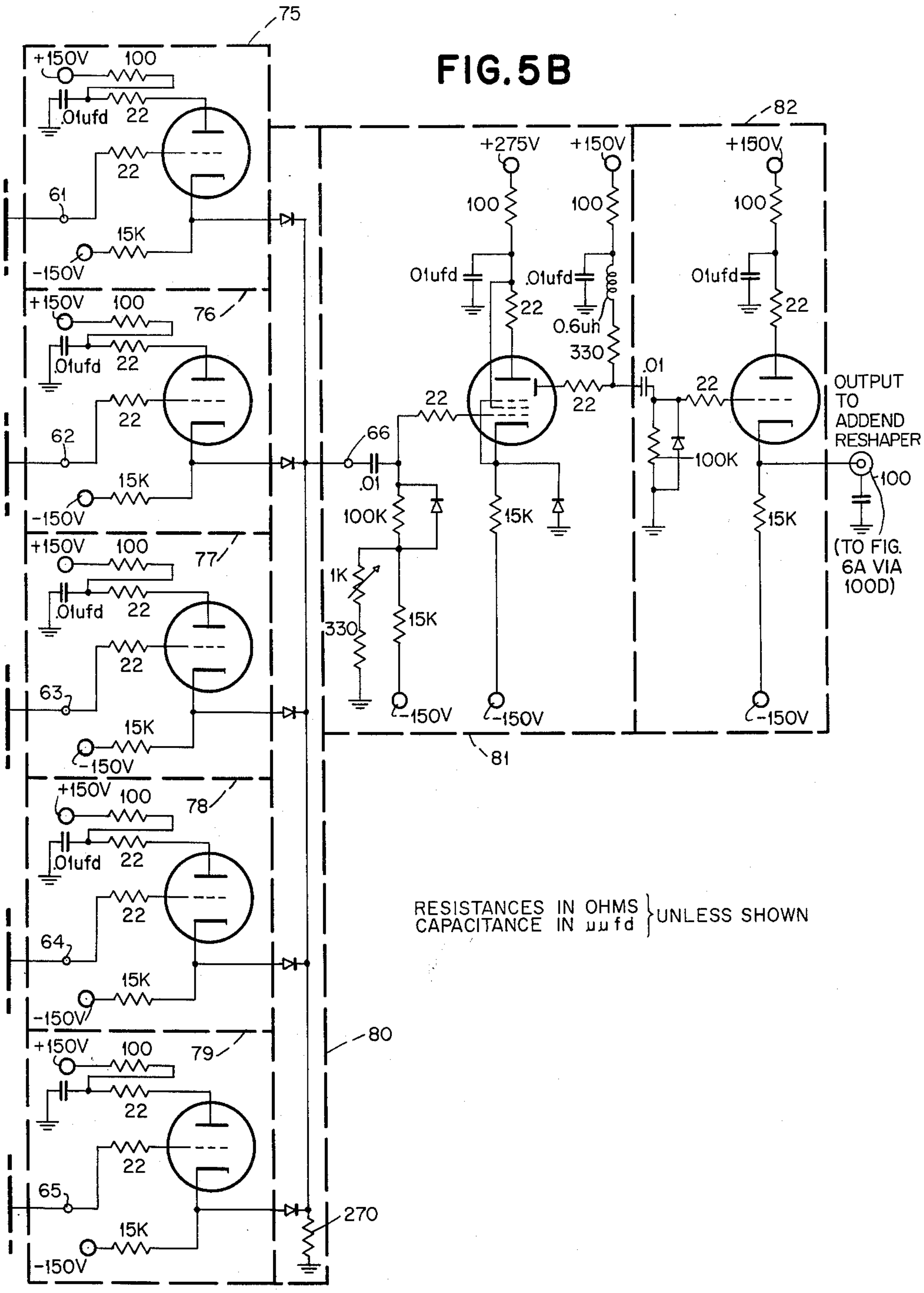
FIG. 5D shows idealized waveforms illustrating the operation of the partial product generator of FIG. 5 when effecting the solution of a particular multiplication problem.

The partial product generator is shown in block diagram form in FIG. 5 and the corresponding circuit diagram therefor is shown in FIGS. 5A and 5B arranged as shown in FIG. 5C. The operation of the partial product generator is illustrated in the timing chart of FIG. 5D for a multiplicand having a value of 10111 and a multiplier of 11011. The operation of the partial product generator is explained by conjoint reference to FIGS. 5, 5C and 5D.

Figure 5D:
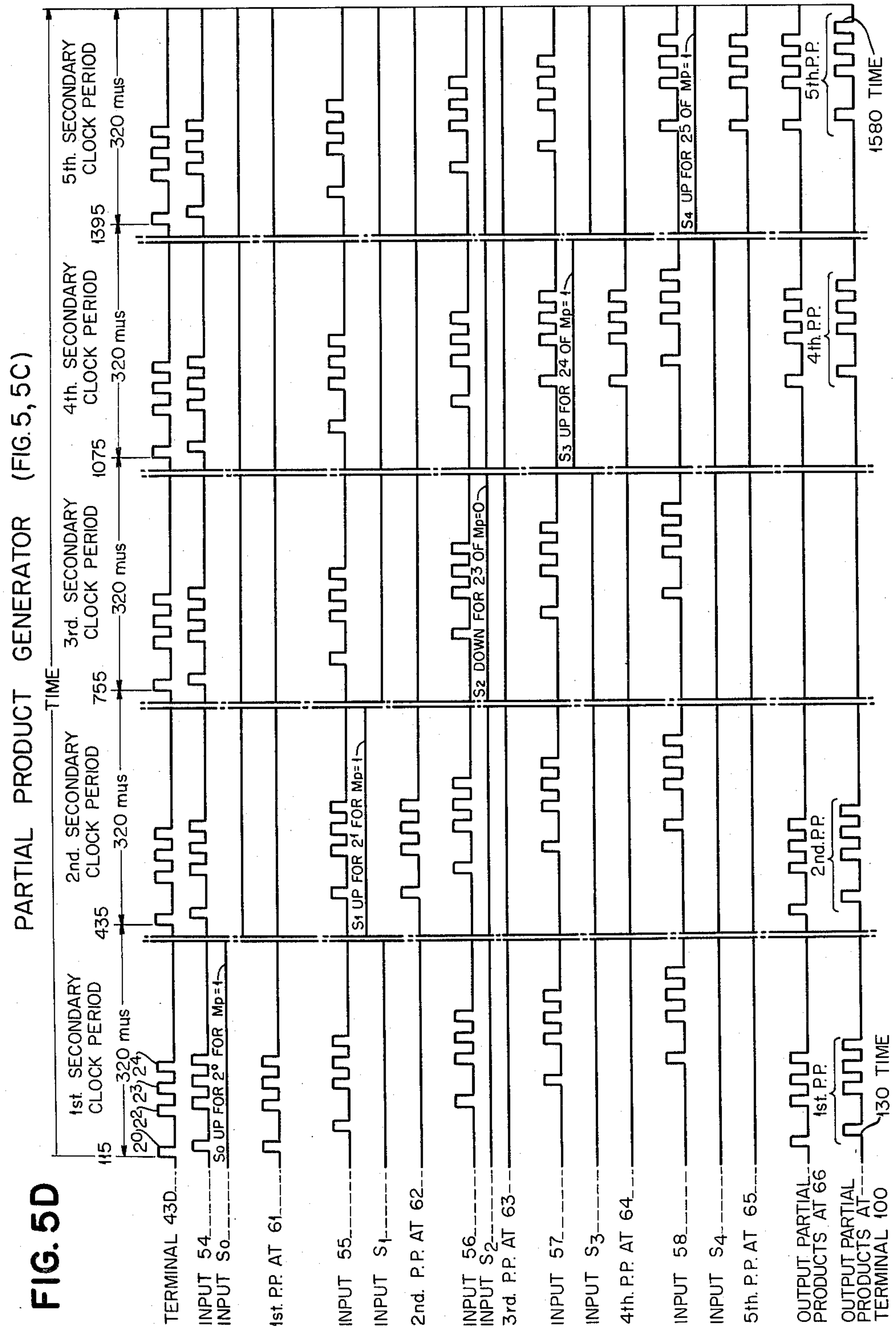

Initially, receipt of the multiplicand appears at 115 time at the terminal 43D (FIGS. 5, 5A, 5D). This multiplicand is applied from the multiplicand generator (FIG. 4) one time for each digit of the multiplier. If during the first application of the multiplicand or secondary clock period the lowest order ($2^0$) of the multiplier is a binary 1, the multiplicand is transferred to output terminal 100 (FIGS. 5, 5B, 5D) beginning at 130 time. Similarly, during each four subsequent clock periods, if the digit of each corresponding multiplier digit is a binary 1, the multiplicand is applied to the terminal 43D (FIGS. 5, 5A, 5D) and transferred to the terminal 100 (FIGS. 5, 5B, 5C). When the corresponding digit of the multiplier is a binary 0, there is no transfer of the multiplicand to the terminal 100.

Input pulses from the multiplicand generator are applied to terminal 43D and the limiter amplifier 68 amplifies these pulses and compensates for the amplitude variations which may have occurred in preceding circuitry. The output of the limiter amplifier 68 (FIG. 5A) is transferred to the cathode follower 69 which provides a low impedance output for driving the serially connected delay lines D1–D4 each of which provides a delay of 20 millimicroseconds. Cathode follower 70 transfers the multiplicand digits from the output of the cathode follower 69 to the input 54 of AND circuit 54*a*. Cathode followers 71–74 provide non-loading taps on the serial delay lines D1–D4. The outputs of cathode followers 71–74 receive multiplicand digits shifted by successive digit spacings or 20 millimicroseconds to the terminals 55, 56, 57 and 58 of AND circuits 55*a*, 56*a*, 57*a* and 58*a*, respectively. The inputs $S_0$, $S_1$, $S_2$, $S_3$ and $S_4$ of AND circuits 54*a*, 55*a*, 56*a*, 57*a* and 58*a*, respectively, receive the corresponding digits of the multiplier. When a particular multiplier digit is a binary 1, an UP voltage is provided to that input of the corresponding one of the AND circuits 54*a*–58*a* for substantially the entire secondary clock period corresponding to the binary order of that digit. For example, if the first or $2^0$ order of the multiplier is a binary 1, the terminal $S_0$ of AND circuit 54*a* is UP for substantially the entire first secondary clock period to permit the transfer of the multiplicand to the output terminal 61 of AND circuit 54*a*; if a binary 1 is present in the second or $2^1$ order of the multiplier, an UP voltage applied to the terminal $S_1$ of AND circuit 55*a* during the second secondary clock period permits transfer of the multiplicand during that period to the output terminal 62 of AND circuit 55*a*; similarly, during the third, fourth and fifth secondary clock periods, a binary 1 in the $2^2$, $2^3$ and $2^4$ order respectively, of the multiplier will permit transfer of the appropriately shifted multiplicand through the corresponding AND circuit.

It is now apparent that the transfer of the multiplicand in response to a binary 1 in each successive higher order of the multiplier effects an additional delay of 20 millimicroseconds in the transfer of the multiplicand in response thereto, hence provides a shift of the multiplicand one digit position for each successively higher multiplier digit.

Cathode followers 75–79 provide non-loading outputs for AND circuits 54*a*–58*a* at terminals 61–65 and transfer the multiplicand digits to their respective terminals of the OR circuit 80. These cathode followers function as a low impedance driving source for the OR circuit 80 without loading the AND circuits 54*a*–58*a*. The output terminal 66 of the OR circuit 80 provides the successive partial products during corresponding successive secondary clock periods. Limiter amplifier 81 provides amplification and compensation for pulse amplitude variation which may have arisen in the preceding circuitry. The cathode follower 82 driven from limiter amplifier 81 transfers the partial products to the output terminal 100.

The transfer of a pulse through the limiter amplifier 68 and cathode follower 69 requires approximately 7 millimicroseconds and the transfer of a pulse through OR circuit 80, limiter amplifier 81 and cathode follower 82 requires approximately 8 millimicroseconds. Hence, the transfer of a pulse through the partial product generator requires approximately 15 millimicroseconds.

FIG. 5C shows the circuit corresponding to the block diagram representation of FIG. 5. The circuits of FIG. 5C corresponding to the blocks in FIG. 5 are similarly designated. The AND circuits 54*a*–58*a* are similar and utilize diodes of low forward impedance, e.g., 10 ohms, and fast recovery characteristics to provide a recovery time of several millimicroseconds. An example of such a diode is Raytheon type CK741 sold by Raytheon Manufacturing Corporation, Waltham, Massachusetts. The OR circuit 80 also utilizes diodes having low forward impedance, e.g., 10 ohms, and fast recovery characteristics, e.g., back and forward recovery times of several millimicroseconds or less.

FIG. 5D illustrates the pulse transfer through the partial product generator when the multiplicand 10111 is multiplied by the multiplier 11011. The multiplicand is applied to the input terminal 43D (FIGS. 5, 5A, 5D) during five successive secondary clock periods each of 320 millimicroseconds duration. Hence, initial transfer of the multiplicand starts during the first secondary clock period at 115 time during the second period at 435 time and so forth as shown on FIG. 5D.

During the first secondary clock period, the presence of a binary 1 in the $2^0$ order of the multiplier causes the multiplier generator described hereinafter to supply an UP voltage to terminal $S_0$ (FIG. 5D) of AND circuit 54*a* (FIG. 5) during substantially the entire 320 millimicroseconds. Hence, the multiplicand representing the first partial product appears at output terminal 61 of AND circuit 54*a* (FIGS. 5, 5D). During this first secondary clock period, both terminals of AND circuits 55*a*–58*a* are DOWN.

During the second secondary clock period, the presence of a binary 1 in the $2^1$ order of the multiplier causes an UP voltage to be applied to terminals $S_1$ of AND circuit 55*a* and permits the multiplicand, representing the second partial product, to be transferred to output terminal 62 (FIGS. 5, 5D) of AND circuit 55*a*.

During the third secondary clock period, the terminals $S_0$–$S_4$, under the control of the multiplier gate generator, are DOWN. This is because a binary 0 is present in the $2^2$ order of the multiplier. Similarly, the presence of a binary 1 in the $2^3$ and $2^4$ orders of the multiplier during the fourth and fifth secondary clock periods, respectively, permits the multiplicand representing the fourth and fifth partial products, respectively, to be transferred to the output terminals 64 and 65 (FIGS. 5, 5D) of the respective AND circuits 57*a* and 58*a*.

Hence, the multiplicand is transferred in proper time sequence to the terminals 61, 62, 64 and 65 (FIGS. 5, 5D) to represent the first, second, fourth and fifth partial products. The first manifestation of the first partial product appears as an UP voltage at the output terminal 100 (FIGS. 5, 5B, 5D) at 130 time and the last manifestation of the fifth partial product is terminated at terminal 100 at 1580 time.

*Addend reshaper and retimer*

Figures 6, 6A:
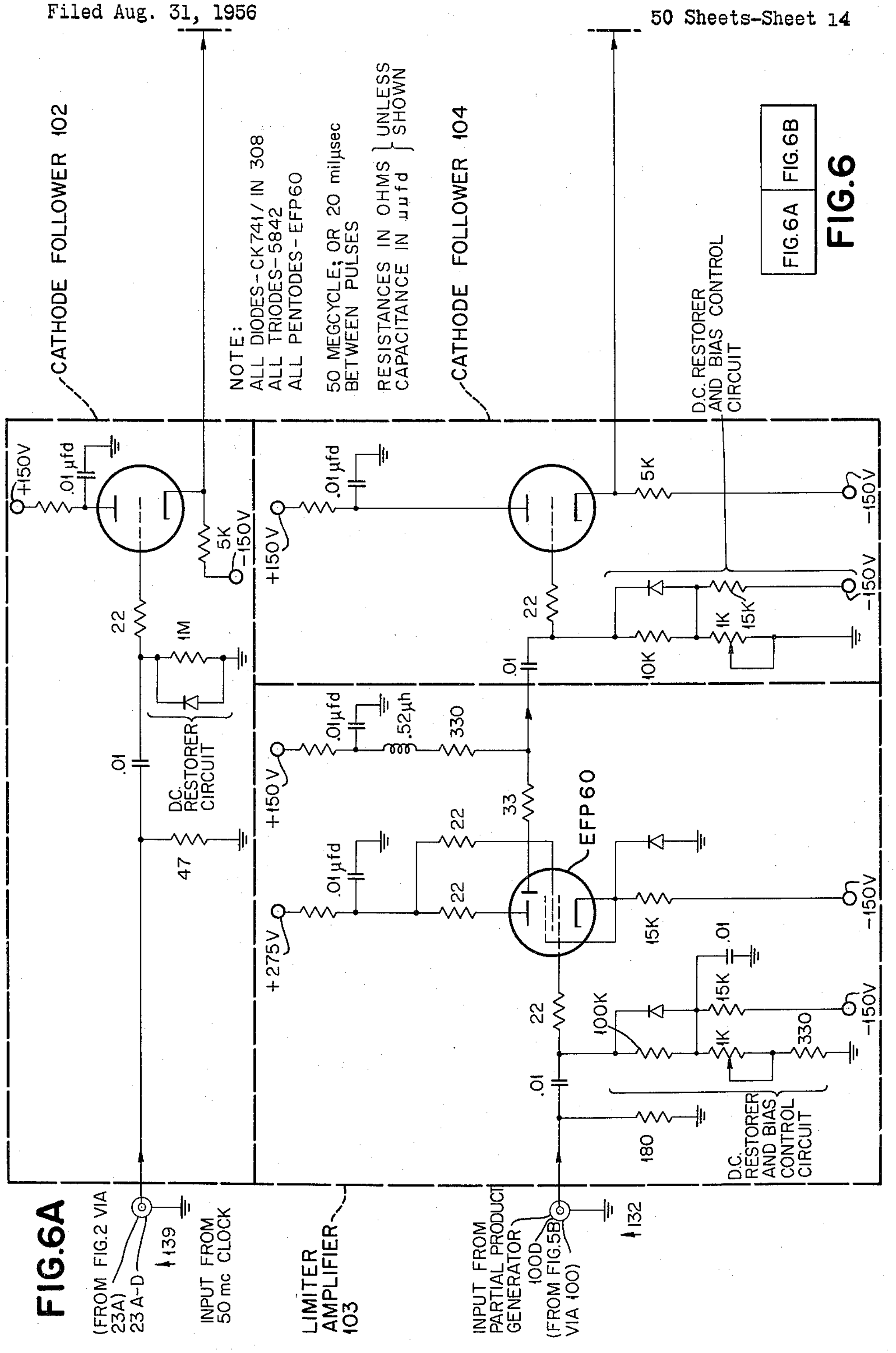
FIG. 6 shows the arrangement of FIGS. 6A and 6B to form the circuit diagram for the addend reshaper and retimer illustrated in FIG. 1B.
Figure 6B:
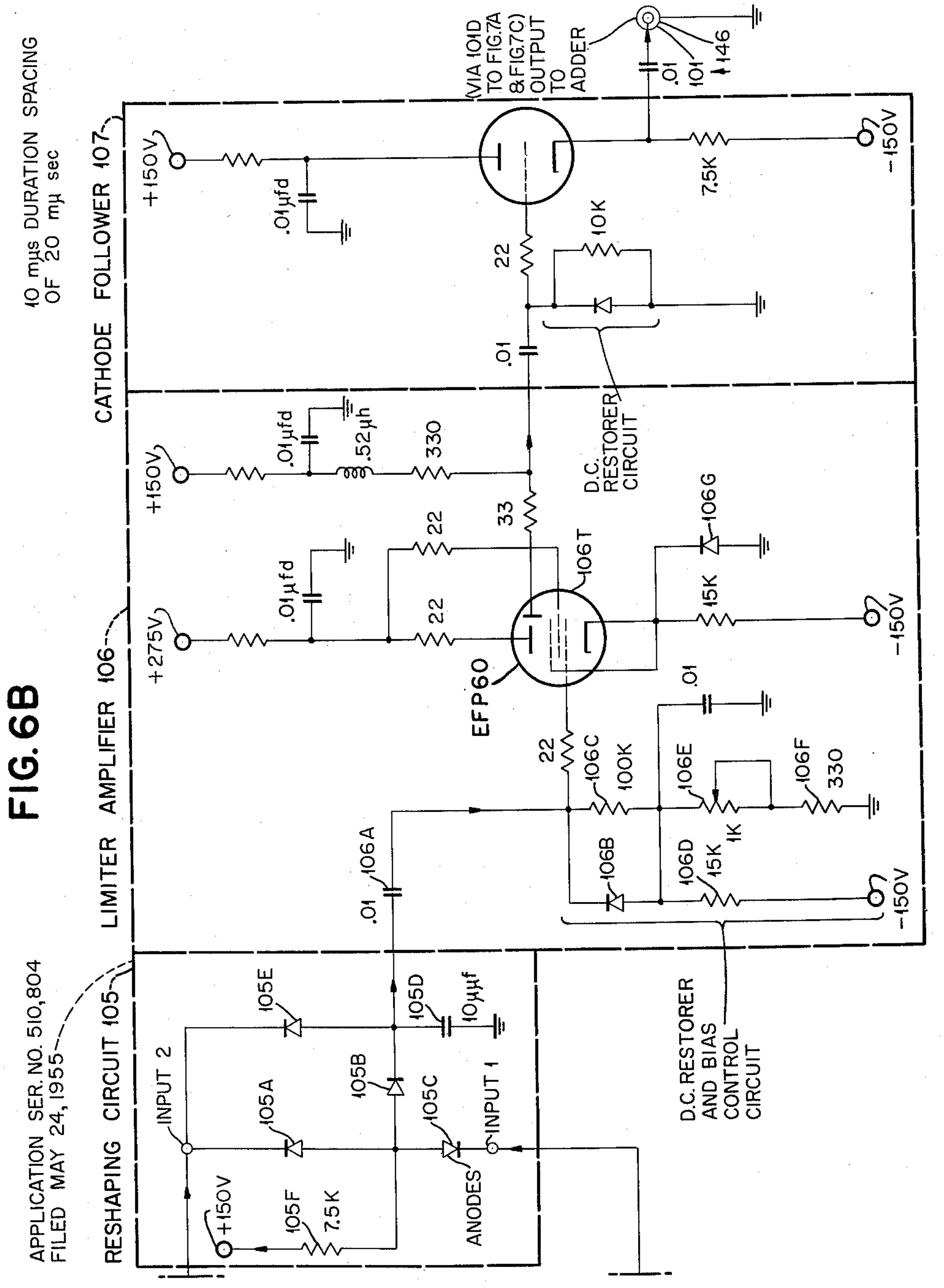
FIG. 6C is a chart showing idealized waveforms illustrating the operation of the addend reshaper and retimer of FIGS. 6A and 6B.
Figure 6C:
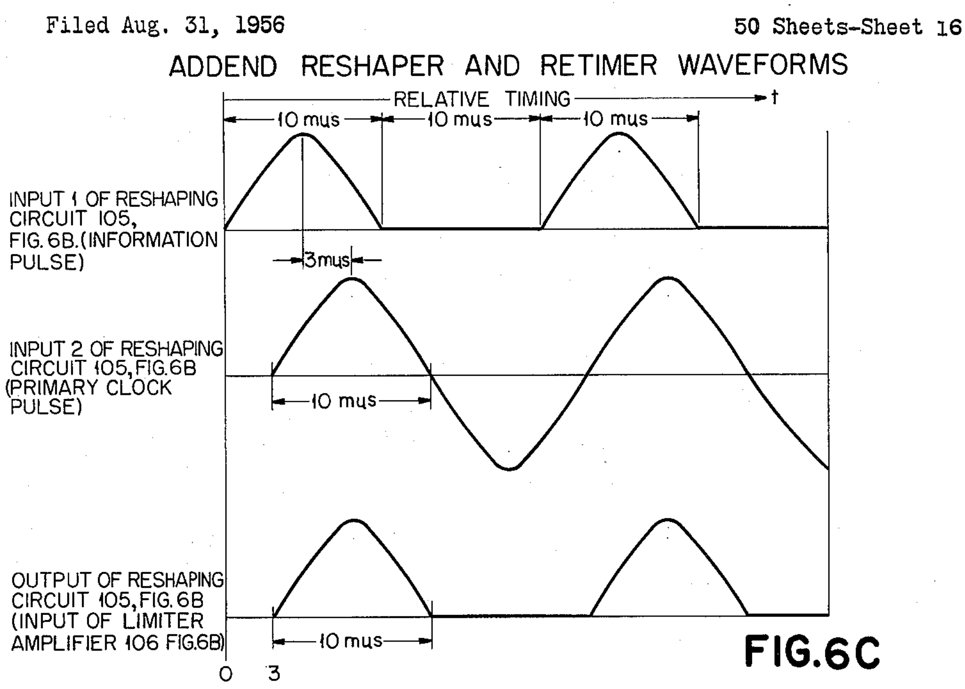

FIGS. 6A and 6B arranged as shown in FIG. 6 form the circuit diagram of the addend reshaper and retimer of FIG. 1. FIG. 6C shows idealized waveforms illustrating the operation of the circuit of FIG. 6 which is described by conjoint reference to FIGS. 6A, 6B and 6C.

A 50 megacycle primary clock sine wave voltage is applied to terminal 23A–D (FIG. 6A) and is effective to reshape and retime the 10 millimicrosecond positive pulses which are applied to input terminal 100D (FIG. 6A) to provide corresponding reshaped and retimed positive pulses of 10 millimicrosecond duration at output terminal 101 (FIG. 6B). Each 10 millimicrosecond positive pulse applied to terminal 100D (FIG. 6A) causes a corresponding 10 millimicrosecond reshaped and retimed pulse to appear 14 millimicroseconds later at output terminal 101 (FIG. 6B). It will be appreciated that in the solution of an actual multiplication or addition problem the 10 millimicrosecond positive pulses of this pulse train will occur at intervals of 20 millimicroseconds or integers thereof dependent upon the value of the partial product represented by that pulse train.

Optimum timing and reshaping of the input pulses applied at terminal 100D (FIG. 6A) is accomplished by the utilization of optimum time delay in transferring pulses between output terminal 23A of the primary clock source and input terminal 23A–D (FIG. 6) of the addend reshaper and retimer. In the illustrative embodiment of FIG. 1, this optimum time delay may be effected by a length of coaxial delay line which affords a delay, as shown, of 19 millimicroseconds in effecting the pulse transfer. It is now deemed to be apparent that the novel variable phase operation of the invention permits use of wide variations in the delay of clock pulses and still maintains optimum operating speed. This is to say that no particular primary clock pulse is necessary to render the circuit of FIG. 6 operative. The most readily available primary clock pulse may be utilized by appropriately increasing or decreasing the time delay, for example, increasing or decreasing the 19 millimicrosecond delay in the pulse transfer between terminals 23A and 23A–D (FIG. 1). By increasing or decreasing this time delay in the pulse transfer by 20 millimicroseconds or integer multiples thereof relative to the input applied to terminal 100, optimum operating speed is maintained.

The positive input pulses at terminal 100D are transferred to a limiter amplifier 103 (FIG. 6A) which includes a D.C. restorer and bias control circuit coupled to the grid of the secondary emission pentode. The positive output pulses from the limiter amplifier 103 are transferred to cathode follower 104 (FIG. 6A) which includes a D.C. restoration and bias control circuit coupled to the control grid of the triode tube. The output of cathode follower 104 is applied to input 1 of reshaping circuit 105 (FIG. 6B). Input 2 of reshaping circuit 105 is coupled via cathode follower 102 (FIG. 6A) which includes a D.C. restoration circuit to terminal 23A–D (FIG. 6A). For each 10 millimicrosecond positive pulse applied to input terminal 100D (FIG. 6A), a positive primary clock pulse is applied, approximately 7 millimicroseconds later, to input terminal 23A–D. In response to each positive 10 millimicrosecond pulse applied to input terminal 100D, a corresponding positive pulse of substantially 10 millimicrosecond duration is applied to input 1 of reshaping circuit 105 (FIG. 6B). Also, a positive pulse from cathode follower 102 (FIG. 6A) is applied to input 2 of reshaping circuit 105 (FIG. 6B) approximately 3 millimicroseconds after a positive pulse is applied to input 1 of reshaping circuit 105 (FIG. 6B).

The timed relationship between these two positive 10 millimicrosecond pulses applied to the inputs 1 and 2 of the reshaping circuit 105 (FIG. 6B) is such that a positive pulse of substantially 10 millimicrosecond time duration will be applied to the control grid of the secondary emission pentode of limiter amplifier 106 (FIG. 6B). The time relationship of these three pulses is illustrated in FIG. 6C. The positive pulse applied to the input of limiter amplifier 106 (FIG. 6B) results in a 10 millimicrosecond positive output pulse at the dynode of the secondary emission tube of limiter amplifier 106. This output pulse occurs approximately 4 millimicroseconds after an input pulse is applied to the grid of the secondary emission tube 106T and is applied to the input of cathode follower 107 which causes a 10 millimicrosecond positive pulse to appear at output terminal 101 (FIG. 6B).

Referring specifically to reshaping circuit 105 (FIG. 6B) and the idealized voltage waveforms of FIG. 6C, it will be pointed out how the reshaping circuit accomplishes the retiming of information pulses. Input 1 waveform (FIG. 6C) (information pulses) represents a first positive pulse of 10 millimicrosecond time duration followed 20 millimicroseconds later by a second positive pulse also of 10 millimicrosecond time duration. Input 2 waveform (FIG. 6C) (primary clock pulses) represents a first 10 millimicrosecond positive pulse occurring approximately 3 millimicroseconds after the first information pulse at input 1 and a second 10 millimicrosecond positive pulse occurring at approximately 3 millimicroseconds after the second information pulse at input 1. It will be seen from the output waveform (FIG. 6C) that the positive output pulses of approximately 10 millimicrosecond duration occur coincident with the primary clock pulses as a result of the earlier occurrence, within a few millimicroseconds, of an information pulse. In actual practice, the retiming feature of the reshaping circuit 105 is found to be effective in reshaping and retiming an information pulse when a clock pulse occurs within a period of approximately 6 millimicroseconds after the information pulse.

Resistor 105F, diodes 105A and 105C of reshaping circuit 105 and the 150 volt source of positive potential applied to one terminal of the resistor 105F comprise an AND circuit. Obviously, therefore, the first positive information pulse initiated at 0 time (FIG. 6C) is not effective to energize this AND circuit since input 2 (FIG. 6B) thereof is DOWN. However, at approximately 3 millimicroseconds (timing of FIG. 6C), input 1 (FIG. 6B) is still UP or positive and input 2 is going UP or positive. Thus, the voltage at the juncture of the anodes of diodes 105A, 105B and 105C rises with the rising voltage of the primary clock pulse. The rise in voltage at this juncture causes capacitor 105D to be charged through diode 105B. Subsequently, when the first information pulse terminates at 10 time (timing of FIG. 6C), capacitor 105D remains substantially fully charged for it cannot discharge through diode 105B which is now biased in reverse. However, at approximately 13 time (timing of FIG. 6C), the first primary clock pulse terminates permitting the charge on capacitor 105D to very rapidly decrease by discharging through the now forwardly biased diode 105E. Thus, the output pulse of reshaping circuit 105 (FIG. 6B) substantially corresponds in time duration and time of occurrence to the primary clock pulse.

Reshaping circuit 105 (FIG. 6B) is very similar to the pulse reshaper circuit disclosed and claimed in the U.S. patent application of Arthur G. Anderson, Serial No. 510,804, filed May 24, 1955, entitled "Pulse Reshaper," and of common assignee herewith.

The limiter amplifier 106 (FIG. 6B) is typical of the novel limiter amplifiers employed herein. Limiter amplifier 106 employes a D.C. restorer circuit including diode 106B and resistor 106C for clamping the no signal voltage impressed on the control grid of secondary emission pentode tube 106T, to the D.C. voltage established by the biasing circuit including resistor 106D, potentiometer 106E and resistor 106F. The positive pulses which are D.C. restored by this restorer circuit are applied to the control grid of the secondary emission pentode tube 106T of limiter amplifier 106. Under no signal conditions, the cathode of the tube 106T is clamped at ground voltage by the diode 106G. The control grid of tube 106T is normally biased below cutoff by the setting of potentiometer 106E. Signals which exceed a threshold level are amplified in magnitude until the cathode current of tube 106T reaches the value of the current normally flowing through the 15K resistor to the source of −150 volts. If the cathode current increases above this value, the current through diode 106G reverses direction. Hence, diode 106G becomes a relatively high impedance, thereby introducing a large amount of cathode degeneration into the amplifier to prevent further amplification. Thus, the amplitude of positive input pulse applied to a limiter amplifier, such as limiter amplifiers 106 and 103, may vary considerably and the amplifier will provide output pulses having substantially constant amplitude.

The amplitude limited positive pulses from the dynode of limiter amplifier 106 (FIG. 6B) are A.C. coupled and D.C. restored and applied to the grid of the triode of cathode follower 107 which is used to provide a low output impedance.

*Binary adder*

Figure 7A:
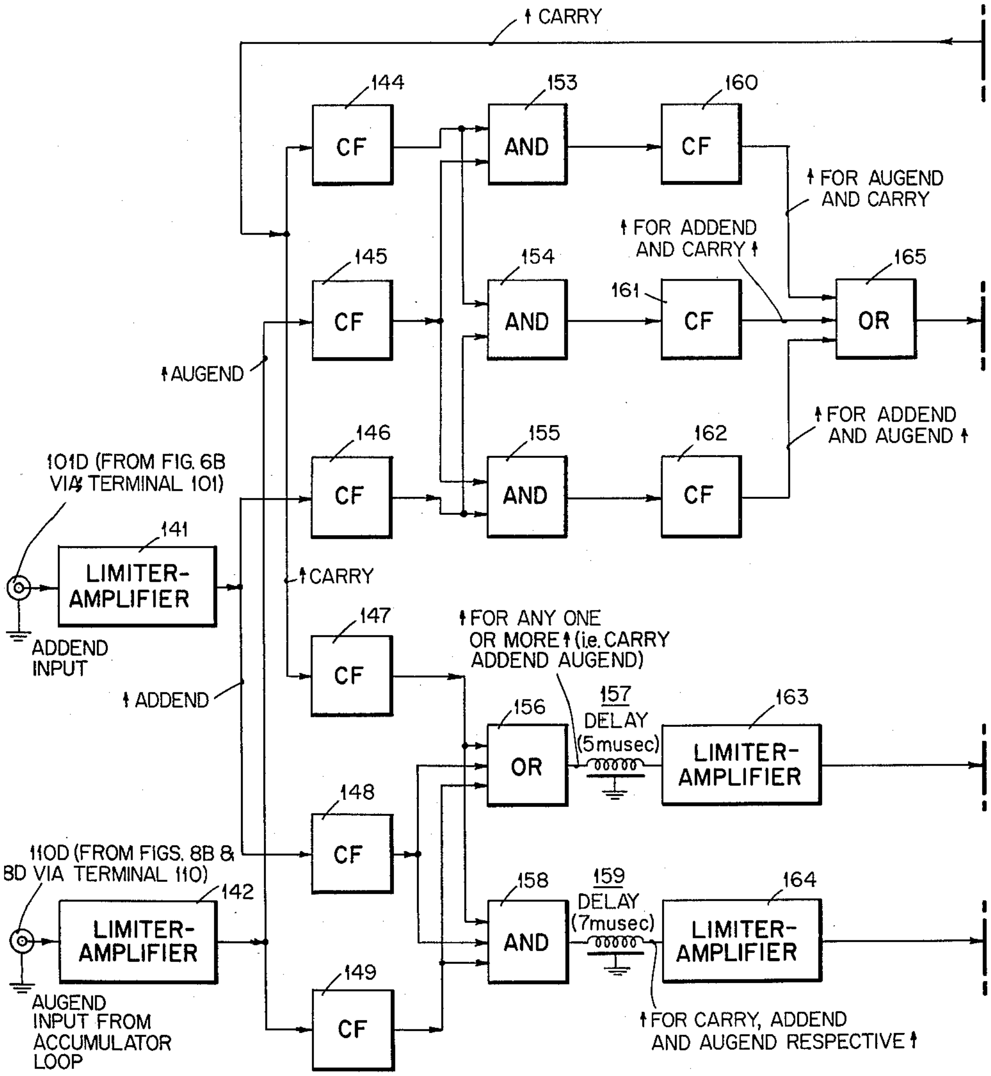
FIG. 7 shows the arrangement of FIGS. 7A and 7B to form a logical block diagram of the novel binary adder of the invention illustrated in FIG. 1B.
FIG. 7G shows the arrangement of FIGS. 7C–7F to form a circuit diagram for the novel binary adder illustrated by the logical block diagram of FIGS. 7A and 7B.
FIG. 7K shows the arrangement of FIGS. 7H and 7J to disclose idealized waveforms illustrating the operation of the binary adder of FIGS. 7A and 7B and the dynamic storage loop which includes that adder and the loop reshaper and retimer illustrated in FIG. 1B.
Figure 7:
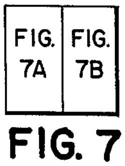
Figure 7B:
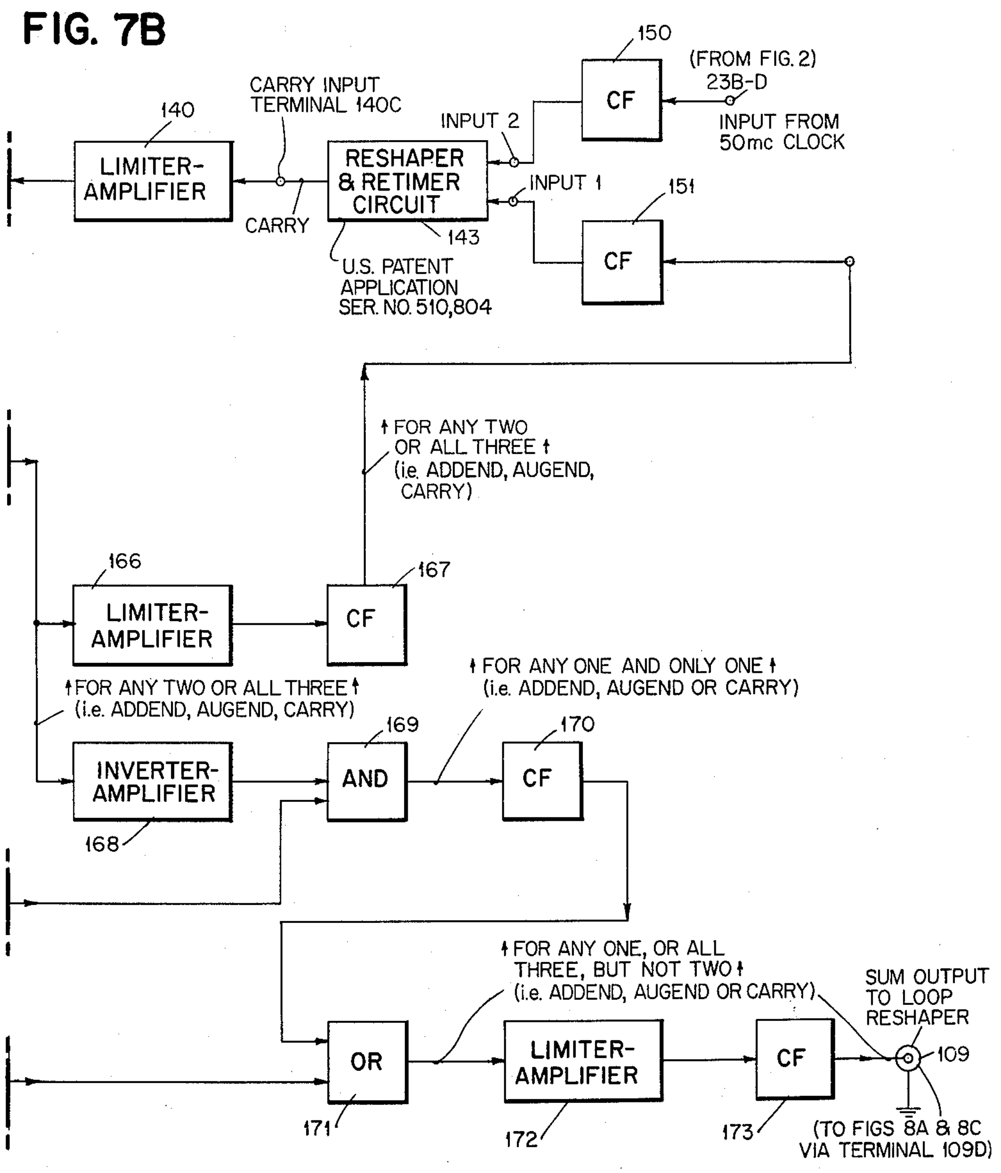
Figures 7C, 7G:
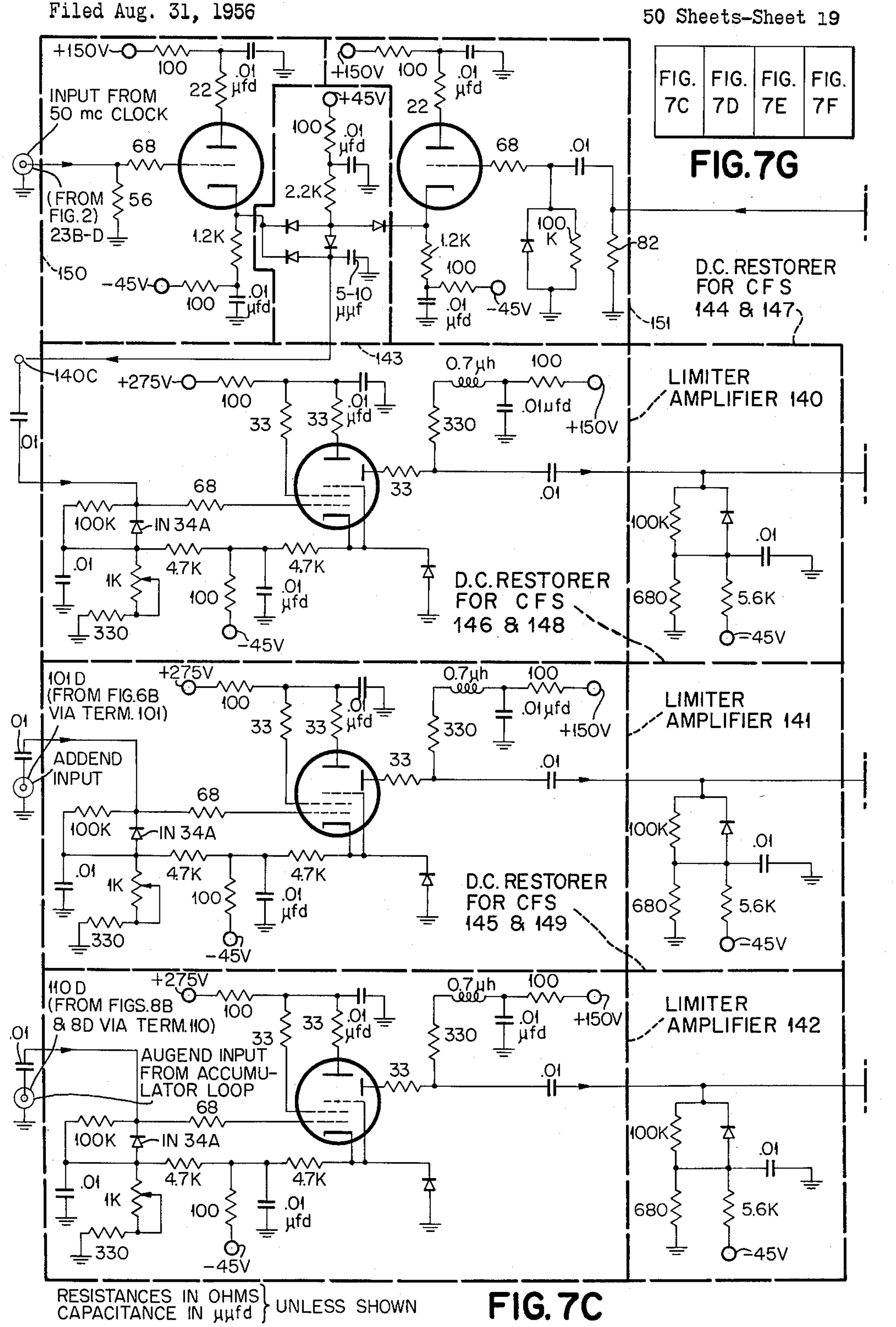
Figure 7D:
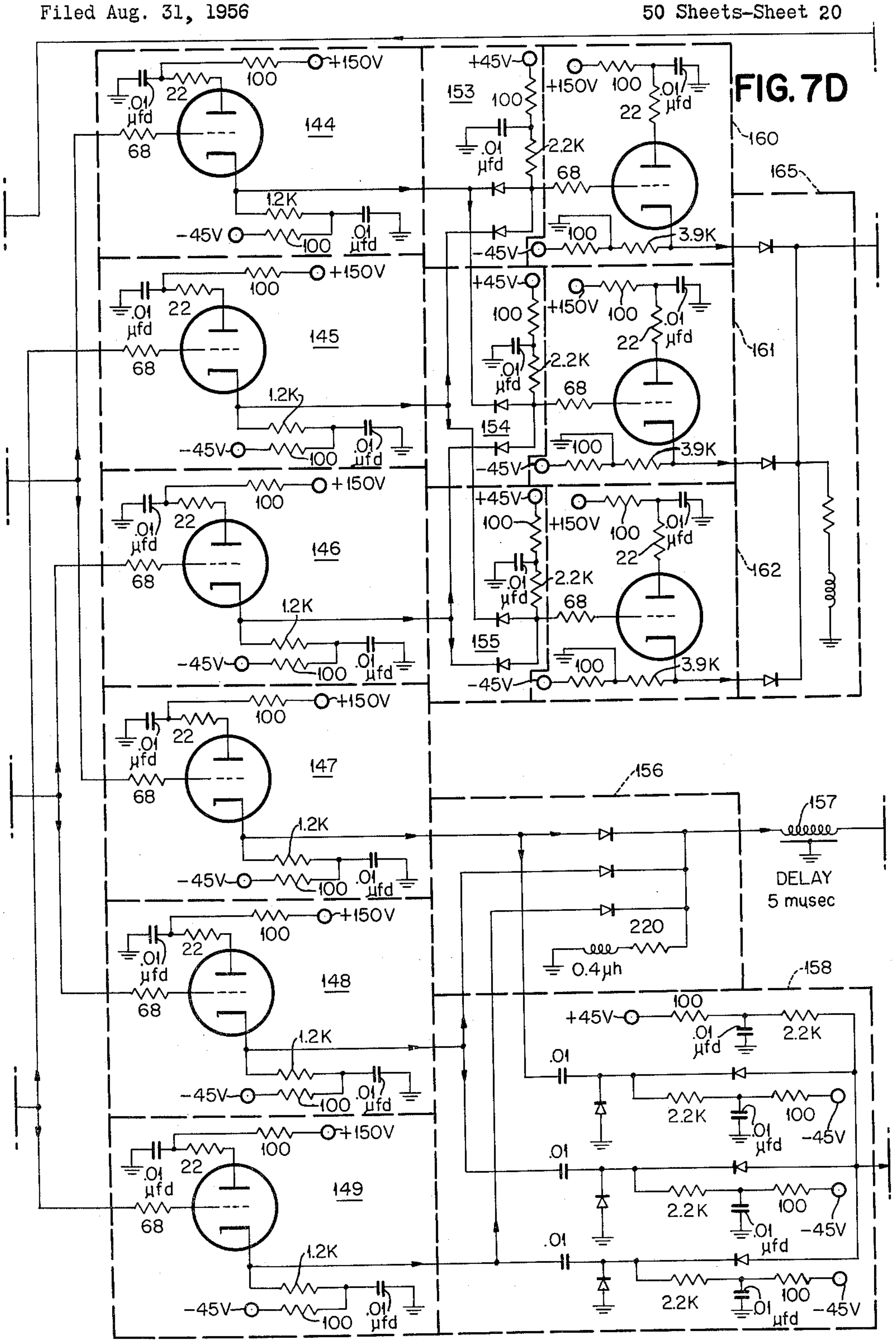
Figure 7E:
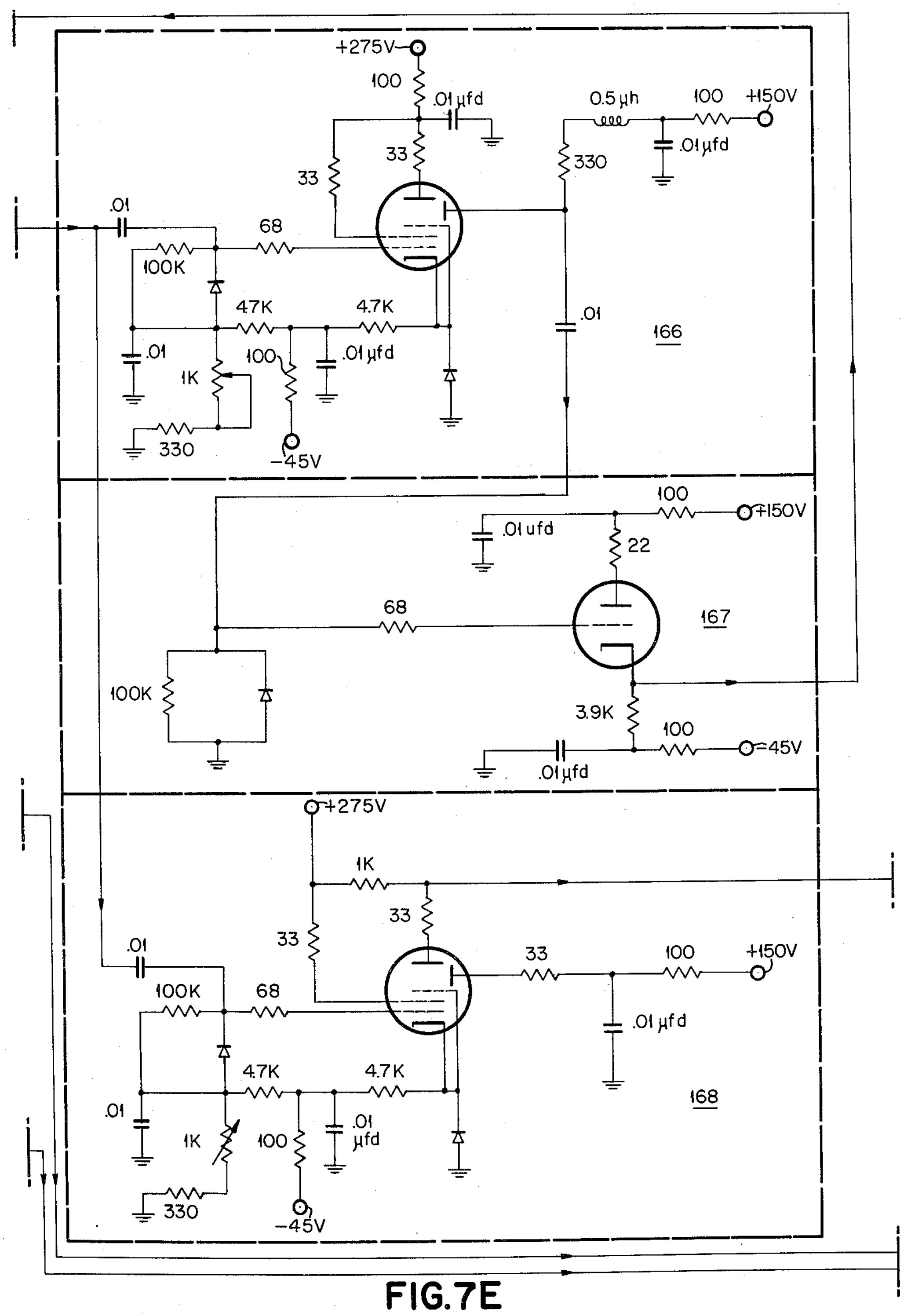
Figure 7F:
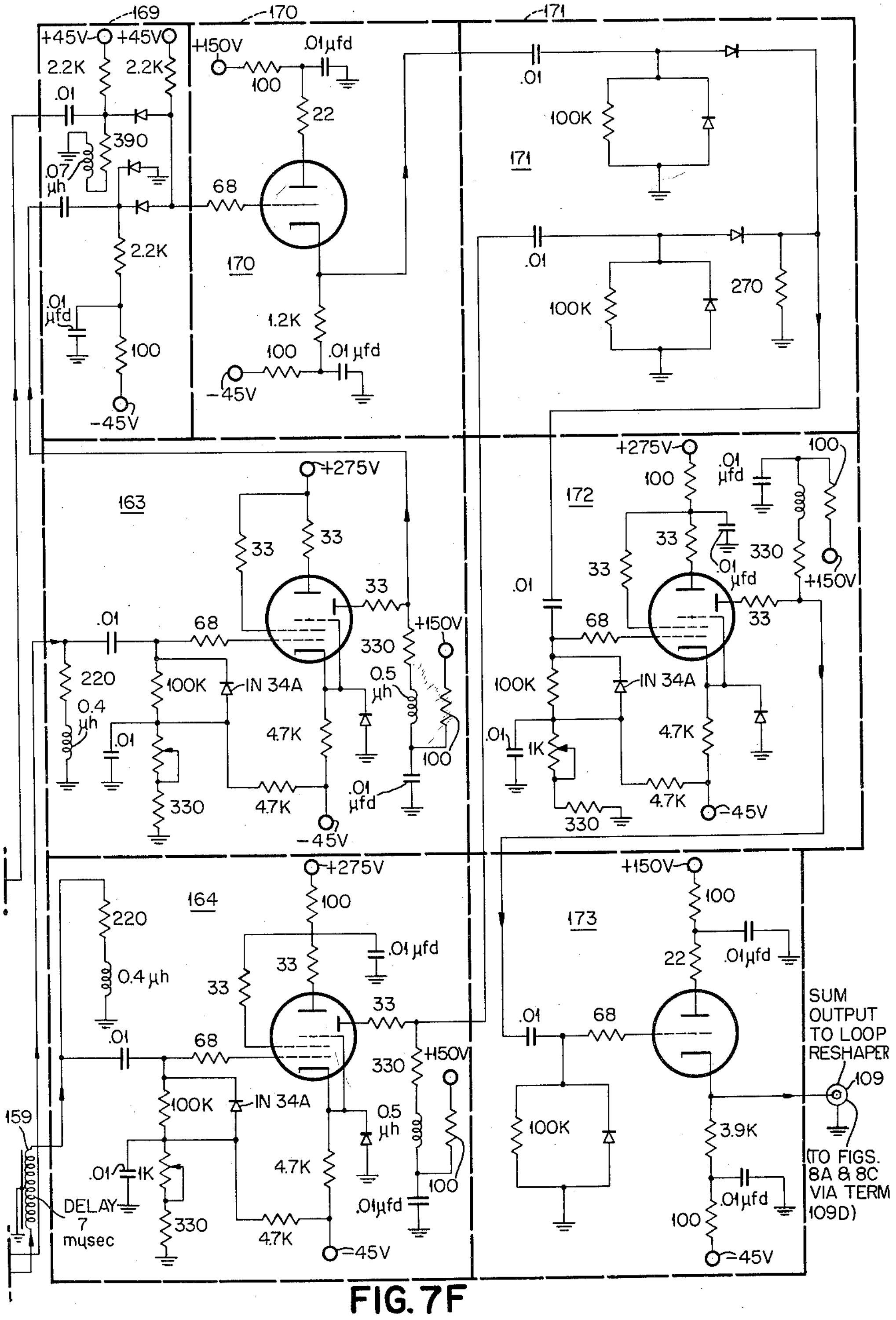

FIGS. 7A and 7B, arranged as shown in FIG. 7, form a logical block diagram of the binary adder represented by the block labeled Binary Adder in the multiplication system of FIG. 1. FIGS. 7C, 7D, 7E and 7F, arranged as shown in FIG. 7G, disclose a circuit diagram of the binary adder shown in FIG. 7. The circuitry enclosed within each of the labeled and, or numbered broken lines of FIGS. 7C, 7D, 7E and 7F corresponds to the similarly numbered blocks of FIGS. 7A and 7B.

The binary adder of FIGS. 7 and 7G operates logically in a manner similar to that of binary adders known to the prior art. That is, the same general arithmetic laws are common to binary adders. However, the prior art binary adders do not operate at speeds commensurate with that of the binary adder of the invention, or utilize pulses having a time duration of the order of 10 millimicroseconds. The higher speed of operation is accomplished in part, by employing the novel very high frequency techniques disclosed herein, the novel limiter amplifier disclosed earlier herein, and a novel reshaper and retimer circuit employed in the carry loop of the binary adder.

The binary adder of FIGS. 7 and 7G operates at a 50 megacycle pulse repetition rate and includes a novel carry loop for effecting carry in 20 millimicroseconds. Effecting carry in 20 millimicroseconds permits the operation of this binary adder in a system employing positive pulses of approximately 10 millimicrosecond time duration and having a pulse spacing of 20 millimicrosecond time duration.

Now referring to FIGS. 7A and 7B, assume that positive pulses of 10 millimicrosecond time duration are simultaneously applied to addend input terminal 101D (FIG. 7A) and augend input terminal 110D (FIG. 7A) for respectively energizing limiter amplifiers 141 and 142. The positive output pulses from limiter amplifiers 141 and 142 are respectively conveyed via cathode followers 146 and 145 to the two inputs of AND circuit 155 (FIG. 7A). Thus AND circuit 155 is energized and provides a positive output pulse which is transferred via cathode follower 162, OR circuit 165, limiter amplifier 166, cathode follower 167, cathode follower 151, reshaper and retimer circuit 143 to the carry input terminal 140C (FIG. 7B). The positive pulse appearing at carry input terminal 140C (FIG. 7C) occurs 20 millimicroseconds after the application of the augend and addend input pulses. This 20 millimicrosecond time delay results primarily from the time delays inherent in limiter amplifiers 141, 142 and 140, and reshaper and retimer circuit 143. It will be appreciated that reshaper and retimer circuit 143 (FIG. 7B), incorporated in the carry loop of the binary adder of FIG. 7, accomplishes reshaping and retiming in substantially the same manner as reshaping and retiming was accomplished in the addend reshaper and retimer discussed earlier herein. The reshaper and retimer circuit per se is fully disclosed and claimed in the United States patent application of Arthur G. Anderson, Serial No. 510,804, filed on May 24, 1955, entitled "Pulse Reshaper," granted as U.S. Patent No. 2,943,264 on June 28, 1960, and of common assignee herewith.

Let it now be assumed that concurrent with the positive carry pulse appearing at carry input terminal 140C (FIG. 7B) a positive addend pulse and a positive augend pulse respectively appear at terminals 101D and 110D (FIG. 7A). This condition, namely, simultaneous occurrence of carry, addend, and augend pulses, will result in all three inputs of AND circuit 158 (FIG. 7A) being in the UP condition because of the operation of the following circuitry: carry input terminal 140C, limiter amplifier 140, and cathode follower 147 to the upper input of AND circuit 158; addend input terminal 101D, limiter amplifier 141, and cathode follower 148 to the center input terminal of AND circuit 158; and augend input terminal 110D, limiter amplifier 142, and cathode follower 149 to the lower input terminal of AND circuit 158. Thus AND circuit 158 (FIG. 7A) is energized and provides a positive output pulse which is applied via delay circuit 159 (FIG. 7A), limiter amplifier 164 (FIG. 7A), OR circuit 171 (FIG. 7B), limiter amplifier 172 (FIG. 7B) and cathode follower 173 (FIG. 7B) to sum output terminal 109 (FIG. 7B). This positive sum output pulse is of approximately 10 millimicroseconds in time duration and occurs 29 millimicroseconds after the simultaneous occurrence of the carry, addend and augend pulses. This simultaneous occurrence of carry, addend and augend pulses after a 20 millimicrosecond delay, instituted by the carry loop, also provides a positive carry pulse, of approximately 10 millimicroseconds in time duration, at carry input terminal 140C (FIG. 7B).

It will now be appreciated from an inspection of FIG. 7, that the simultaneous occurrence of any two of the three inputs, namely, carry, addend and augend, will result in an output from OR circuit 165 and a positive carry pulse at terminal 140C.

Now assuming that only one of the three inputs, namely, carry, addend or augend, is UP, i.e., a positive pulse of approximately 10 millimicroseconds in time duration applied thereto, then OR circuit 156 will be energized through one of the following paths: carry input terminal 140C (FIG. 7B), limiter amplifier 140 (FIG. 7B) and cathode follower 147 (FIG. 7A) to the upper input of OR circuit 156 (FIG. 7A); addend input terminal 101 (FIG. 7A), limiter amplifier 141 (FIG. 7A) and cathode follower 148 (FIG. 7A) to the center input of OR circuit 156 (FIG. 7A); or augend input terminal 110D (FIG. 7A), limiter amplifier 142 (FIG. 7A) and cathode follower 149 (FIG. 7A) to the lower input of OR circuit 156 (FIG. 7A). Now it is to be observed that the output of OR circuit 165 (FIG. 7A) and thus the input of inverter amplifier 168 (FIG. 7B) is UP only when any two of the afore-recited inputs (i.e., addend, augend and carry) are simultaneously UP. Thus when only one of these inputs is UP, the input of inverter amplifier 168 is DOWN and the output thereof is UP. Hence the upper input of AND circuit 169 (FIG. 7B) is UP since it is connected to the output of inverter amplifier 168. The positive pulse at the output of OR circuit 156 is transferred via delay circuit 157 (FIG. 7A), limiter amplifier 163 (FIG. 7A), AND circuit 169 (FIG. 7B), cathode follower 170 (FIG. 7B), OR circuit 171 (FIG. 7B), limiter amplifier 172 (FIG. 7B) and cathode follower 173 (FIG. 7B) to provide a positive output pulse at sum output terminal 109 (FIG. 7B).

Hence, the occurrence of only a single input pulse, i.e., carry, addend or augend, results in a positive sum output pulse at sum output terminal 109 (FIG. 7B) approximately 29 millimicroseconds thereafter. The simultaneous occurrence of any two of the three inputs, namely, carry, addend or augend, results in a positive pulse at carry input terminal 140C (FIG. 7B), 20 millimicroseconds later, which time is concurrent with the arrival of the next higher order binary at the addend and augend input terminals (FIG. 7A). The simultaneous occurrence of all three of the inputs, i.e., carry, addend and augend, results in a positive pulse at carry input terminal 140C (FIG. 7B) 20 millimicroseconds thereafter and also provides a sum output pulse at sum output terminal 109 (FIG. 7B) 29 millimicroseconds thereafter.

*Loop reshaper and retimer*

Figure 8F:
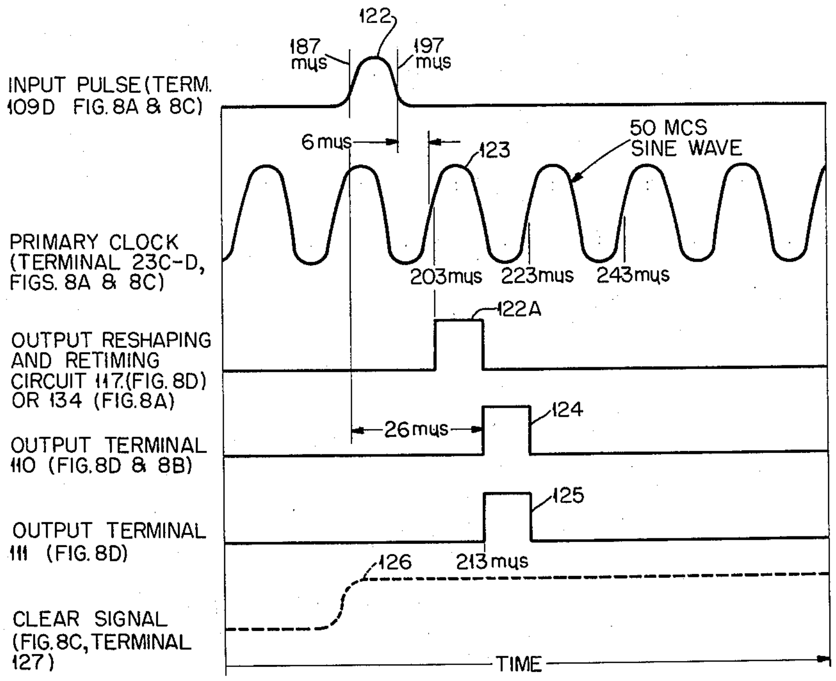
FIG. 8F shows idealized waveforms illustrating the operation of the embodiments of the loop reshaper and retimer of FIGS. 8 and 8E.
Figures 8, 8A:
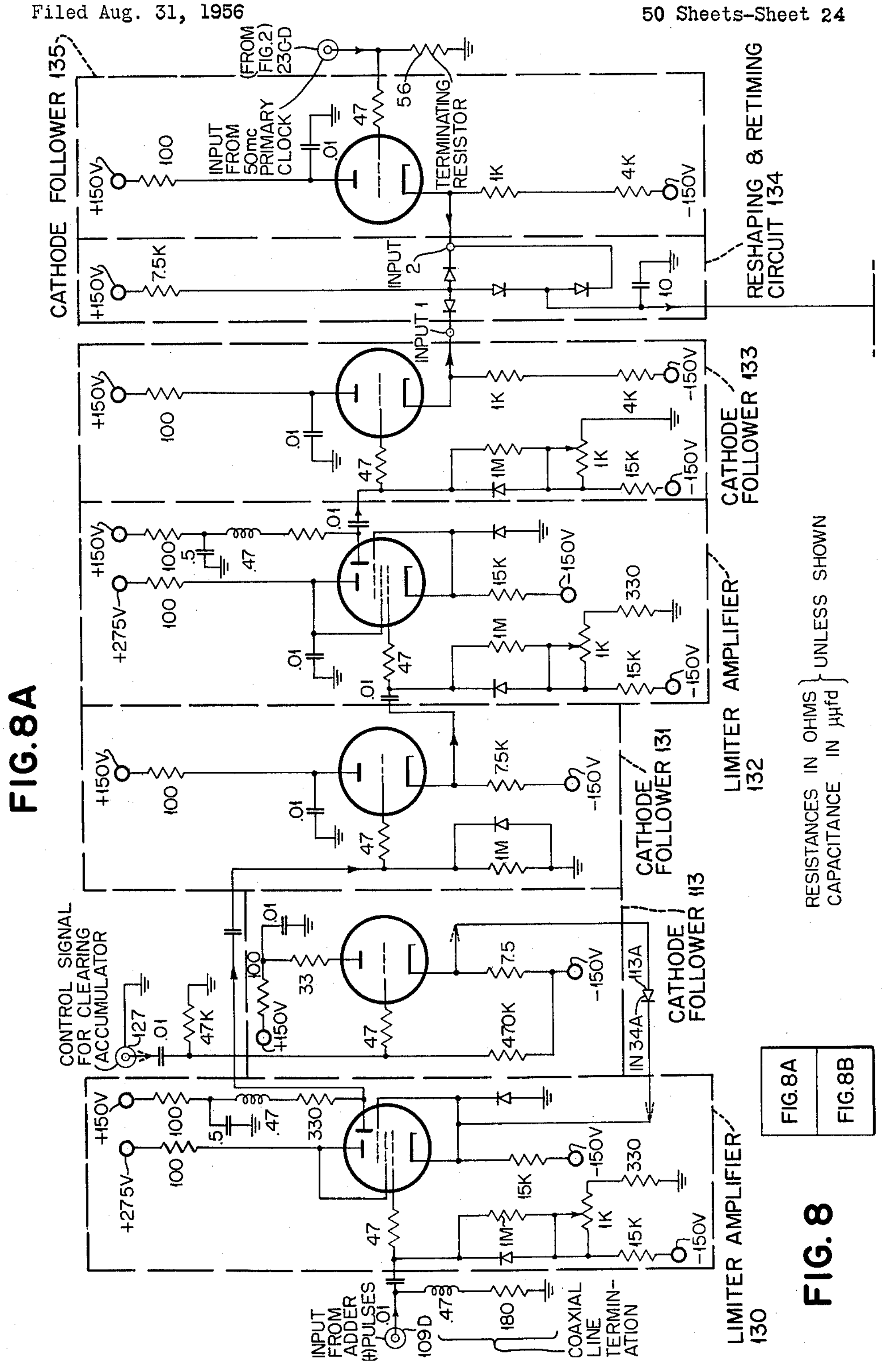
FIG. 8 shows the arrangement of FIGS. 8A and 8B to form the circuit diagram of a first embodiment of the loop reshaper and retimer illustrated in FIG. 1B.
Figure 8B:
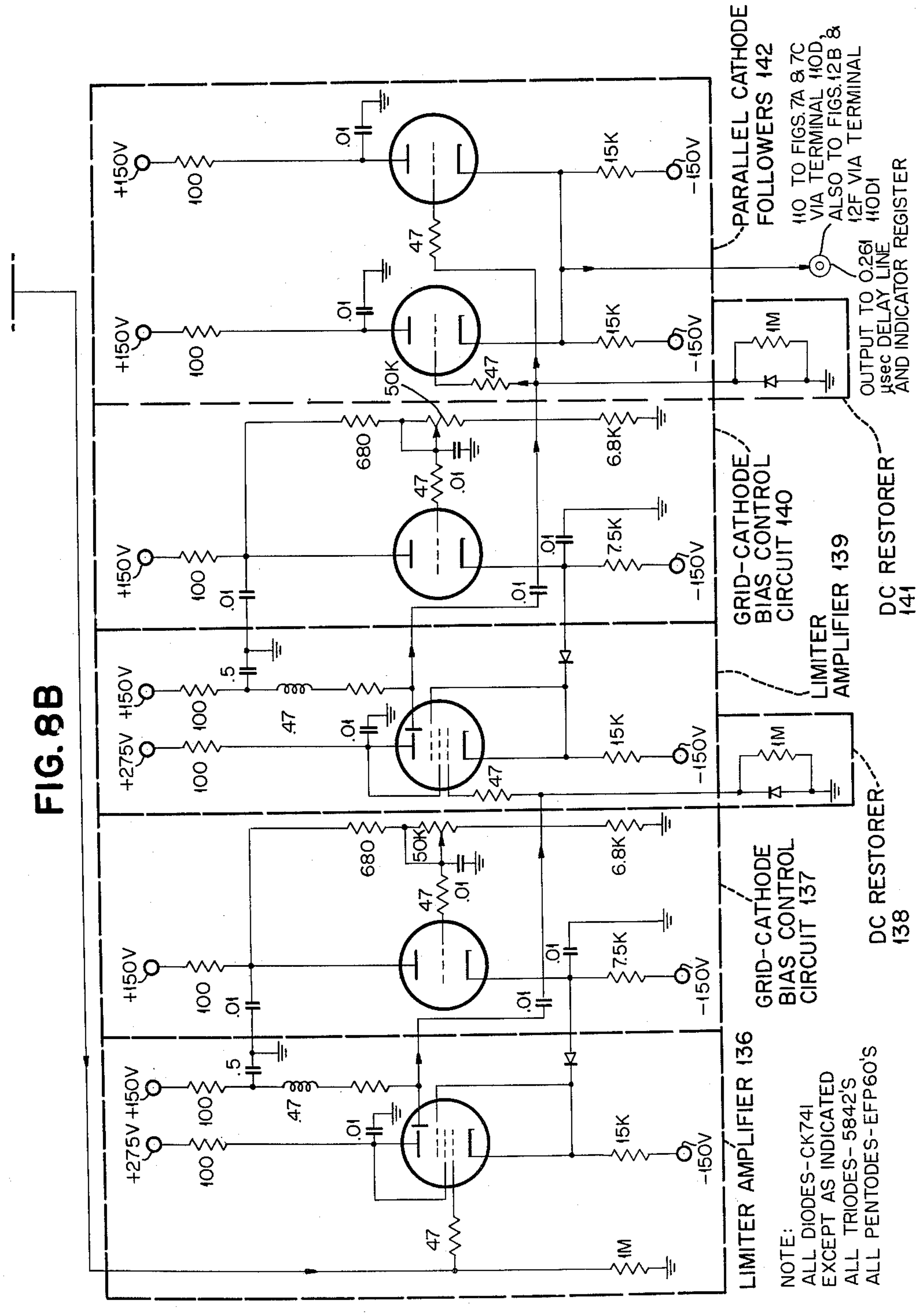
FIG. 8E shows the arrangement of FIGS. 8C and 8D to form the circuit diagram of a second embodiment of the loop reshaper and retimer illustrated in FIG. 1B.
Figures 8C, 8E:
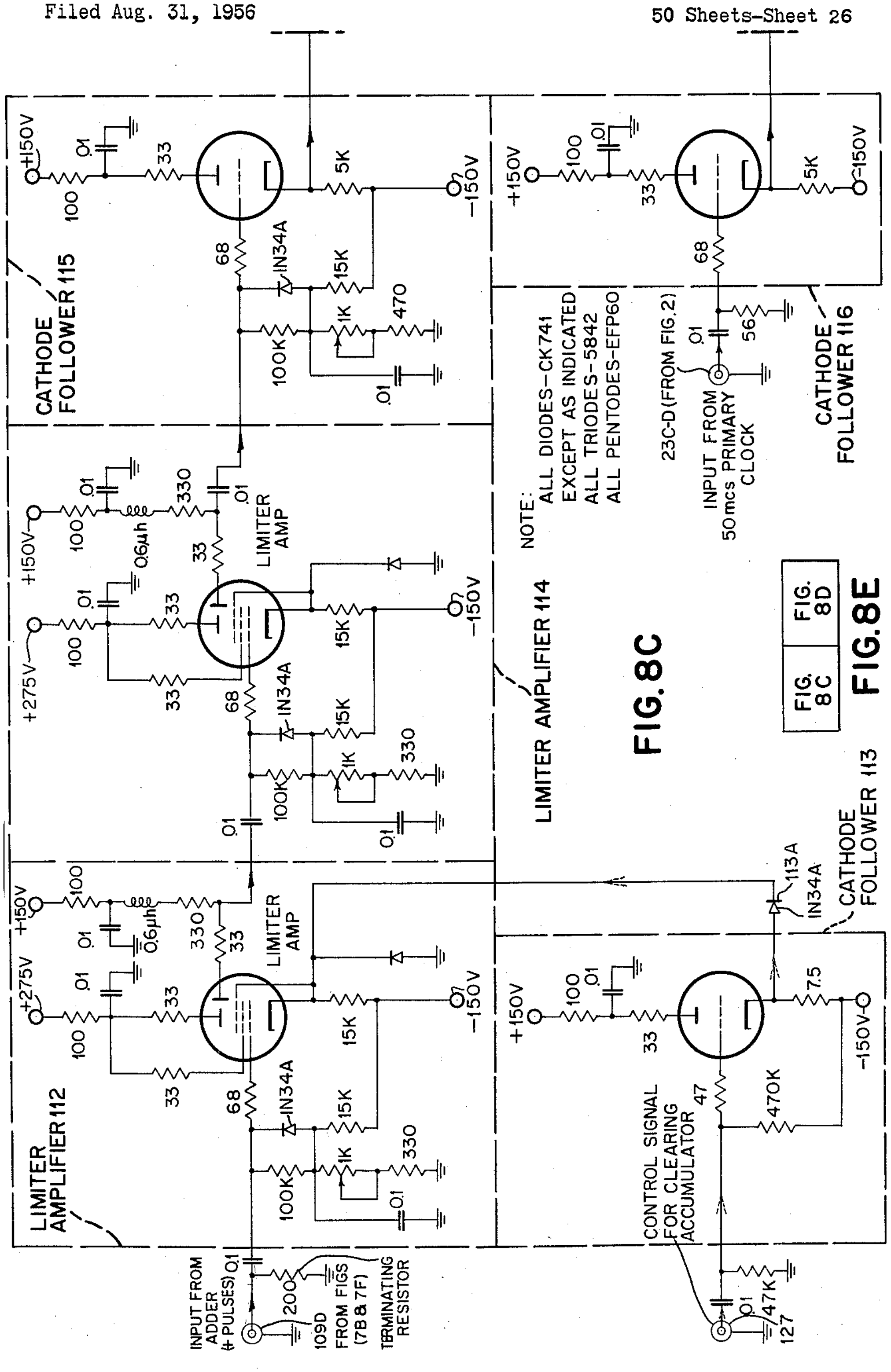
Figure 8D:
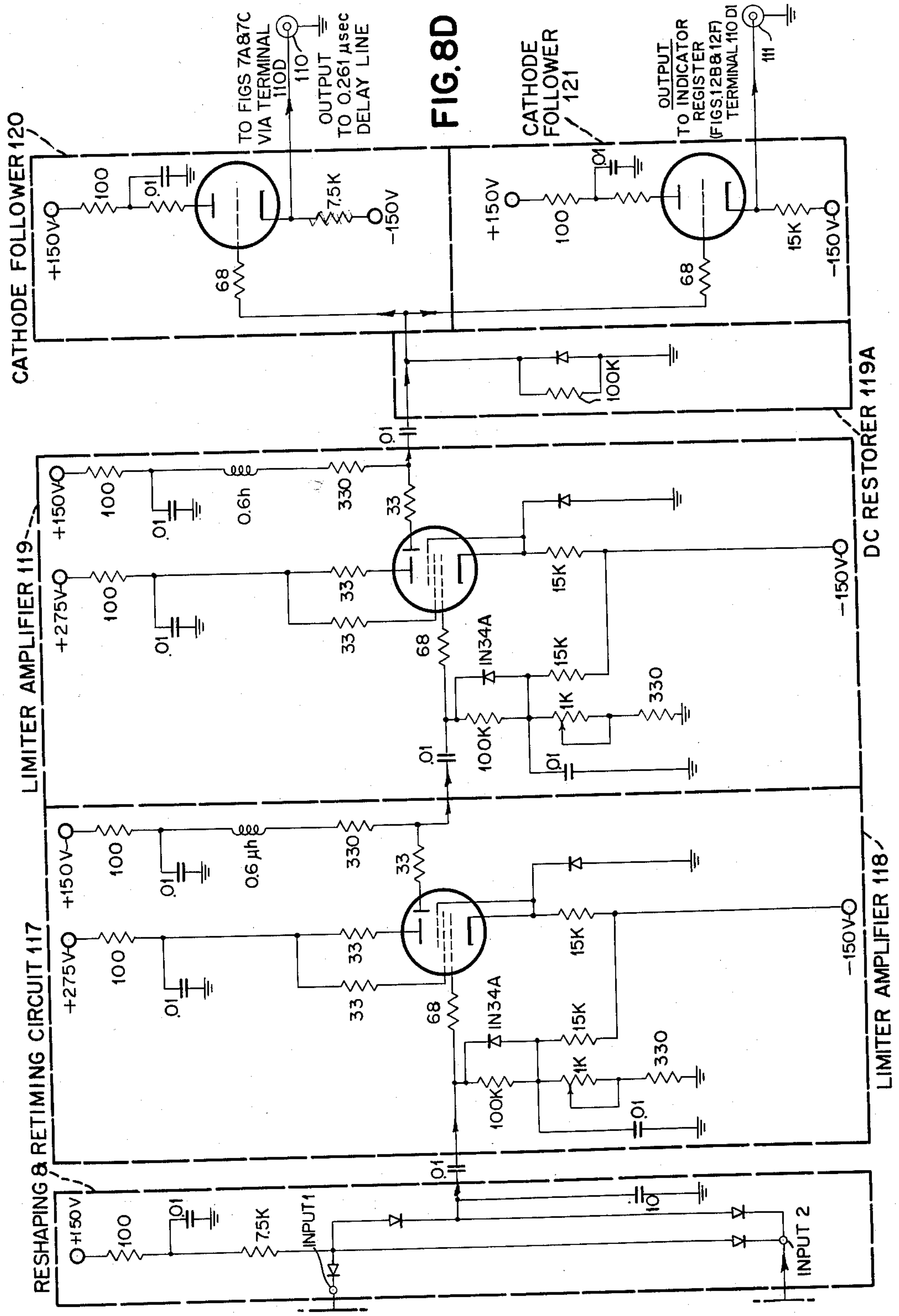

FIGS. 8C and 8D, arranged as shown in FIG. 8E, disclose the circuit of the loop reshaper and retimer of FIG. 1. Idealized waveforms illustrating the operation of the loop reshaper and retimer are shown in FIG. 8F. Briefly, the loop reshaper and retimer circuit receives a positive input pulse of approximately 10 millimicroseconds in time duration at terminal 109D (FIG. 8C) and provides a pair of reshaped and retimed positive output pulses at output terminals 110 (FIG. 8D) and 111 (FIG. 8D) approximately 26 millimicroseconds thereafter.

When an input pulse 122 (FIG. 8F) is applied at input terminal 109D (FIG. 8C), it is conveyed via limiter amplifier 112 (FIG. 8C), limited amplifier 114 (FIG. 8C) and cathode follower 115 (FIG. 8C) to input 1 of reshaping and retiming circuit 117 (FIG. 8D). The primary clock pulses (FIG. 8F) applied at terminal 23C–D (FIG. 8C) are conveyed via cathode follower 116 (FIG. 8C) to input 2 of reshaping and retiming circuit 117 (FIG. 8D). Limiter amplifiers 112 and 114 cumulatively subject pulse 122 (FIG. 8F) to a millimicrosecond delay of such order that primary clock pulse 123 (FIG. 8F) is effective, through the action of reshaping and retiming circuit 117 (FIG. 8D), to produce a reshaped and retimed positive output pulse 122A (FIG. 8F). Pulse 122A (FIG. 8F) is applied to the input of limiter amplifier 118 (FIG. 8D). The output of limiter amplifier 118, which is a positive pulse of approximately 10 millimicroseconds in time duration, is applied via limiter amplifier 119 (FIG. 8D) and a D.C. restorer circut 119A (FIG 8D) to the parallel connected inputs of cathode follower 120 and 121. The idealized pulse outputs from cathode followers 120 and 121 at terminals 110 and 111, respectively, are positive pulses of approximately 10 millimicroseconds time duration and occur as shown in FIG. 8F.

Limiter amplifiers 112, 114, 118 and 119, respectively, are generally of the type, and function in substantially the same manner, as the limiter amplifier discussed earlier herein. Briefly, each limiter amplifier is adapted to receive a positive input pulse having a time duration in the order of 10 millimicroseconds and provides an amplitude limited positive output pulse, of like time duration, approximately 5 millimicroseconds thereafter.

Reshaping and retiming circuit 117 (FIG. 8D) is substantially identical to the reshaping circuit of FIG. 6B discussed earlier herein. The reshaping and retiming circuit per se is fully disclosed and claimed in the U.S. patent application of Arthur G. Anderson, Serial No. 510,804, filed on May 24, 1955, entitled "Pulse Reshaper," granted as U.S. Patent No. 2,943,264, on June 28, 1960, and of common assignee herewith.

Referring to FIGS. 8C and 8F, it is seen that if an UP signal is applied to terminal 127 (FIG. 8C), the output of cathode follower 113 (FIG. 8C) will go UP and through forwardly biased diode 113A (FIG. 8C) will render the cathode of the secondary emission pentode of limiter amplifier 112 (FIG. 8C) more positive, thereby precluding said pentode from transmitting an information pulse applied at terminal 109D (FIG. 8C) for the duration of said UP signal. Also, from the discussion hereinafter of the loop reshaper and retimer circuit in connection with its use as a component in the dynamic storage loop of FIG. 1, it will be more fully appreciated how a positive pulse of sufficient duration, applied to terminal 127 (FIG. 8C), is effective to clear or reset said loop of information stored therein during a preceding arithmetic operation.

An alternative embodiment of a loop reshaper and retimer circuit is illustrated by the circuit diagram formed by FIGS. 8A and 8B arranged as shown in FIG. 8. Briefly, the loop reshaper and retimer circuit of FIGS. 8A and 8B is adapted to accept a positive pulse of approximately 10 millimicroseconds in time duration, and provide approximately 26 millimicroseconds thereafter, a reshaped and retimed positive pulse of approximately 10 millimicroseconds in time duration.

If a positive pulse 122 (FIG. 8F) is applied to terminal 109D (FIG. 8A) and primary clock pulses (FIG. 8F) are applied to terminal 23C–D (FIG. 8A), inputs 1 and 2 of reshaping and retiming circuit 134 (FIG. 8A) go UP. The positive pulse 122 applied to terminal 109D is transferred via limiter amplifier 130 (FIG. 8A), cathode follower 131 (FIG. 8A), limiter amplifier 132 (FIG. 8A) and cathode follower 133 (FIG. 8A) to input 1 of reshaping and retiming circuit 134 (FIG. 8A). The primary clock pulses applied to terminal 23C–D (FIG. 8A) are transferred via cathode follower 135 (FIG. 8A) to input 2 of reshaping and retiming circuit 134 (FIG. 8A). The positive output pulse 122A (FIG. 8) from reshaping and retiming circuit 134, resulting from input pulse 122 (FIG. 8F) in conjunction with the primary clock pulse 123 (FIG. 8F), is applied to the input of limiter amplifier 136 (FIG. 8B).

Associated with limiter amplifier 136 (FIG. 8B) is grid cathode bias control circuit 137 (FIG. 8B) which is effective in maintaining the cathode of the secondary emission pentode of limiter amplifier 136 (FIG. 8B) at a predetermined positive potential with respect to the control grid thereof, in the absence of a positive input pulse being applied at the input of limiter amplifier 136. Grid cathode bias control circuit 140 (FIG. 8B) is associated with limiter amplifier 139 (FIG. 8B) and performs a function with respect to limiter amplifier 139 similar to that performed by grid cathode bias control circuit 137 with respect to amplifier 136.

D.C. restorer circuit 138 (FIG. 8B) prevents the potential on the control grid of the secondary emission pentode of limiter amplifier 139 (FIG. 8B) from going negative. Also, D.C. restorer circuit 141 (FIG. 8B) prevents the potential at the control grids of the parallel connected cathode followers 142 from going negative.

The positive output pulse from reshaping and retiming circuit 134 is effective through limiter amplifier 136, limiter amplifier 139, and parallel cathode followers 142 in providing a 10 millimicrosecond positive output pulse 124 (FIG. 8F) at terminal 110 (FIG. 8B).

The limiter amplifiers and the reshaping and retiming circuit of FIGS. 8A–8D substantially correspond to and function in the same manner as the limiter amplifiers and the reshaping and retiming circuit described hereinbefore.

The effect of a positive pulse applied at terminal 127 of FIG. 8A is identical to the effect of a positive pulse applied to terminal 127 of FIG. 8C. That is, a positive pulse applied to terminal 127 of FIG. 8C is effective through cathode follower 113 and forwardly biased diode 113A in increasing the voltage at the cathode of the secondary emission pentode of limiter amplifier 130 (FIG. 8A), and thereby suppressing the transfer of any positive input pulse by said limiter amplifier for the duration of the UP condition of terminal 127.

The loop reshaper and retimer of FIGS. 8A and 8B or of FIGS. 8C and 8D could be employed as the loop reshaper and retimer of the system of FIG. 1.

*Dynamic storage loop*

The dynamic storage loop shown in block diagram form in FIG. 1 includes the binary adder (FIGS. 7, 7G), the 4 millimicrosecond delay means connected terminals 109 and 109D, the loop reshaper and retimer (FIGS. 8, 8E) and the 261 millimicrosecond delay means connecting terminals 110 and 110D. The elapsed time for a pulse to traverse the dynamic storage loop once is equal to 320 millimicroseconds. This time is referred to hereinafter as a "loop period." This loop period of 320 millimicroseconds is the summation of the various time delays in pulse transfer through the loop, i.e., the 29 millimicrosecond time delay through the binary adder, the 4 millimicrosecond time delay between the output of the binary adder and the input of the loop reshaper and retimer, the 26 millimicrosecond time delay between the input and output of the loop reshaper and retimer, and the 261 millimicrosecond delay between the output of the loop reshaper and retimer and the augend input of the binary adder. Description of the operation and timing of the dynamic storage loop is undertaken in conjunction with a specific example.

Referring to the earlier section herein entitled "Partial Product Generator" and the waveform of FIG. 5D labeled "Output Partial Products at Terminal 100" it will be appreciated that said waveform will appear at input terminal 101D (FIG. 1B) of the binary adder. The time occurrence of the waveform appearing at terminal 101D is shown in FIG. 7H and labeled "Input Terminal 101D." The timing differential of 24 millimicroseconds between corresponding pulses in the waveforms at terminal 100 (FIG. 5D) and at terminal 101D

(FIG. 7H) is the summation of the 2 millimicrosecond delay between terminals 100 and 100D (FIG. 1), the 14 millimicrosecond delay of the addend reshaper and retimer (FIG. 1) and the 8 millimicrosecond delay between terminals 101 and 101D (FIG. 1).

Figures 7H, 7J, 7K:
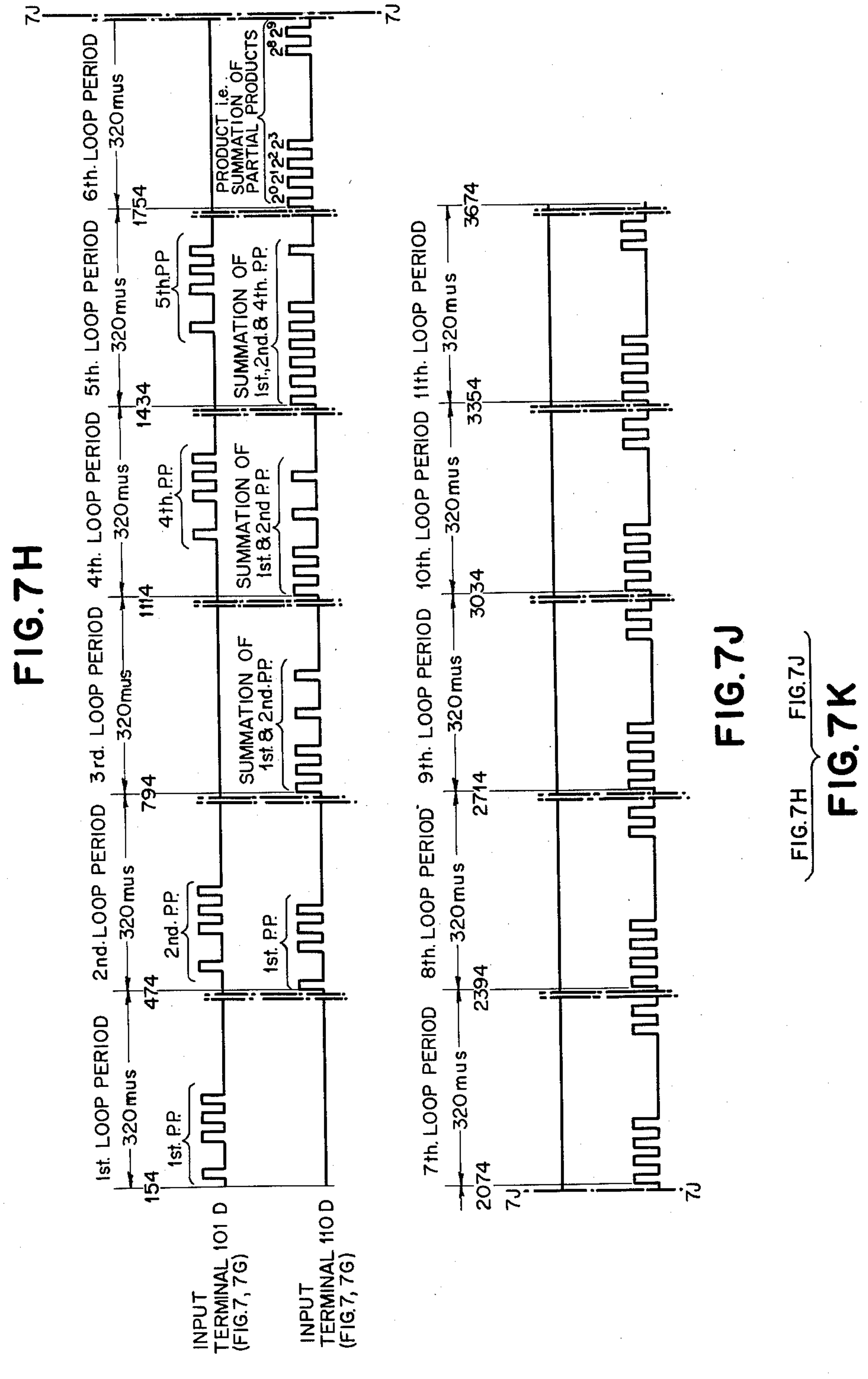

Now referring to FIG. 7H, it will be seen that during the first loop period, namely, the 320 millimicroseconds between times 154 and 474, the first partial product is applied at addend input terminal 101D of the binary adder and the augend input 110D of the binary adder is DOWN throughout this loop period. This first partial product will appear at augend input terminal 110D of the binary adder during the second loop period as indicated in FIG. 7H. During the second loop period the second partial product will appear at addend input terminal 101D of the binary adder in proper time relationship with the first partial product appearing at augend input terminal 110D. The binary adder will combine the first partial product and the second partial product in accordance with the laws of binary addition and render a summation of these partial products. The sum of the first and second partial products will appear at augend input terminal 110D during the third loop period (FIG. 7H), namely, the time interval 794 to 1114.

During the third loop period, in accordance with the example set forth in the section hereof entitled "Partial Product Generator," the input on addend input terminal 101D is zero. Thus during the fourth loop period (FIG. 7H), namely, time interval 1114 to 1434, the sum resulting from the binary addition of the first and second partial products appears serially by binary order at augend input terminal 110D of the binary adder. Also, during the fourth loop period, the fourth partial product appears serially by binary order at addend input terminal 101D of the binary adder. Thus, it is apparent that during the fifth loop period a sum representing the binary addition of the first, second and fourth partial products will appear serially by binary order at terminal 110D of the binary adder. This sum is added to the fifth partial product, which appears at addend input terminal 101D during the fifth loop period, namely, time interval 1434 to 1754 (FIG. 7H), to provide the product, 1111000011, of the example problem (multiplicand 10111 and multiplier 11011). This product expressed in binary notation, reading from left to right, represents a decimal value of 783 and is manifested in the dynamic storage loop during the sixth loop period (FIG. 7H) and every successive loop period thereafter, until such time as a clear signal, i.e., UP potential of sufficient time duration, is applied to clear terminal 127 (FIG. 8A, 8C).

Obviously, the loop time of 320 millimicroseconds could be increased or decreased by varying the time delay between terminals 110 and 110D of FIG. 1 and thus permit the storage in the dynamic storage loop of a greater or lesser number of binary orders. This feature will be still more clearly apparent from a detailed example hereinafter.

The dynamic storage loop includes binary adder means having first and second inputs and an output connected through appropriate delay circuit means to loop reshaper and retimer means having its output connected to the second input of said binary adder. The dynamic storage, or loop period, is the transient time required for a pulse to traverse the entire loop and is 320 millimicroseconds. It will be appreciated that, when such a loop is employed to store 10 millimicrosecond pulses having a minimum pulse spacing of 10 millimicroseconds, a maximum of 16 pulses may be properly stored therein. Obviously, by increasing the loop period, the number of pulses that may be stored in the loop will be correspondingly increased. Further, it will also be appreciated that, when the pulses circulating in such a loop represent binary orders, the input applied to the first input terminal of the binary adder must be properly synchronized with the input applied to the second input terminal of the binary adder so as to properly effect binary addition thereof.

*Synchronizing and starting gate*

Figure 9:
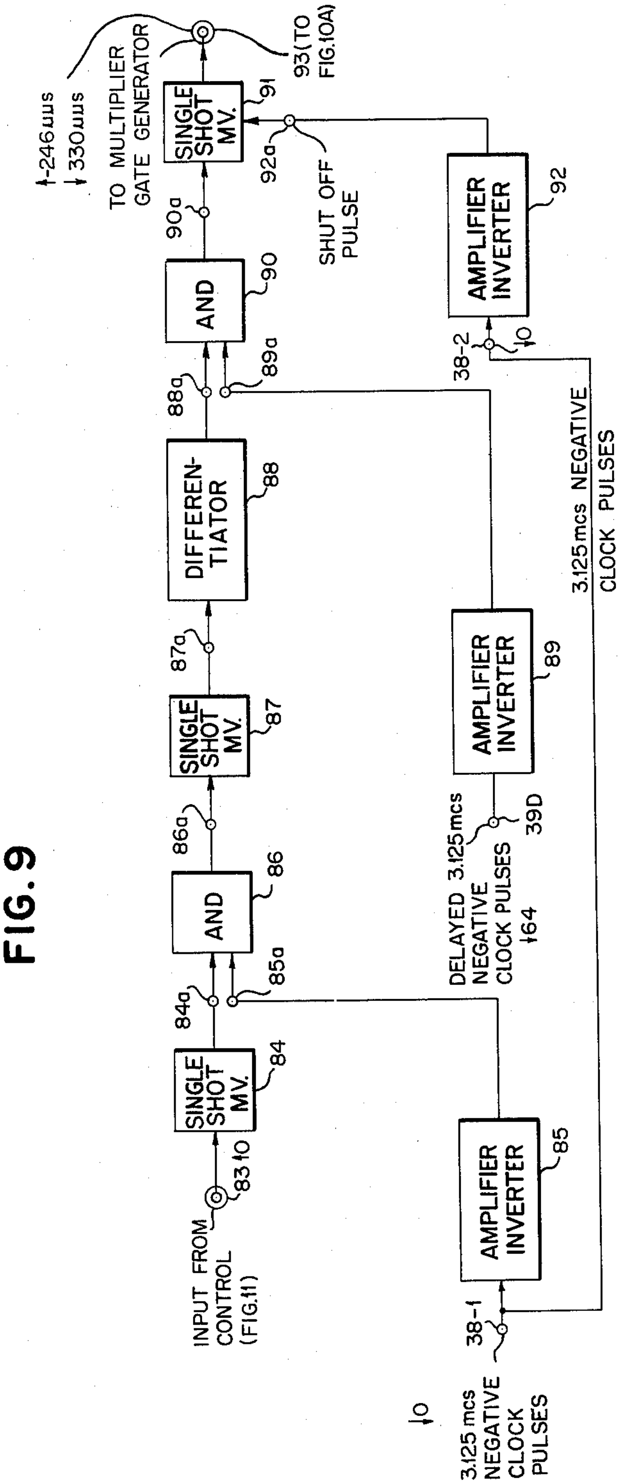
FIG. 9 is a block diagram of the synchronizing and starting gate illustrated in FIG. 1A.
Figure 9A:
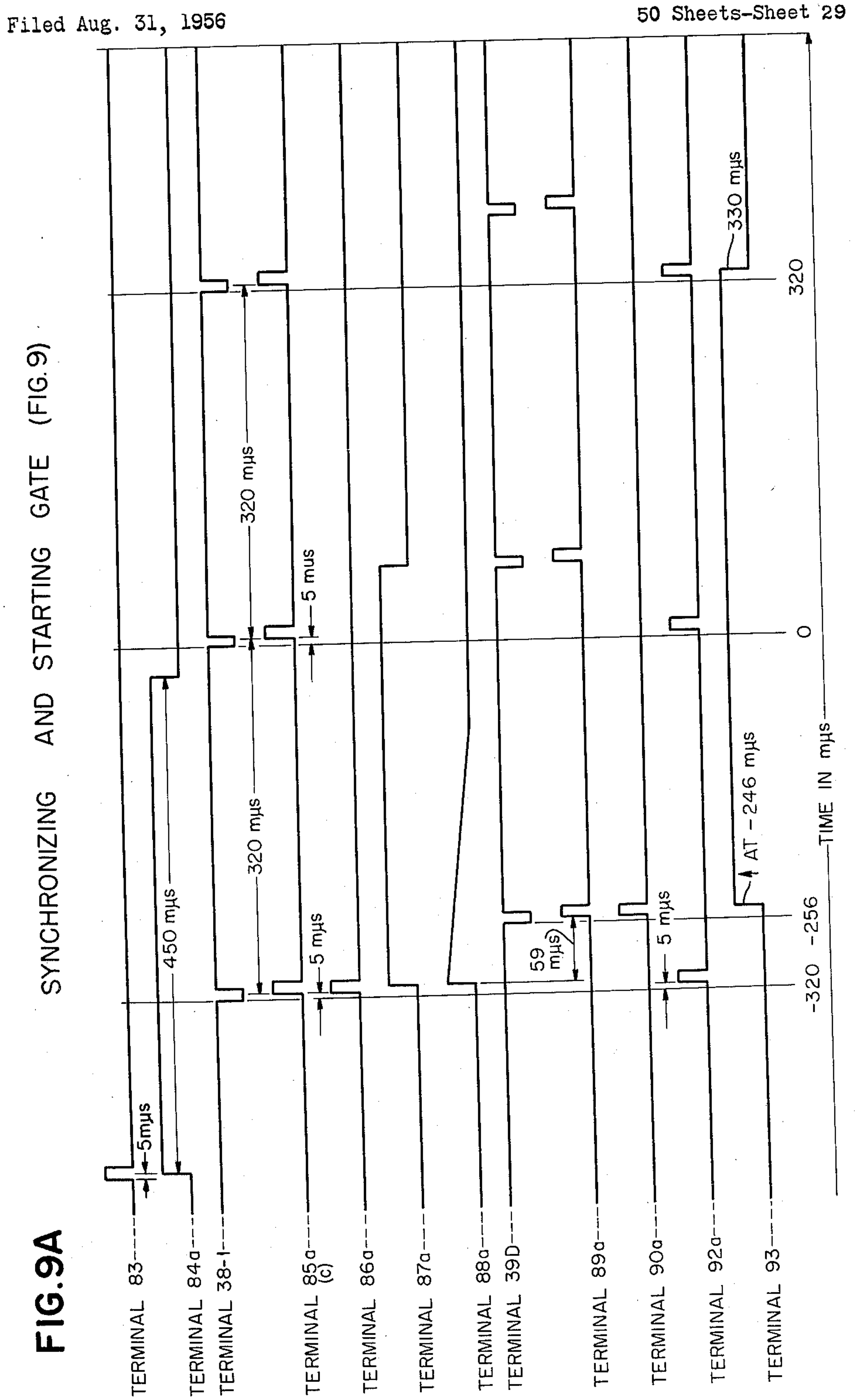
FIG. 9A is a chart showing idealized waveforms illustrating the operation of the synchronizing and starting gate shown in FIG. 9.
Figure 9B:
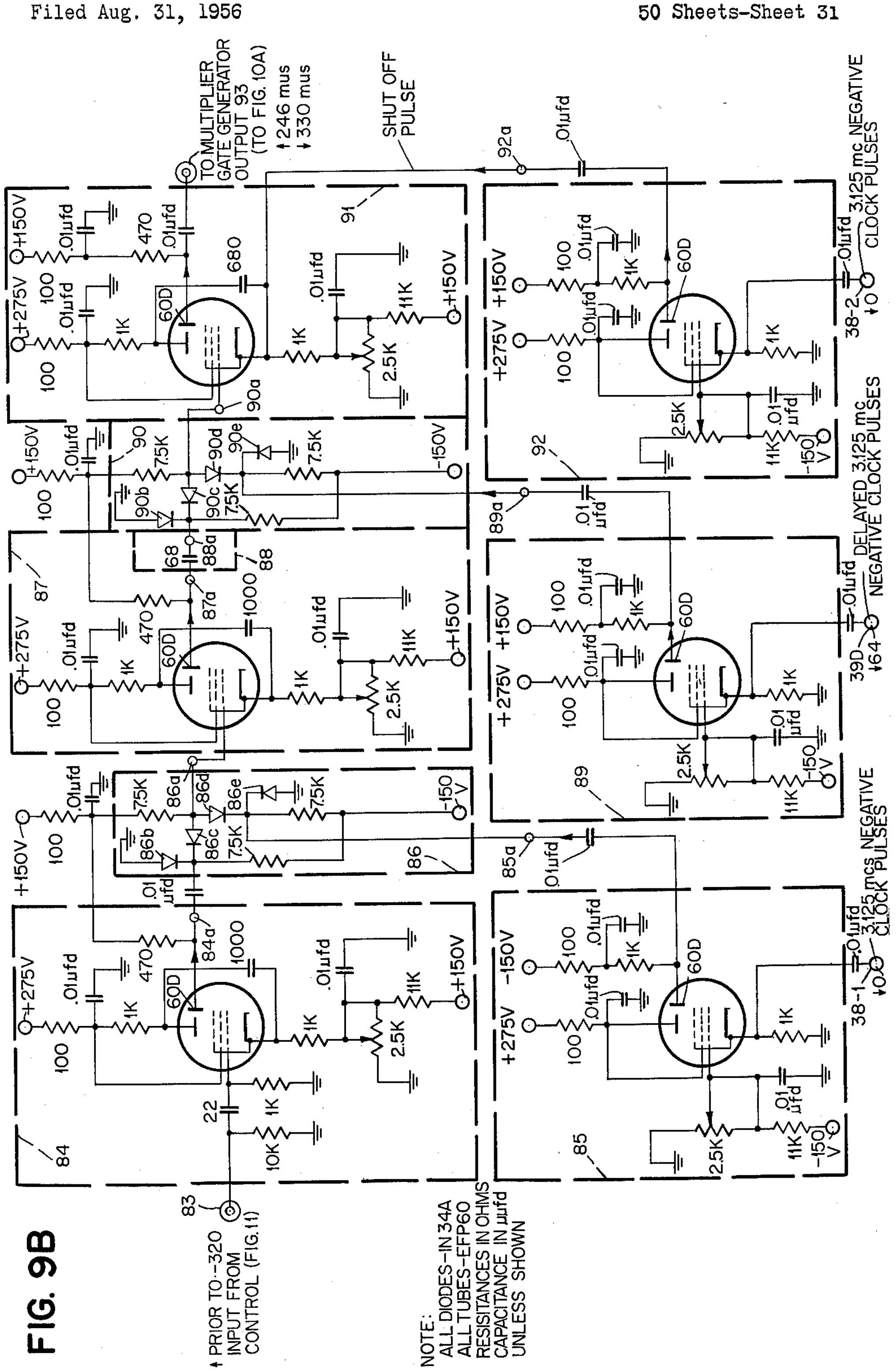
FIG. 9B is a circuit diagram of the synchronizing and starting gate shown in FIG. 9.

FIG. 9 shows a block diagram of a suitable synchronizing and starting gate (FIG. 1A) and FIG. 9B shows a circuit diagram corresponding to the block diagram of FIG. 9. The idealized waveforms of FIG. 9A illustrate operation of the synchronizing and starting gate shown in FIGS. 9 and 9B.

The inputs shown at terminals 38–1, 38–2, 39D and 83 (FIGS. 1A, 9, 9B) are applied to the synchronizing and starting gate (FIGS. 9, 9B) to provide an UP voltage at the terminal 93 (FIGS. 9, 9A, 10) from —246 time to 330 time. This output is used to condition the multiplier gate generator (FIG. 1A) to permit each of of the next five pulses applied to the terminal 38D–1 thereof (FIG. 1A) to transfer a different one of the multiplier digits of the partial product generator (FIG. 1A). The input terminal 83 of the single shot multivibrator 84 (FIGS. 9, 9B) receives a 10 millimicrosecond pulse (FIG. 9A) from the control circuit and five millimicroseconds thereafter provides an output pulse of approximately 450 millimicrosecond duration.

Each negative secondary clock pulse applied to the terminal 38–1 of the amplifier-inverter 85 (FIGS 9, 9B) provides an amplified positive pulse at is output terminal 85*a* (FIGS. 9, 9B) five millimicroseconds thereafter. The first such pulse applied to the amplifier-inverter 85 after the presence of the asynchronous pulse at the output terminal 84*a* of the single shot multivibrator 84 causes a positive pulse to be applied to the output terminal 86*a* (FIGS. 9, 9A, 9B) of AND circuit 86 due to the presence of the positive pulses at terminals 84*a* and 85*a* thereof. The falling or leading edge of this first negative secondary clock pulse applied to terminal 38–1 (FIG. 9A) occurs —320 time (FIG. 9A). The 450 millimicrosecond width of the output pulse from terminal 84*a* (FIG. 9A) assures that at least one output will be obtained from the AND circuit 86 (FIGS. 9, 9B) during this period. The positive pulse at terminal 86*a* (FIG. 9A) at —315 time is applied to the single shot multivibrator 87 (FIGS. 9, 9B) and provides a positive pulse at terminal 87*a* (FIGS. 9, 9A) at —310 time. This positive pulse at terminal 87*a* (FIG. 9A) must be of sufficient duration to prevent a retriggering of the multivibrator 87 in response to a second pulse which might be produced at terminal 85*a* (FIGS. 9, 9A) while terminal 84*a* (FIGS. 9, 9A) is still in the UP condition. The positive pulse at terminal 87*a* (FIGS. 9, 9A) is differentiated by differentiator circuit 88 (FIGS. 9, 9B) to provide a differentiated output pulse at the output terminal 88*a* thereof.

A negative secondary clock pulse is applied to terminal 39D (FIGS. 9, 9A, 9B) of amplifier-inverter 89 (FIGS. 9, 9B) at —256 time and provides a positive pulse at the output terminal 89*a* (FIGS. 9, 9A, 9B) thereof five millimicroseconds later or at —216 time. Hence, the input terminals 88*a* and 89*a* (FIGS. 9, 9A, 9B) of AND circuit 90 (FIGS. 9, 9B) are UP at —251 time and provide a positive pulse at the output terminal 90*a* (FIGS. 9, 9A, 9B) thereof at this time. The positive pulse at terminal 90*a* causes a multivibrator 91 (FIGS. 9, 9B) to provide a positive pulse at the output terminal 93 (FIGS. 9, 9A, 9B, 10A) five millimicroseconds later or at —246 time.

Negative secondary clock pulses are applied to amplifier-inverter 92 (FIGS. 9, 9B) from terminal 38–2 (FIGS. 9, 9A, 9B) and cause a positive pulse to be transferred to the single shot multivibrator 91 five millimicroseconds after each negative pulse is applied to terminal 38–2. The positive pulses at terminal 92*a* (FIGS. 9, 9A, 9B) provide a change in the signal level at the cathode of the single shot multivibrator circuit 91 (FIG. 9B) and cause the output at terminal 93 to go DOWN to insure that output terminal 93 is UP until the occurrence of a predetermined number of positive pulses at terminal 92a. Hence, the pulses at terminal 92a which cause the output terminal 93 to go DOWN are referred to as shut off pulses. The bias control adjustment of the single shot multivibrator 91 (FIGS. 9, 9B) determines which of the shut off pulses at terminal 92a (FIGS. 9, 9A, 9B) is effective to cause the output pulse at terminal 93 to go DOWN.

Referring to the circuit diagram of FIG. 9B, the multivibrator 84 is a single tube secondary emission pentode multivibrator. The regenerative feedback in the circuit in multivibrator 84 is from plate to cathode and utilizes the secondary emission current gain of the tube. The duration of the positive output pulse at the dynode is determined by the 1K resistors, the 1,000 micro micro farad condenser and by the bias setting determined by the 2.5K potentiometer and the 11K resistor. The multivibrators 84, 87 and 91 are similar. In the multivibrator 91, shut off pulses are applied from terminal 92a to insure an accurately timed positive output pulse at the output terminal 93 (FIG. 9B).

Diodes 86c and 86d of AND circuit 86 perform the logical function while diodes 86b and 86e eliminate output voltage swings at terminal 86a upon receipt of a positive pulse at only one of the terminals 84a or 85a and at the same time providing D.C. restoration for the .01 micro micro farad coupling condensers coupling circuits 85 and 84 thereto. AND circuit 90 (FIG. 9B) is similar to AND circuit 86.

The output of multivibrator circuit 87 (FIG. 9B) is differentiated by the differentiating circuit 88 (FIG. 9) which includes the 68 micro micro farad condenser enclosed by dotted lines and the 7.5K resistor enclosed by the dotted lines 90 (FIG. 9B) and applied to terminal 88a. Upon application of a positive pulse at terminal 87a, the terminal 88a rises and the diode 90b is cut off. The terminal 88a then falls as the 68 micro micro farad condenser is discharged toward the −150 volt level to which the 7.5K resistor is connected. When the terminal 88a reaches ground level, the diode 90b again conducts and causes the voltage at terminal 88a to remain at ground potential.

Amplifier 85 is a grounded grid, secondary emission pentode amplifier with dynode output and cathode input. Upon application of negative pulses at the terminal 38–1, positive output pulses are produced at the terminal 85a. These output pulses are delayed with respect to the input pulses by approximately five millimicroseconds, the electron transit time within the secondary emission pentode. Amplifiers 89 and 92 are similar to amplifier 85.

*Multiplier gate generators*

Figures 10, 10A, 10B:
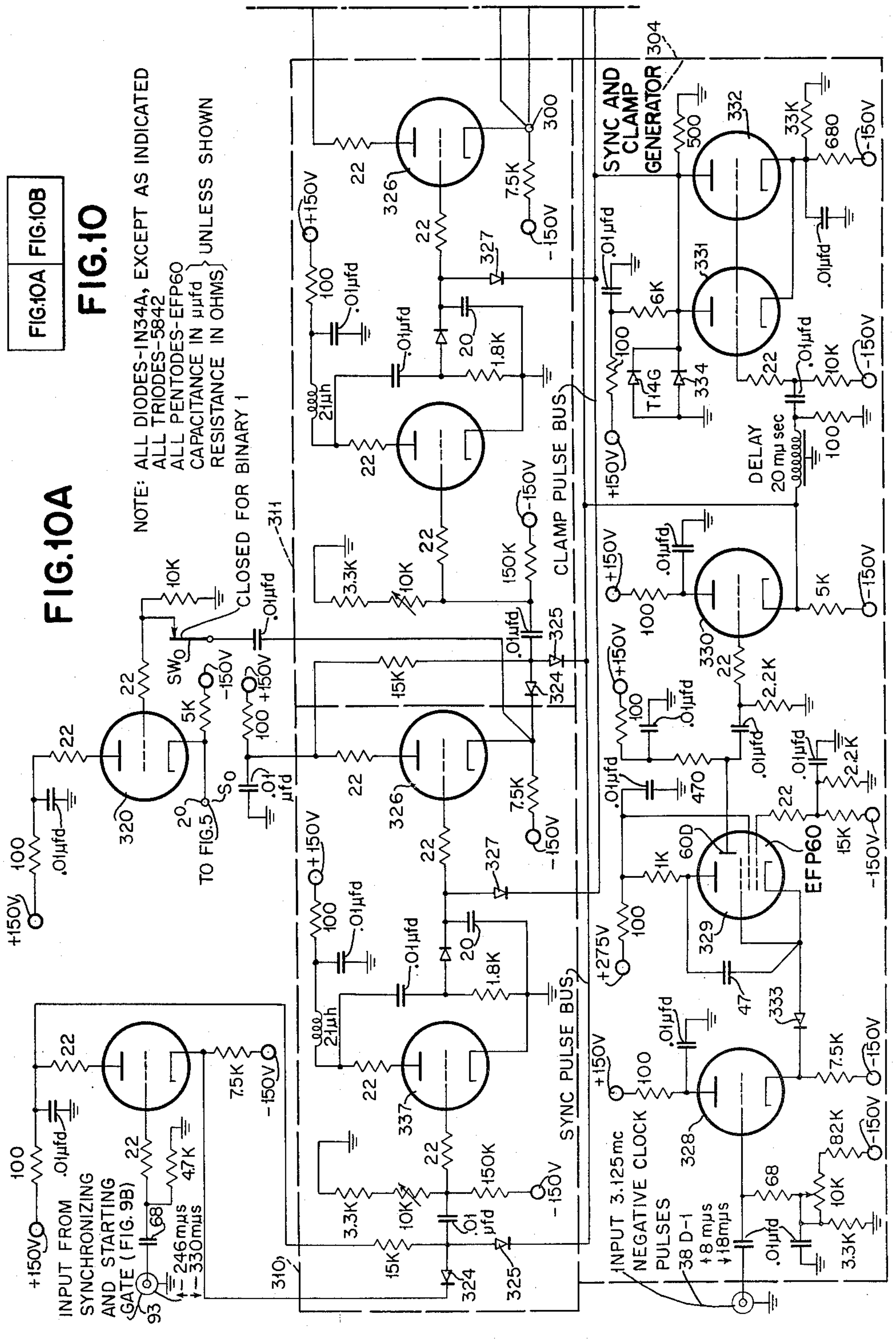
FIG. 10 shows the arrangement of FIGS. 10A and 10B to form a circuit diagram for the multiplier gate generators illustrated in FIG. 1A.
Figure 10B:
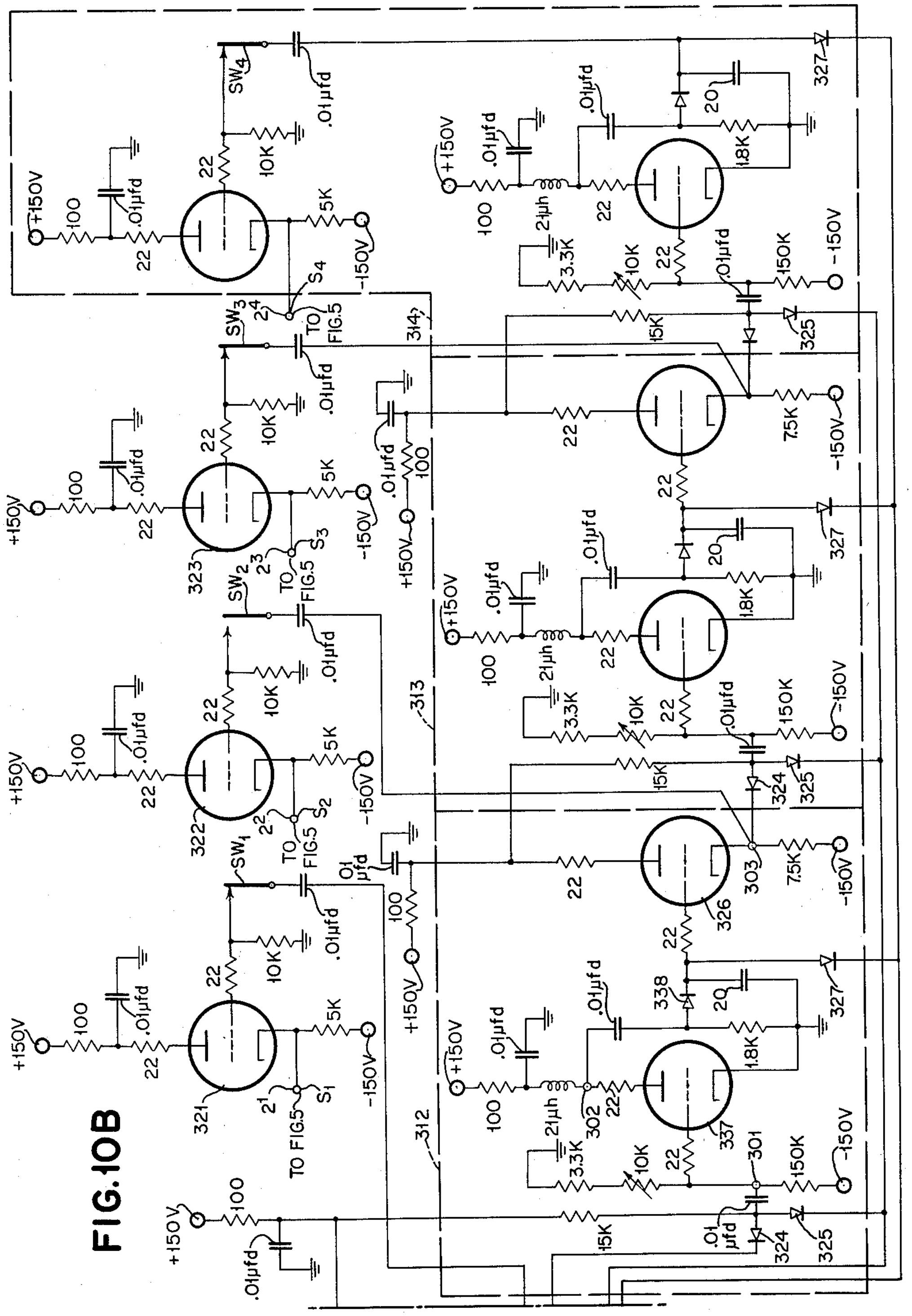
FIG. 10C shows idealized waveforms illustrating the operation of the circuit shown in FIGS. 10A and 10B.
FIG. 10D shows idealized waveforms illustrating the operation of delay circuits shown in FIGS. 10 and 10E.
Figure 10C:
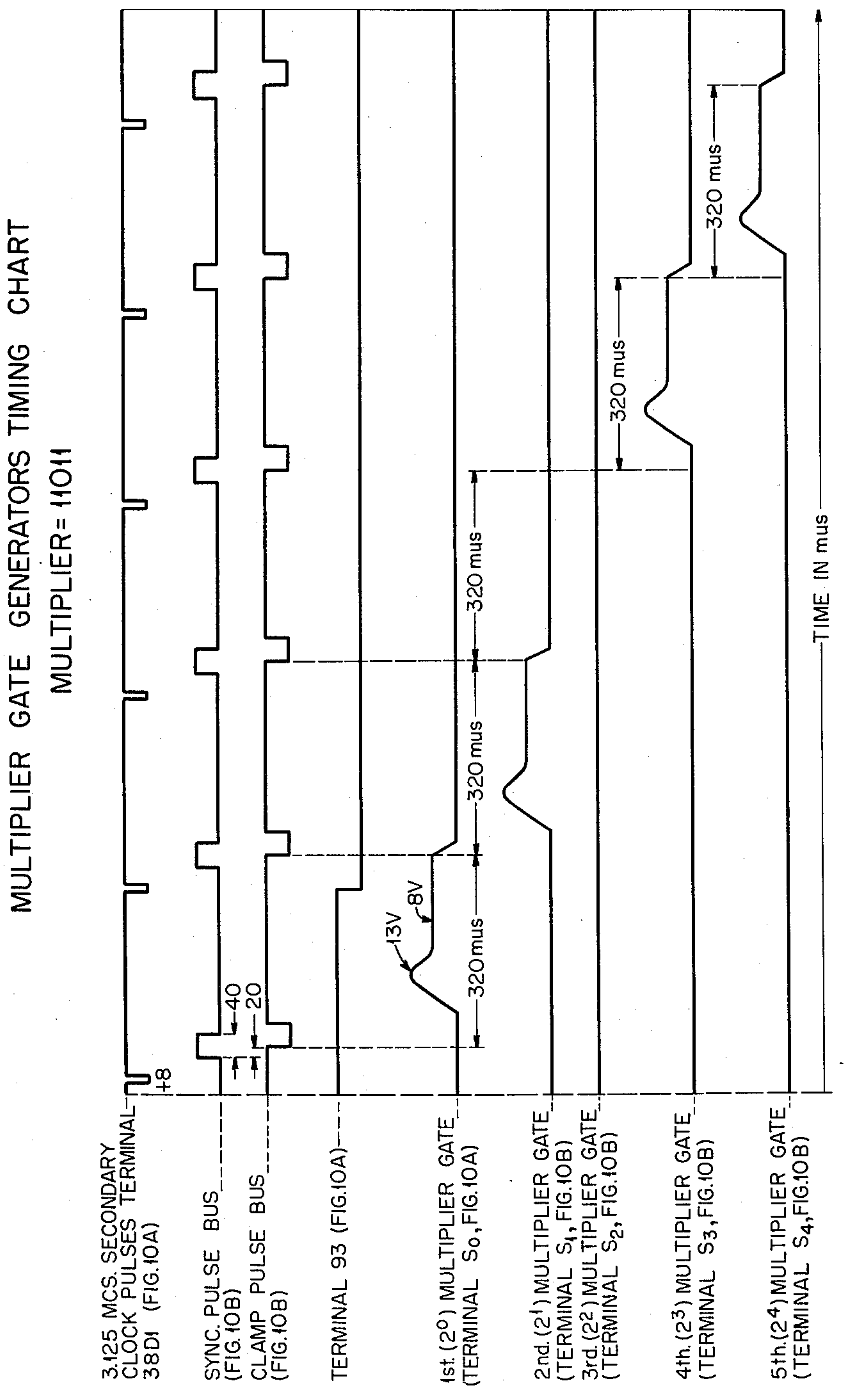
Figure 10D:
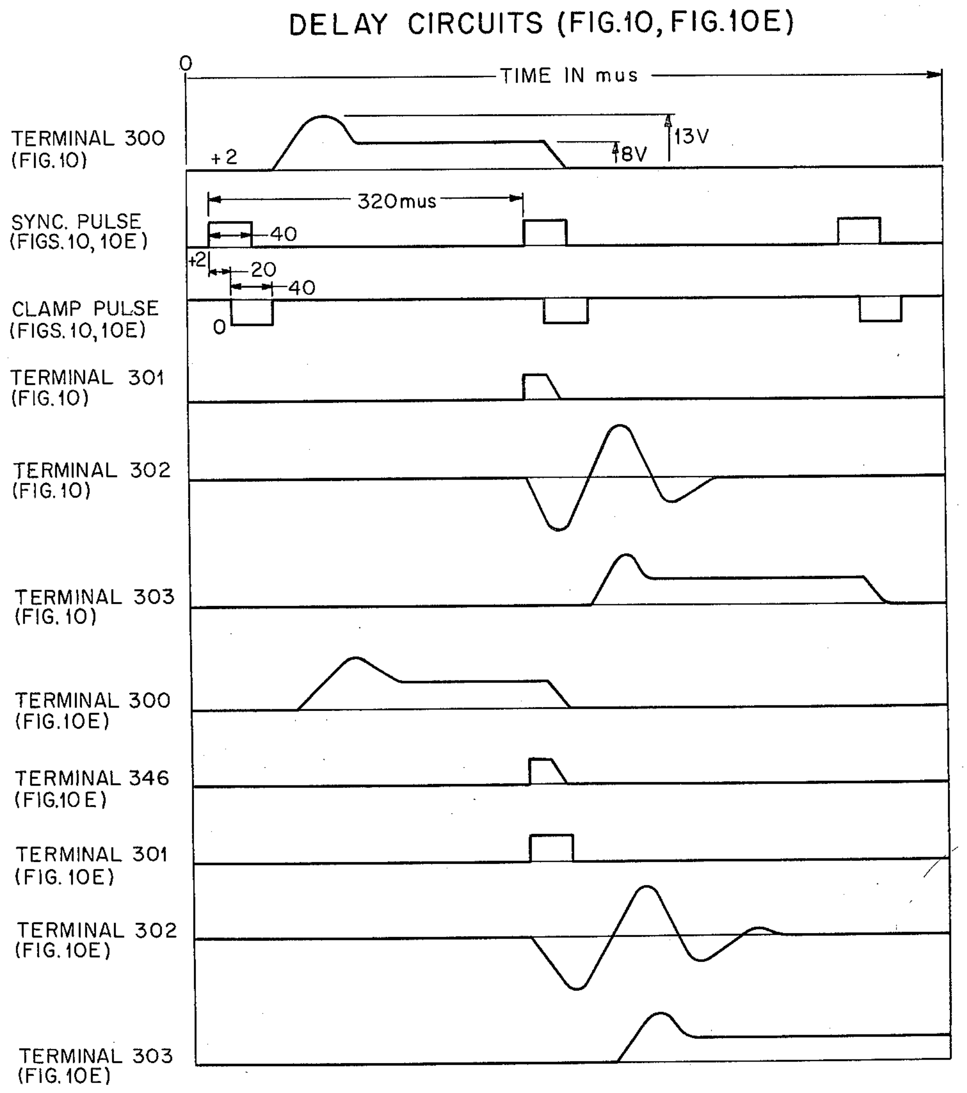

The circuit diagram of the multiplier gate generators is illustrated by FIGS. 10A and 10B arranged as shown by FIG. 10. FIG. 10C is a timing chart illustrating the operation of FIG. 10, and FIG. 10D is a timing chart illustrating the operation of any one of the delay circuits 310–314. The respective digits of the $2^0$, $2^1$, $2^2$, $2^3$ and $2^4$ orders of a multiplier are represented at corresponding terminals $S_0$, $S_1$, $S_3$ and $S_4$ (FIGS. 10A, 10B). The binary value of these digits is determined by the position of the corresponding switches $SW_0$, $SW_1$, $SW_2$, $SW_3$ and $SW_4$. When one of these switches is open, the binary digit exhibited at the corresponding terminal is a binary 0 and when the switch is closed, that digit is a binary 1, i.e., when the switch is closed the corresponding terminal is caused to exhibit a binary 1 by an UP voltage or positive pulse and when the switch is open a binary 0 is exhibited by a DOWN condition at that terminal or the absence of a pulse.

The sync and clamp pulse generator 304 (FIG. 10A) produces sync and clamp pulses on the sync pulse bus and clamp pulse bus (FIGS. 10A, 10B, 10C) respectively in response to receipt of negative secondary clock pulses at terminal 38D–1 (FIG. 10A). When a secondary clock pulse is applied to terminal 38D–1 (FIGS. 10A, 10C), a sync pulse is provided at the sync pulse bus (FIG. 10C) approximately 40 millimicroseconds thereafter and a clamp pulse is provided at the clamp pulse bus (FIG. 10C) approximately 20 millimicroseconds after the sync pulse appears.

When the terminal 93 (FIGS. 10A, 9B, 10C) goes UP and a sync pulse appears at the sync pulse bus (FIGS. 10A, 10C), the juncture of diodes 324 and 325 (FIG. 10A) goes UP and delay circuit 310 (FIG. 10A) is caused to provide a positive pulse at the cathode of tube 326 approximately 40 millimicroseconds after termination of the UP voltage at the juncture of diodes 324 and 325. The UP voltage at the cathode of tube 326 is present during substantially a whole secondary clock pulse period of 320 millimicroseconds (FIG. 10C) and is terminated when the next clamp pulse on the clamp pulse bus is applied to diode 327 (FIG. 10A). The UP voltage at the cathode of tube 326 is transferred through switch $SW_0$ (FIG. 10A) to the control grid of tube 320 (FIG. 10A) to provide this same positive pulse at the terminal $S_0$ (FIGS. 10A, 5).

The UP voltage at the cathode of tube 326 is also effective through diode 324 of delay circuit 311 (FIG. 10A) and its coincidence with the next sync pulse from the sync pulse bus to cause operation of delay circuit 311 (FIG. 10A) similar to the operation of delay circuit 310 described above. The resulting positive pulse at the cathode of tube 326 of delay circuit 311 occurring during the second secondary clock period is transferred to the terminal $S_1$ (FIG. 10B). The occurrence of the first clamp pulse following the first secondary clock period (FIG. 10C) causes delay circuit 310 to revert to its initial electrical condition and hence does not provide another output until after receipt of another pulse at terminal 93 (FIG. 10A). Hence, during the first secondary clock period, the lowest order digit or $2^0$ digit of the multiplier is exhibited at terminal $S_0$ (FIG. 10A) and during the second secondary clock period the second order digit or $2^1$ digit of the multiplier is exhibited at terminal $S_1$ (FIG. 10B). Hence, during the third secondary clock period, the third order digit or $2^2$ digit of the multiplier is exhibited at terminal $S_2$ by the absence of a positive pulse since switch $SW_2$ is open to indicate that that digit is a binary 0. Similarly, during the fourth and fifth secondary clock periods, a binary 1 is indicated by a positive pulse at the terminals $S_3$ and $S_4$ (FIG. 10B), respectively.

Hence, during the first secondary clock period, delay circuit 310 (FIG. 10A) is energized to permit exhibition of the $2^0$ multiplier digit at terminal $S_0$. At the conclusion of the first secondary clock period, a positive pulse is transferred from delay circuit 310 to delay circuit 311 to permit exhibition of the $2^1$ multiplier digit at terminal $S_1$ and delay circuit 310 is de-energized or reset to its initial condition. During the third secondary clock period, a positive pulse is transferred from delay circuit 311 to energize delay circuit 312, and permit exhibition of the $2^2$ multiplier digit at terminal $S_2$ and delay 311 is de-energized or reset to its initial condition. During the fourth secondary clock period, a positive pulse is transferred from delay circuit 312 to delay circuit 313 to permit exhibition of the $2^3$ multiplier digit at terminal $S_3$ and delay circuit 312 is de-energized or reset to its initial condition. During the fifth secondary clock period, a positive pulse is transferred from delay circuit 313 to delay circuit 314 (FIG. 10B) to permit exhibition of the $2^4$ multiplier digit at terminal $S_4$ and the delay circuit 313 (FIG. 10B) is de-energized or reset to its initial condition. In response to the sixth secondary clock pulse, the delay circuit 314 is de-energized or reset to its initial condition.

The sync and clamp generator 304 (FIG. 10A) includes cathode follower 328, a single shot multivibrator 329, cathode follower 330 and puller tubes 331 and 332. In response to receipt of a negative secondary clock pulse at terminal 38D–1, a negative voltage is generated at the cathode of tube 328 and is applied through the diode 333 to the multivibrator 329. Multivibrator 329 consists of a secondary emission pentode with a regenerative feedback coupling from plate to cathode and is normally biased OFF or non-conducting. The application of a negative pulse at the cathode of tube 328 causes tube 329 to conduct, and the feedback coupling from the plate to the cathode of tube 329 and the diode 333 provide a positive output pulse of approximately 40 millimicrosecond duration at the dynode 60D of tube 329. At the termination of this pulse, diode 333 conducts and causes the 47 micro micro farad condenser to be recharged to its initial condition preparatory to receipt of the next secondary clock pulse at terminal 38D–1. The 40 millimicrosecond pulse from the dynode of tube 329 is applied to the grid of the cathode follower tube 330. The output of this cathode follower tube 330 energizes the delay circuits 310 to 314 inclusive via the diodes 325 thereof. The output of cathode follower tube 330 is also effective to drive a delay line causing a delay of 20 millimicroseconds. The output of this delay line drives a pair of puller tubes 331 and 332 connected in parallel. The plates of the puller tubes are normally biased at a positive voltage and during the application of a positive pulse to their grids, these plates are pulled to ground level where they are clamped by the diodes 334. The clamp pulse bus is connected to the plates of the puller tubes and causes delay circuits 310–314 via the diodes 327 thereof to be de-energized or reset to their initial condition.

The operation of a typical one of the delay circuits 310–314, for example, delay circuit 312, is more fully appreciated by conjoint reference to the circuit of FIG. 10B and the timing diagram of FIG. 10D. These delay circuits are an improvement over the delay circuit described and claimed in Patent Re. 23,699, issued August 18, 1953, to Byron L. Havens, entitled "Pulse Delay Circuit," on an original application filed July 30, 1951. The output of the delay circuit 311 appears at the terminal 300 (FIGS. 10A, 10D). Upon arrival of a sync pulse, the coincidence of the positive pulse at terminal 300 and the sync pulse at diode 325 causes the logical product to appear at terminal 301. The application of the positive pulse at terminal 301 to the tube 337 causes the voltage at terminal 302 to decrease as current flows through the 21 micro henry inductance. Upon termination of this positive pulse, the voltage at terminal 302 begins to rise. The circuit consisting of the 21 micro henry inductance, 1.8K resistor, and tube and stray capacitance is so designed that the inductance is less than critically damped so that a voltage overshoot at the terminal 302 is developed as shown in FIG. 10D. The first positive overshoot at terminal 302 is applied through diode 338 to the 20 micro micro farad condenser and charges it to a positive potential. The equilibrium value of this positive potential is determined by the positive bias voltage maintained on the clamp pulse bus. This voltage at the 20 micro micro farad condenser is delivered to output terminal 302 through the cathode follower tube 326. The positive potential at the 20 micro micro farad condenser is maintained because diodes 338 and 327 are normally nonconducting. Upon receipt of a clamp pulse at diode 327, the 20 micro micro farad condenser is discharged and the output voltage at terminal 303 decreases to its initial value.

Figure 10E:
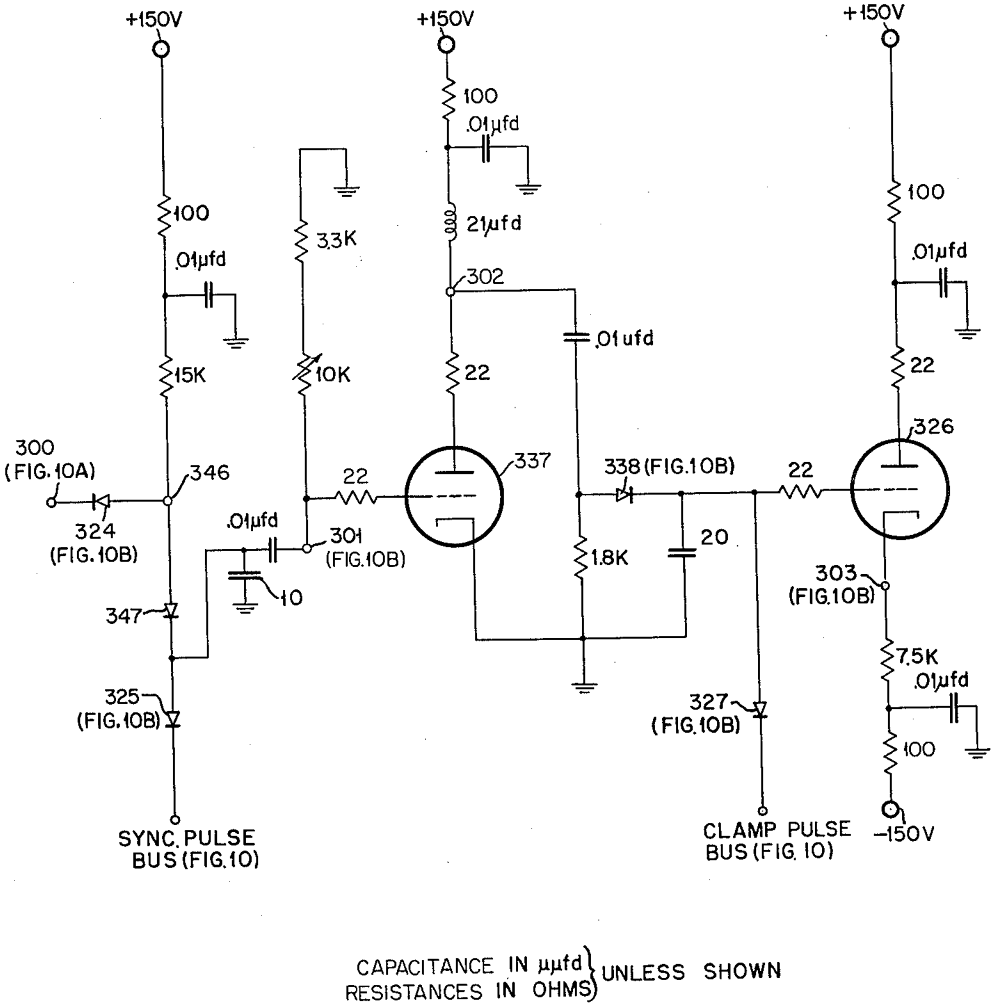

FIG. 10E is a circuit diagram showing an improvement over the delay circuits 310–315 (FIG. 10). The delay circuit of FIG. 10E is described conjointly with the waveforms of FIG. 10D illustrating its operation. This novel delay circuit (FIG. 10E) provides compensation for delay variation which may occur between sync and clamp pulse timing and also makes possible deliberate design variation of this timing. The manner in which this is done is shown in FIGS. 10E and 10D and consists of the addition of the diode 347 and the 10 micro micro farad condenser coupled to terminal 301. This combination provides a storage or hold circuit during the time that the sync pulse is UP. The output of this storage or hold circuit reproduces the sync pulse provided only that the sync pulse and the input pulse to terminal 300 overlap for a period sufficiently long for the terminal 301 to rise to the sync pulse level.

The waveforms for the circuit of FIG. 10E are shown in FIG. 10D. The logical product of the sync pulse and the input pulse at terminal 300 is developed at terminal 346. The voltage at terminal 346 is delivered through diode 347 to the 10 micro micro farad storage condenser and to terminal 301. When the voltage at the terminal 346 decreases with the voltage at the terminal 300, terminal 301 remains UP. The storage circuit consisting of the 10 micro micro farad condenser, diodes 347 and 325 then remains UP because of the UP condition of the sync pulse and the back bias condition of diode 347 until the decrease or fall of the sync pulse at which time the 10 micro micro farad condenser is returned to its initial condition because of conduction through the diode 325. The voltage waveform at terminal 301 is thus a reproduction of the sync pulse waveform. The voltage at terminal 301 is then applied to the grid of tube 337 and causes the voltage at terminal 302 to decrease. At the termination of the pulse at terminal 301, the voltage at terminal 302 rises due to the less than critically damped inductance. The waveform at terminal 302 (FIGS. 10E, 10D) rises at a later time than the waveform 302 (FIGS. 10, 10D) due to the fact that the pulse at terminal 301 (FIG. 10E) is of greater time duration than the pulse at terminal 301 (FIG. 10). The output waveform rises at a correspondingly later time as shown in FIG. 10D, terminal 303 (FIG. 10A). The cycle time for the operation of the circuit configurations of FIG. 10 and FIG. 10E is the same. An advantageous and novel feature of the modification (FIG. 10E) is the independence of the output with respect to relative time shifts and timing between the occurrence of the sync pulse and the clamp pulse. Obviously, the fact that the relative time of occurrence of the sync and clamp pulses is not of critical importance in the delay circuit of FIG. 10E permits substantial saving in delay circuit, timing circuits and the like required to provide accurately timed sync and clamp pulses.

*Control*

Figure 11:
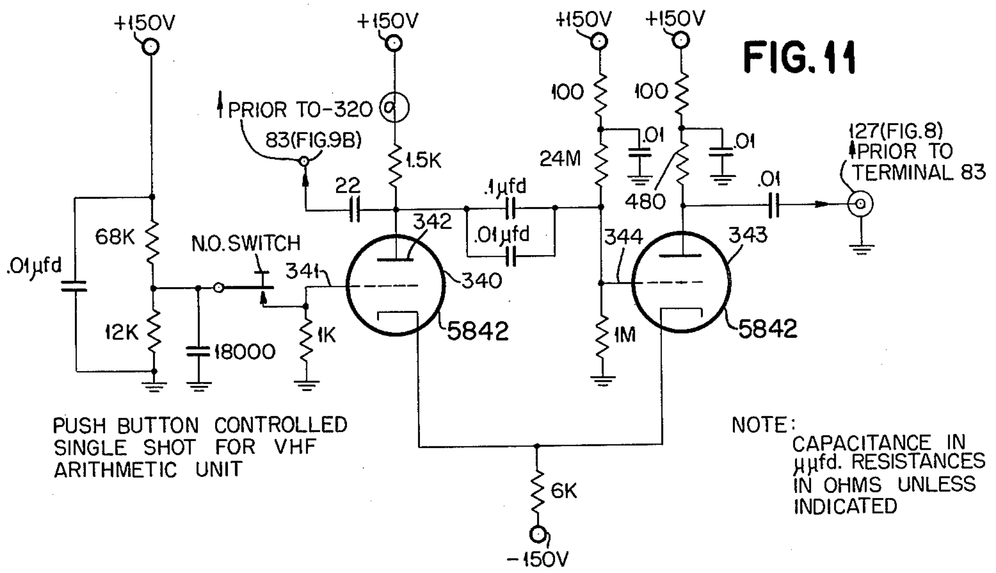
FIG. 11 is a circuit diagram of the control unit illustrated in FIG. 1A.
Figure 11A:
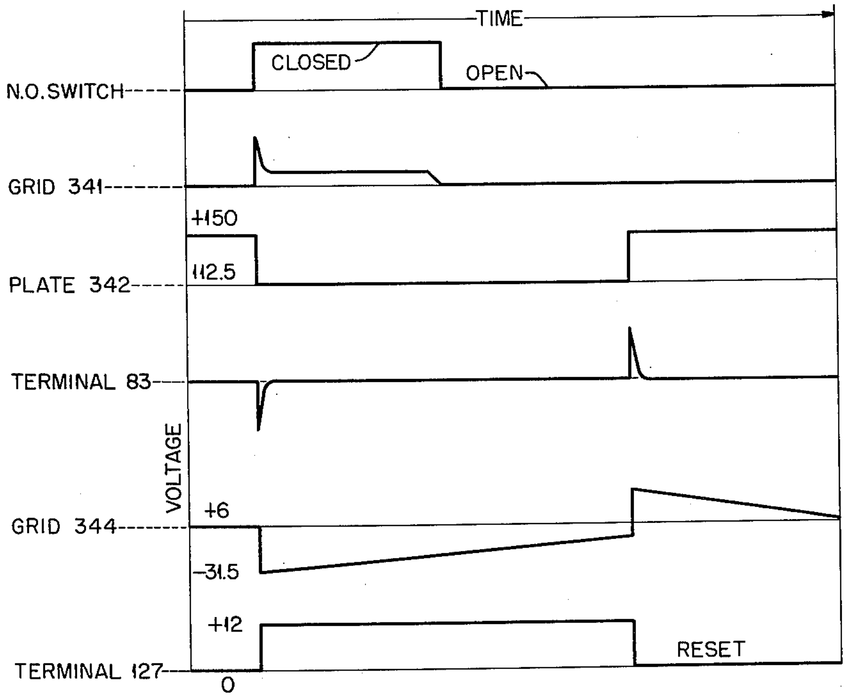
FIG. 11A shows idealized waveforms illustrating the operation of the circuit shown in FIG. 11.

The circuit diagram for the control circuit (FIG. 1A) is shown in FIG. 11 which is described by conjoint reference to FIG. 11A which shows waveforms illustrating the operation of the control circuit of FIG. 11. The control circuit (FIG. 11) is designed for operation from a manual pushbutton control and includes a monostable multivibrator. A multivibrator output is provided at terminal 127 to provide a clear accumulator pulse (FIG. 8) prior to the presence of the multivibrator output at terminal 83 (FIG. 9) which provdes the trigger pulse for the synchronizing and starting gate.

The monostable multivibrator circuit (FIG. 11) is operated in such a manner that tube 343 is normally biased ON or is plate current conductive and tube 340 is normally biased OFF and is not plate current conductive. Upon closure of the manually operated and normally open switch shown in FIG. 11A, the waveform at the grid 341 is as shown in FIG. 11A. The production of the positive pulse at grid 341 (FIG. 11) causes tube 340 to conduct, the voltage at the plate 342 to decrease, the voltage at grid 344 to decrease and regeneration causes tube 343 to be shut off or rendered non-conductive at the plate. During this OFF period of tube 343, the waveforms at terminal 127, plate 342, grid 344 and terminal 83 are provided as indicated by the idealized waveforms shown in FIG. 11A. The positive output at terminal 127 having a time duration fixed by the time constant at the grid 344 (FIG. 11) is used to produce the clear accumulator signal (FIG. 8). The differentiated output from the plate 342 (FIGS. 11, 11A) is delivered to terminal 83 (FIG. 9). At this terminal, the negative pulse produced by the differentiated falling edge of the pulse at the plate 342 is ineffective and the positive pulse at terminal 83 produced by the differentiated rising edge of the pulse at the plate 342 produces the start pulse for the synchronizing and starting gate (FIG. 9). The multivibrator time constant which determines the total width of the pulses at terminals 127 and 83 is determined by the capacitors between the plate 342 and the grid 344 (FIG. 11) and the resistors connected to the grid 344 and in operation a momentary closure of the pushbutton switch produces only a single operation of the multivibrator.

*Indicator register*

Figures 12, 12A:
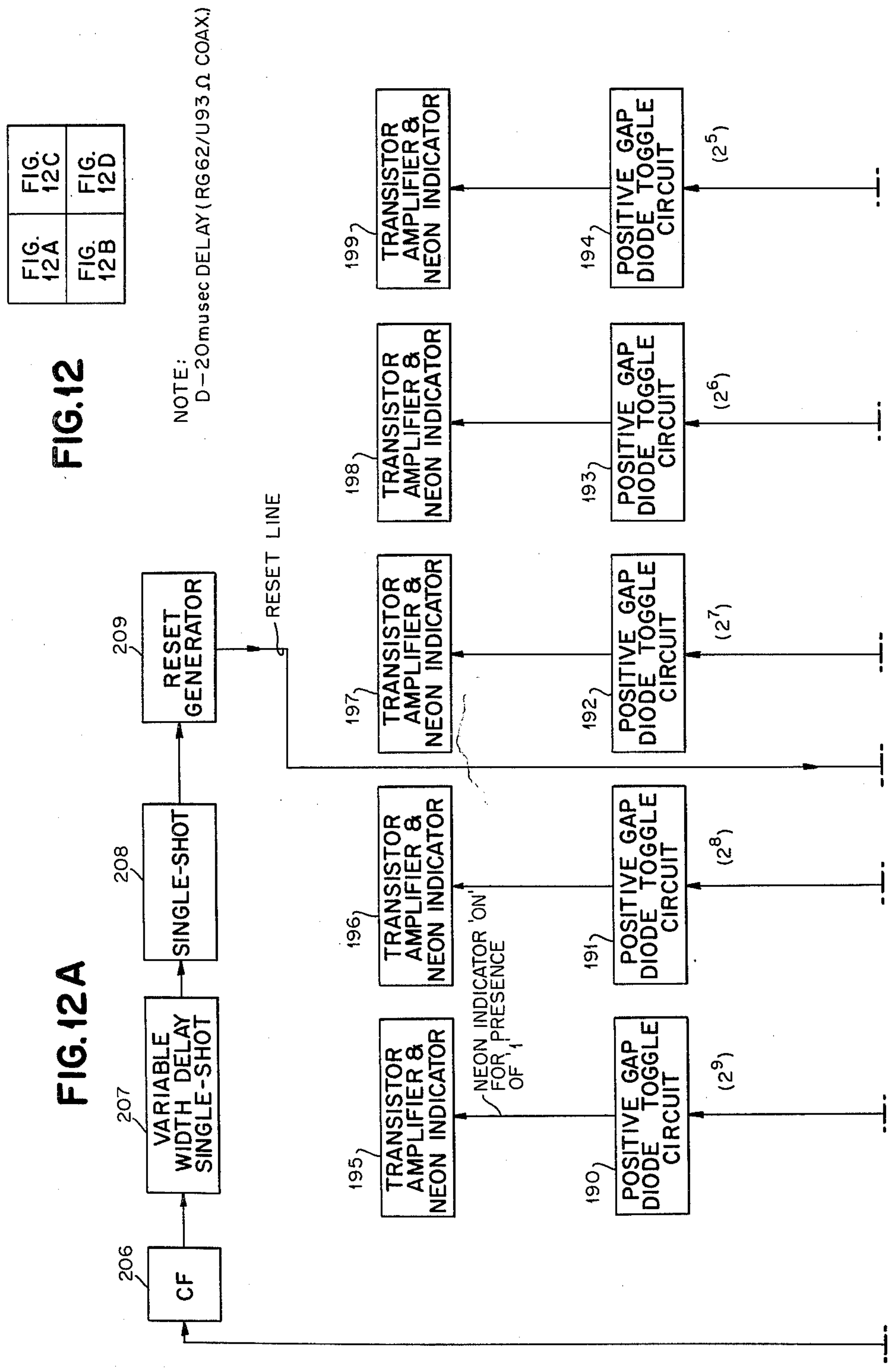
FIG. 12 shows the arrangement of FIGS. 12A–12D to form a logical block diagram of the indicator register illustrated in FIG. 1B.

A block diagram of the indicator register, represented by a single block in FIG. 1B, is shown in FIGS 12A, 12B, 12C and 12D arranged as shown in FIG. 12. The indicator register of FIG. 12 has ten positions that may be employed respectively to store and indicate the binary orders $2^0$ through $2^9$. From the detailed discussion hereinafter, it will be apparent how the capacity of the indicator register of FIG. 12 may be increased by adding sections that may be substantially identical to FIGS. 12C and 12D or the desired portion thereof.

Figure 12B:
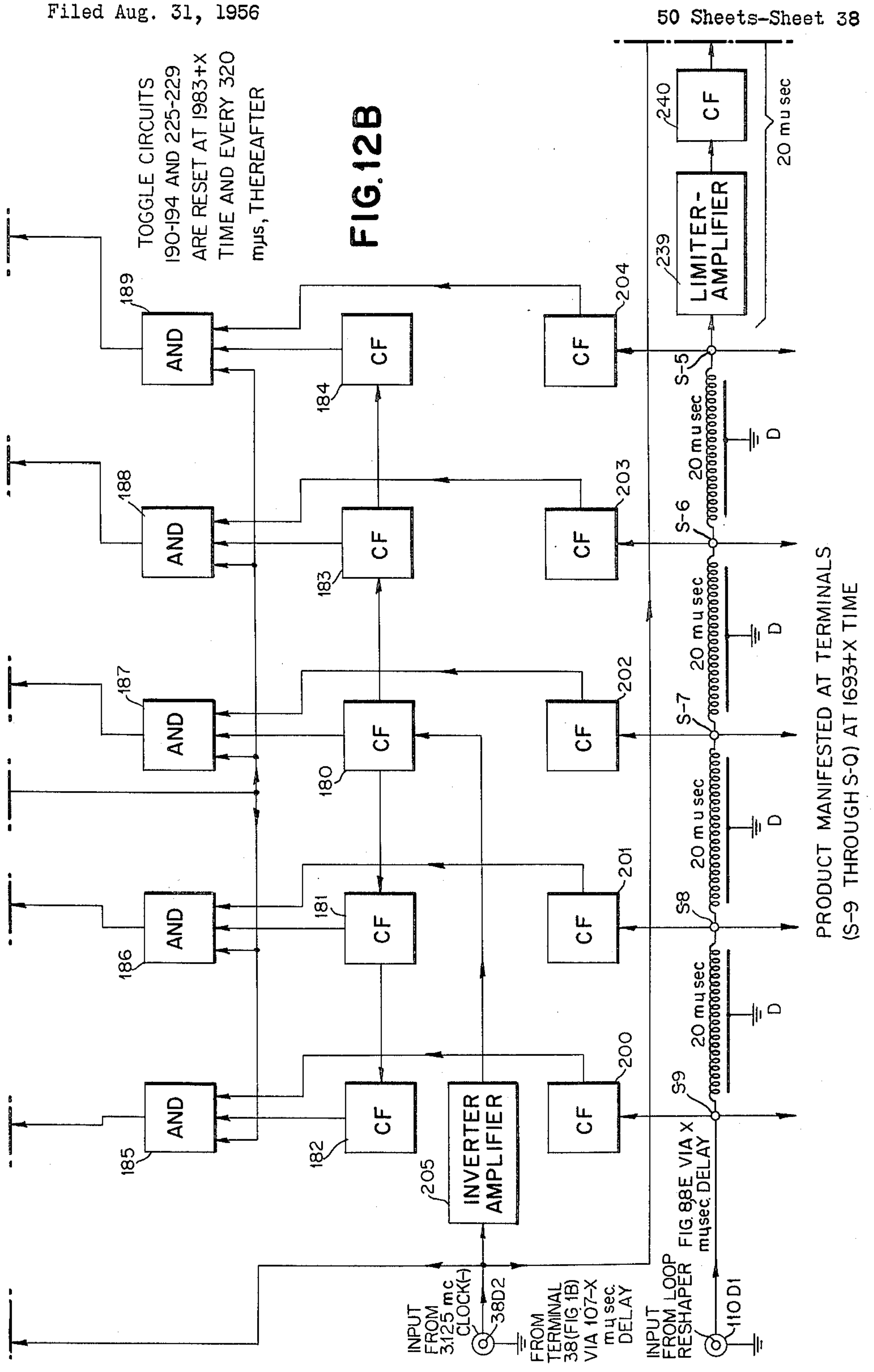
FIG. 12E shows idealized waveforms illustrating the operation of the indicator register of FIG. 12.
FIG. 12J shows the arrangement of FIGS. 12F, 12G, 12H and 12I to form a circuit diagram for the portion of the indicator register shown in FIGS. 12A and 12B.
FIG. 12P shows the arrangement of FIGS. 12K, 12G, 12H and 12I to form a circuit diagram of the portion of the indicator register shown in FIGS. 12C and 12D.
FIG. 12Q shows the arrangement of FIGS. 12J and 12P to form a circuit diagram of the indicator register shown in FIG. 12.
Figure 12C:
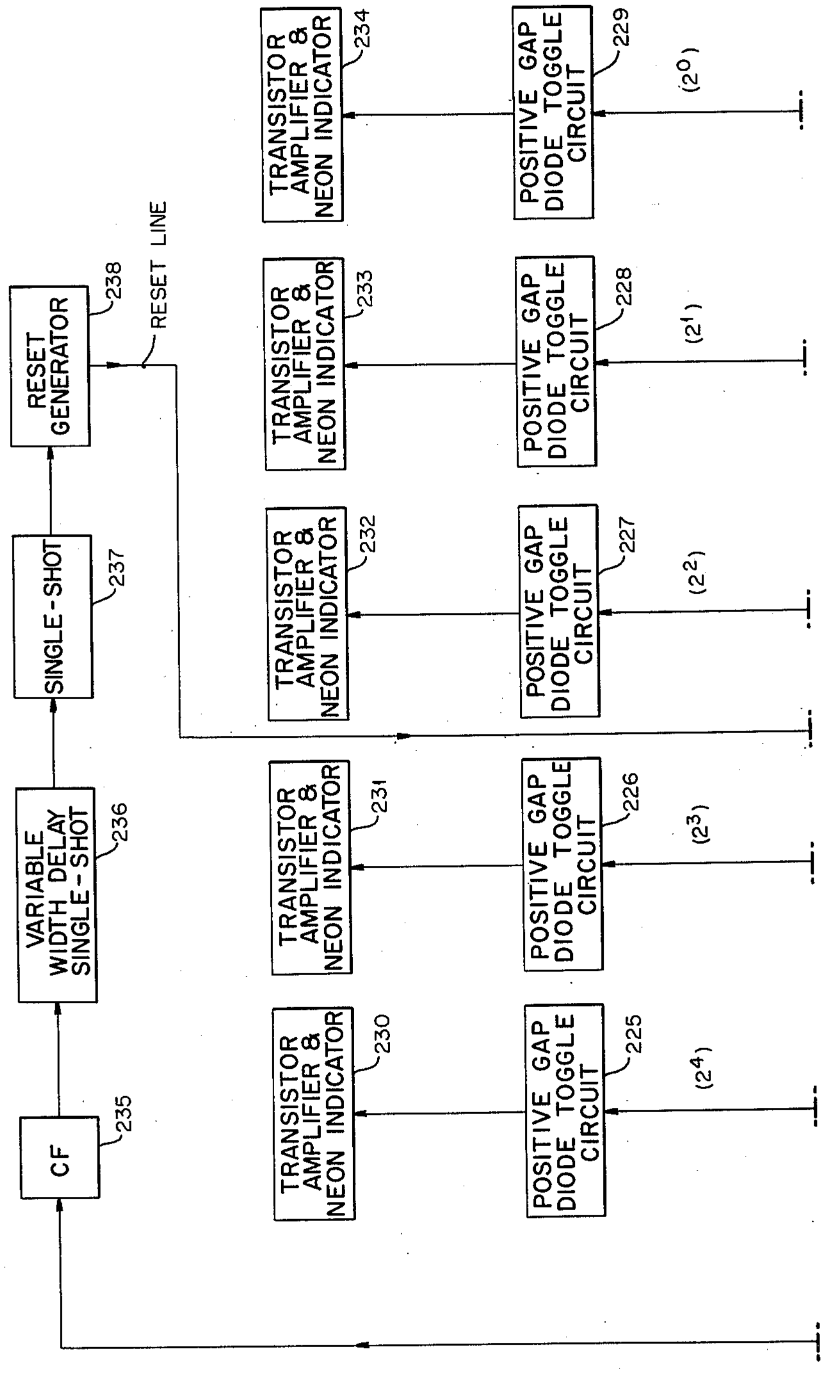
Figure 12D:
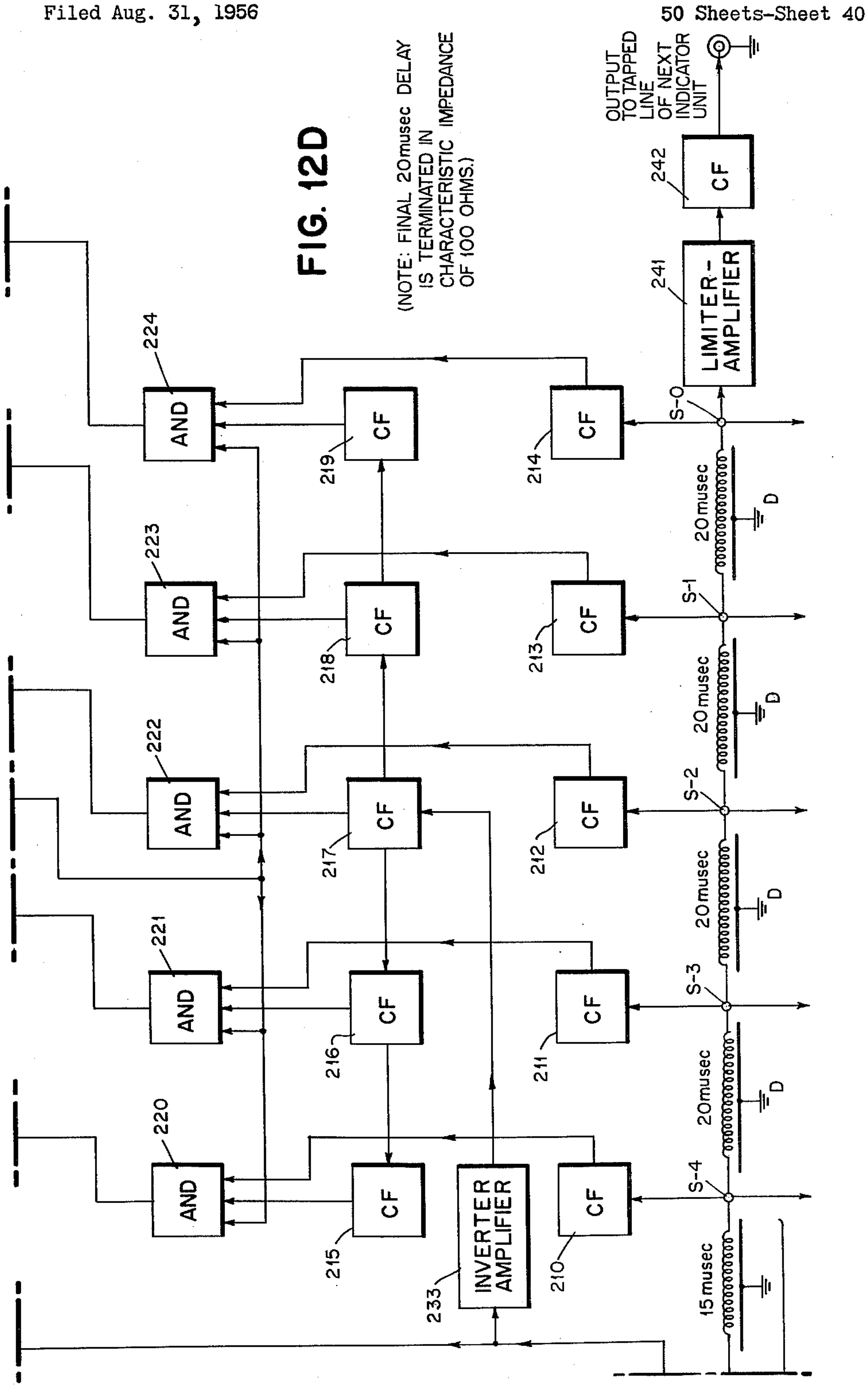
Figure 12E:
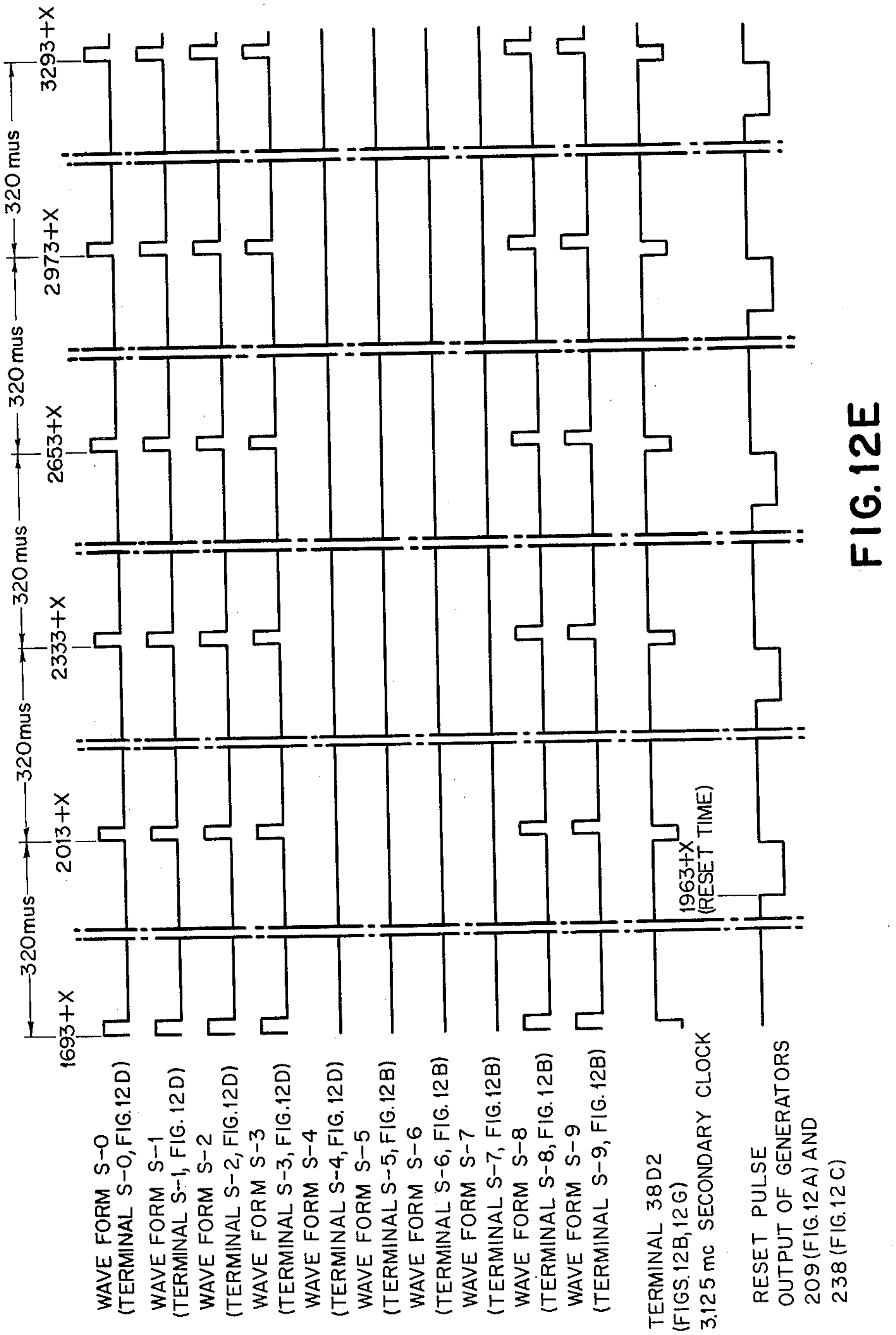
Figure 12F:
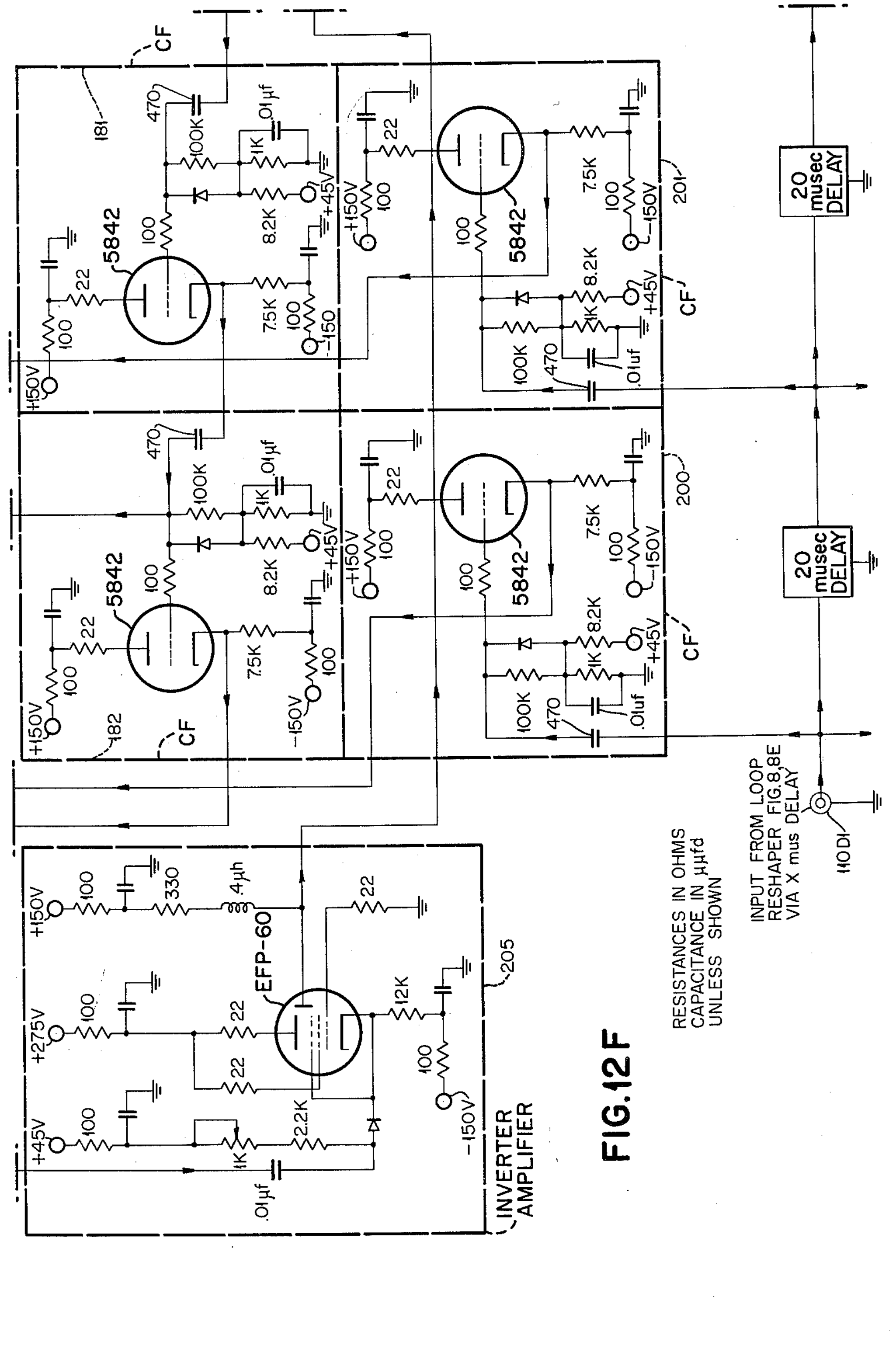
Figure 12G:
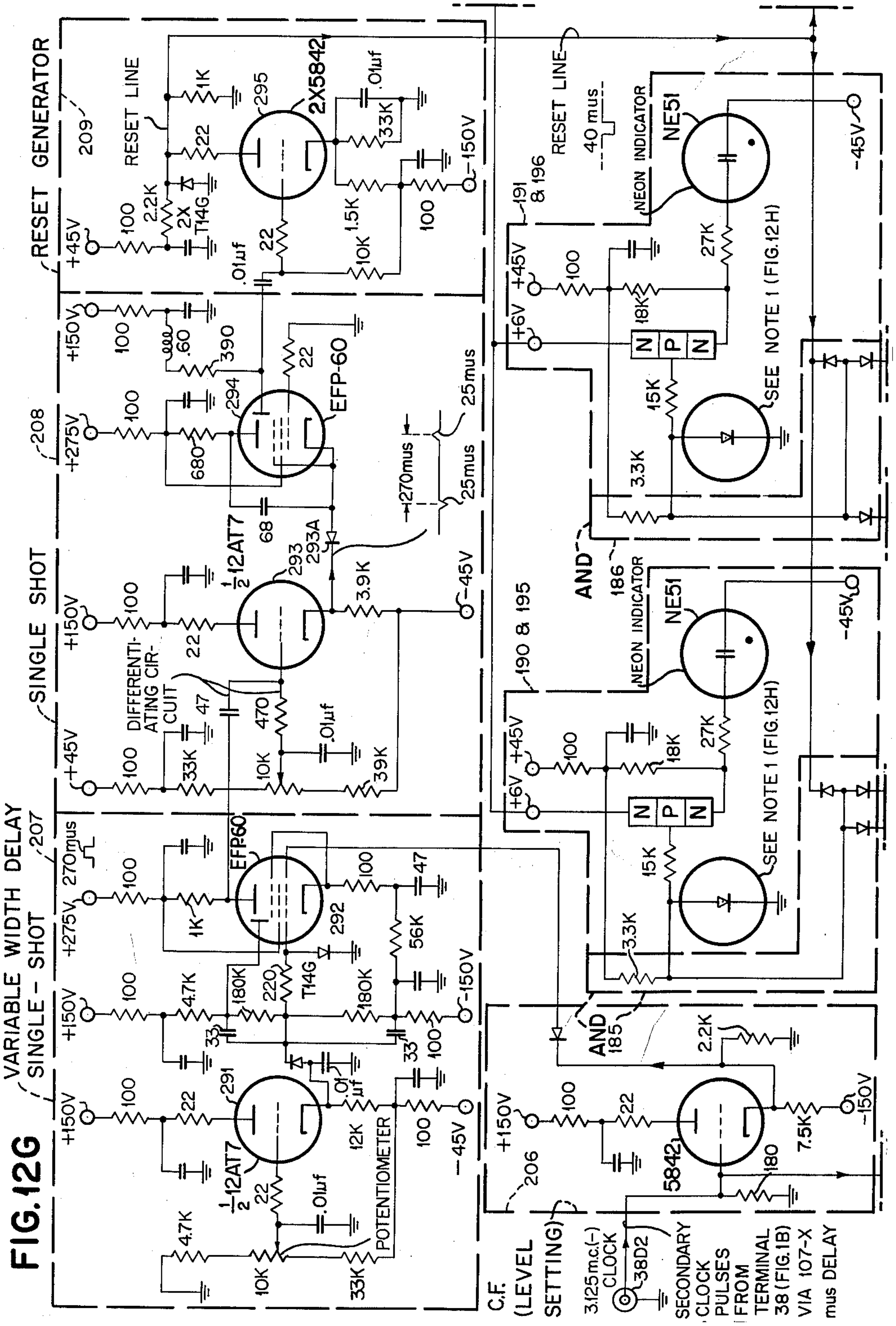
Figures 12H, 12J, 12P, 12Q:
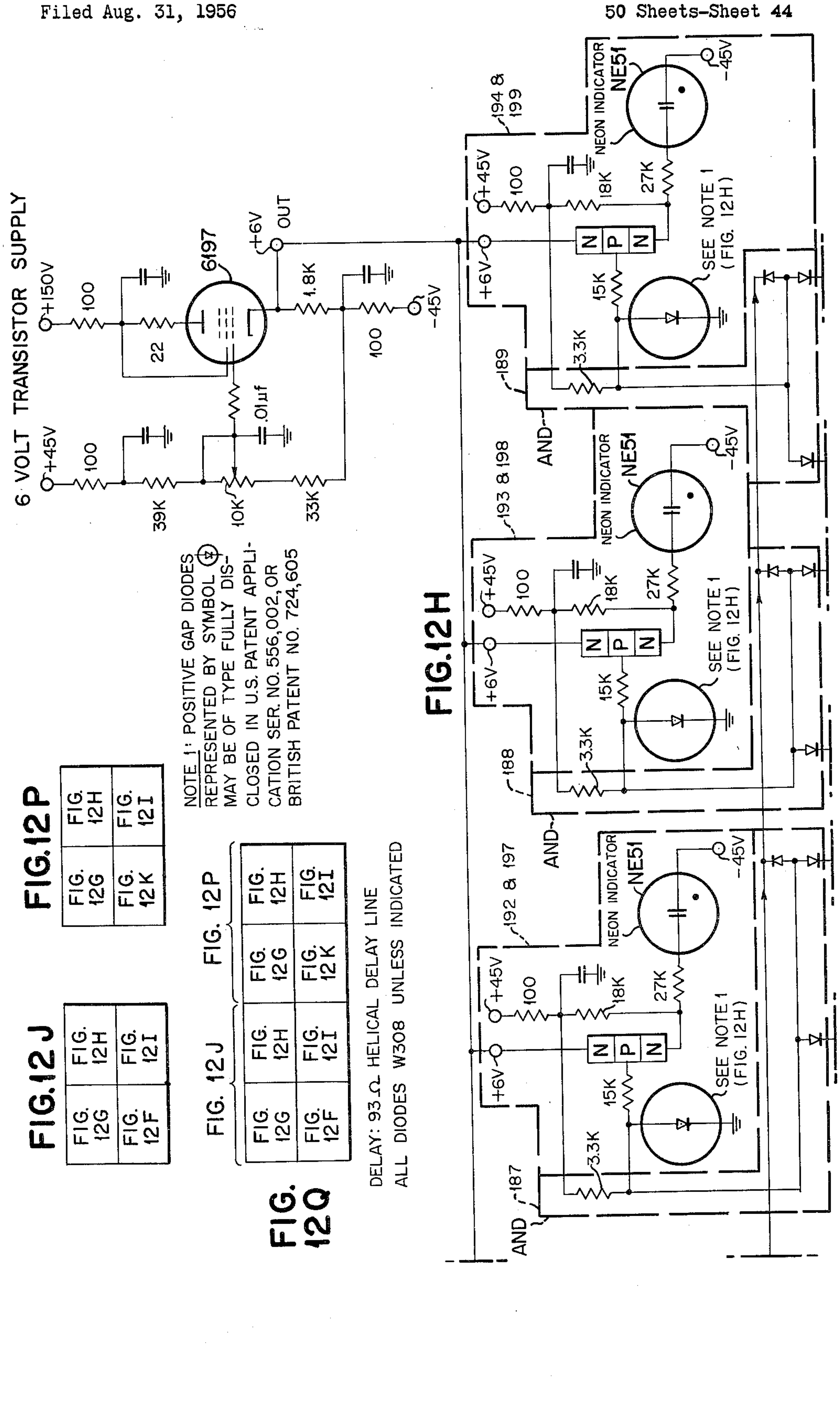
Figure 12I:
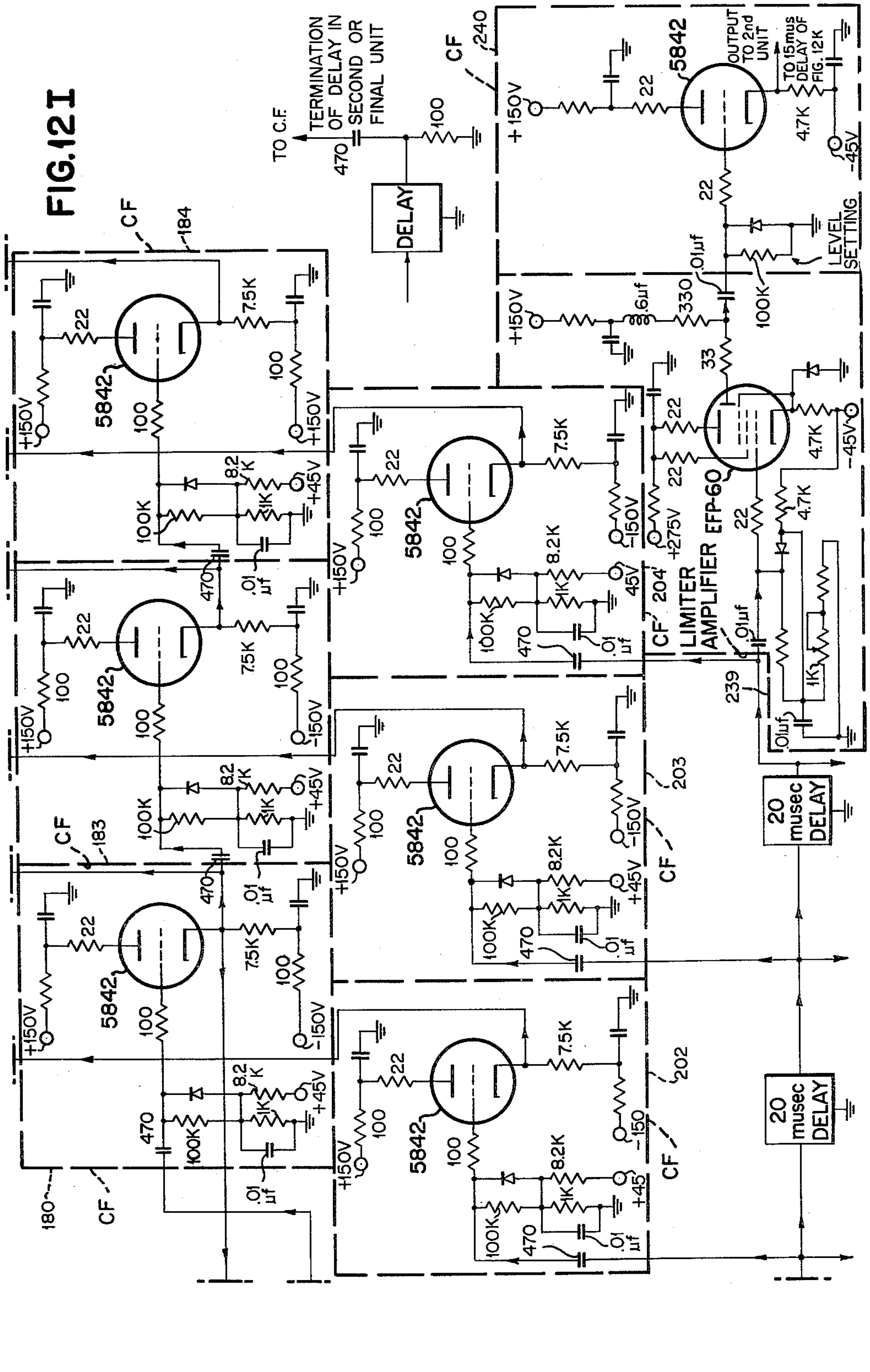
Figure 12K:
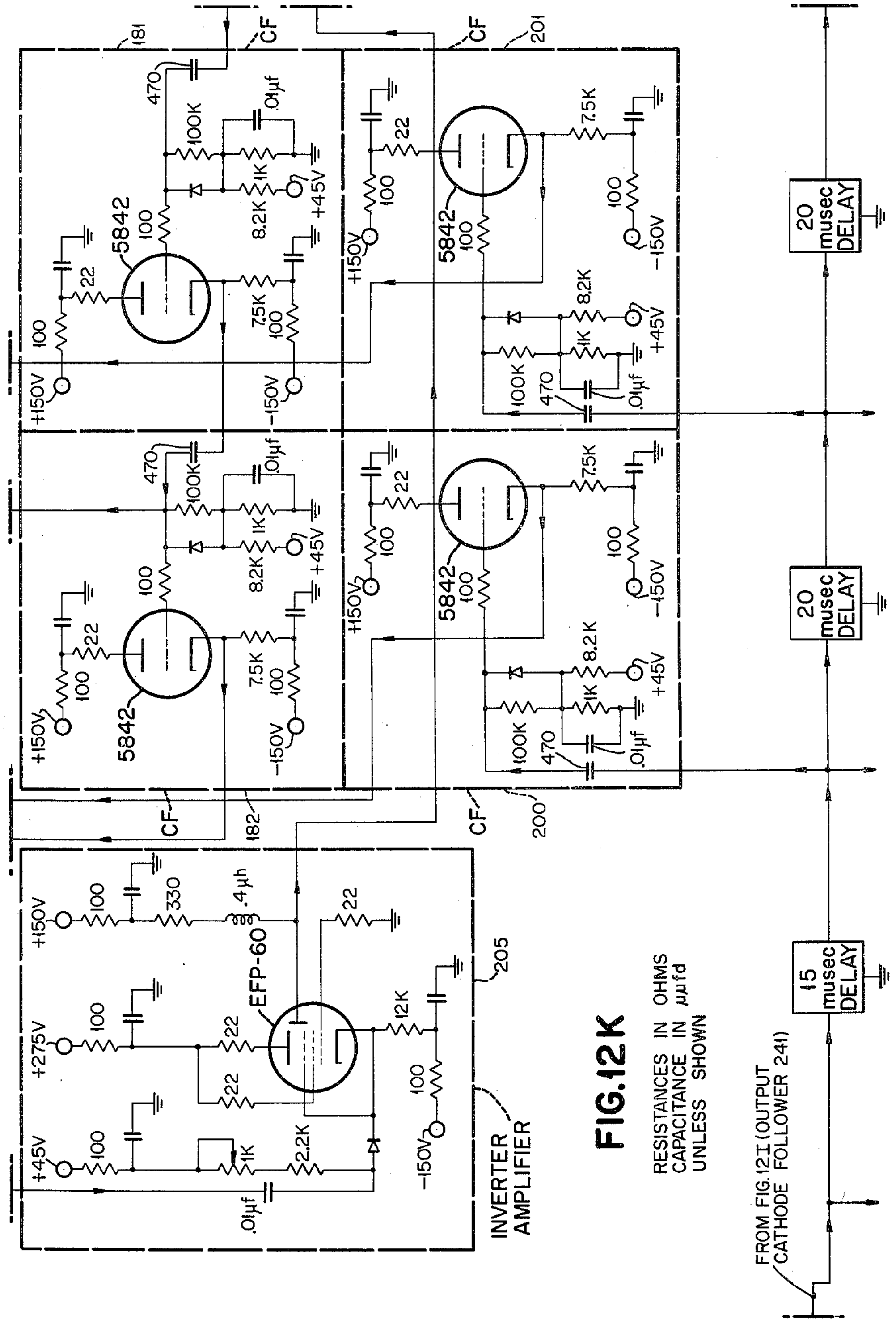

The circuitry shown in FIGS. 12F, 12G, 12H and 12I, arranged as shown in FIG. 12J, corresponds to the block diagram of FIGS. 12A and 12B. The circuitry of FIGS. 12K, 12G, 12H and 12I arranged as shown in FIG. 12P corresponds to the block diagram of FIGS. 12C and 12D. Hence, the combining of the circuitry of FIGS. 12J, and 12P, as shown in FIG. 12Q, corresponds to the block diagram of FIG. 12.

The overall operation of the indicator register (FIG. 12) having ten binary positions is discussed in conjunction with the timing and waveforms shown in FIG. 12E and the example wherein a product of 1111000011 is obtained. Referring to the previous section entitled "Dynamic Storage Loop" and to FIG. 7H, it will be seen that the input at terminal 110D (FIGS. 8, 8E) during the sixth loop period is the product, 1111000011, expressed as a serial pulse train. Referring to FIG. 1, it will be seen that this serial pulse train, appearing at terminal 110D (FIG. 1B), will also appear at terminal 110 (FIG. 1B) 261 millimicroseconds earlier than it appears at terminal 110D. Thus, it will be appreciated that this serial pulse train is applied as an input to terminal 110D1 (FIGS. 12B and 12F) of the indicator register.

The summation of the partial products is completed prior to the sixth loop period (FIG. 7H) and the product, in the absence of a clear signal applied to terminal 127 of the loop reshaper and retimer of the dynamic storage loop, will continue to circulate within the dynamic storage loop. Further, the serial pulse train representing the product in binary notation will, during each loop period, be applied in serial order to terminal 110D1 of FIG. 12B. This serial pulse train applied to terminal 110D will be converted 200 millimicroseconds (20 millimicrosecond timing between binary orders) thereafter (i.e., subsequent to the application of the pulse corresponding to the lowest binary order) by the serially connected delay circuits of FIGS. 12B and 12D into a parallel manifestation of the product expressed in binary notation.

Now referring to FIG. 12E, it will be appreciated that waveforms S–0 through S–9 will respectively appear at terminals S–0 through S–9 of FIGS. 12D and 12B. Referring to FIGS. 12B, 12D and 12E, the binary value of the product is such that at time 1693+X millimicroseconds terminals S–0, S–1, S–2, S–3, S–8 and S–9 will be in the UP condition. From FIGS. 12B and 12D, it will be seen that when terminals S–0, S–1, S–2, S–3, S–8 and S–9 are UP at 1693+X time the right-hand input of AND circuits 185, 186, 221, 222, 223 and 224 are UP. At 1693+X time the left-hand input of these AND circuits are UP and will remain UP until such time as a negative reset pulse is emitted by reset generators 209 and 237, respectively.

Now referring to FIG. 12E, it will be seen that a secondary clock pulse is applied at terminal 38D2 (FIG. 12B) at approximately 1688+X time. This secondary clock pulse, subject to a 5 millimicrosecond time delay by inverter amplifier 205 (FIG. 12B) is applied via cathode followers 180, 181 and 182 (FIG. 12B) to the center input of AND circuits 185 and 186, respectively (FIG. 12B). This same secondary clock pulse is also applied, subject to a 5 millimicrosecond delay by inverter amplifier 233 (FIG. 12D), via cathode followers 217, 216, 218 and 219 (FIG. 12D) to the center input of AND circuits 221, 222, 223 and 224, respectively (FIG. 12D). Thus at 1693+X time, the inputs of AND circuits 185, 186, 221, 222, 223 and 224 (FIGS. 12B and 12D) are all in the UP condition and said AND circuits will respectively provide a positive output pulse. These positive pulses are effective in causing the bistable circuits labeled "Positive Gap Diode Toggle Circuit" and designated as 190, 191, 226, 227, 228 and 229 (FIGS. 12A and 12C) to respectively assume a first predetermined one of their two stable states. Each positive gap diode toggle circuit has associated with it a transistor amplifier and neon indicator (also see FIGS. 12G and 12H). When a particular positive gap diode toggle circuit is in this predetermined one of its two stable conditions, the amplifier and neon indicator associated with said toggle circuit will be energized and the visible neon light will indicate that a binary 1 is stored therein. Thus it will be apparent that under the afore-recited conditions, the neon lights associated with transistor amplifier and neon indicators 195, 196, 231, 232, 233 and 234 (FIGS. 12A and 12B) will be energized.

Now referring to the timing waveforms of FIG. 12E, it will be seen that at time 1963+X millimicroseconds, reset generators 209 (FIG. 12A) and 238 (FIG. 12C) will emit negative reset pulses of approximately 40 millimicrosecond duration. These negative reset pulses are effective in bringing the output of AND circuits 185 through 189 and 220 through 224 (FIGS. 12B and 12D) to the lowest of its three possible output voltage levels. The voltage output of said AND circuits at this lowest level is effective in assuring that positive gap diode toggle circuits 190 through 194 (FIG. 12A) and positive gap diode toggle circuits 225 through 229 (FIG. 12C) are respectively in the second predetermined one of their respective two stable states. It is to be appreciated from the circuitry of FIGS. 12F, 12G, 12H and 12I that the outputs of AND circuits 185 through 189 and 220 through 224 will respectively be at a first most positive potential during positive coincidence at the inputs thereof; will respectively be at a second intermediate potential in the absence of coincidence at the inputs thereof and the absence of a negative reset pulse; and will respectively be at a third or lowest potential for the duration of a negative reset pulse. Thus it will be appreciated that immediately following the reset pulse occurring at time 1963+X millimicroseconds (FIG. 12E) all of the positive gap diode toggle circuits of FIG. 12 will be in their respective second predetermined position and their associated neon lights will tend to be de-energized.

However, it will be appreciated that in the absence of a clear signal being applied to terminal 127 of the loop reshaper and retimer (FIGS. 8 and 8E) the above recited sequence of events will continue to occur during each succeeding 320 millimicrosecond period. Referring to FIG. 12E, it will be seen that these 320 millimicrosecond periods (the first of which occurred between times 1693+X and 2013+X) will continue to occur. In other words, in the absence of a clear signal, the neon indicators associated with transistor amplifier and neon indicator circuits 195, 196, 231, 232, 233 and 234 (FIGS. 12A and 12C) will be successively energized and tend to be de-energized at the occurrence of each output pulse from reset generators 209 (FIG. 12A) and 238 (FIG. 12C). It will be appreciated, however, that due to the speed of operation the tendency of the afore-cited neon indicators to be energized and de-energized will not be apparent to an observer. That is in the absence of a clear signal the afore-cited neon indicators will appear to be fully illuminated and thereby visually manifest the binary product, 1111000011.

From the foregoing discussion, it will be apparent how the indicator register of FIG. 12 functions to visually manifest the binary quantity circulating in the dynamic storage loop. Further, it will be appreciated that, although the register of FIG. 12 provides for up to ten binary orders, this register could be extended, with a loop period of 320 millimicroseconds, to accommodate a binary product having 16 or less binary orders.

*Generation of reset pulse (FIG. 12E)*

The 40 millimicrosecond reset pulse occurs every 320 millimicroseconds as shown in FIG. 12E. Referring to FIGS. 12E, 12B and 12G, negative secondary clock pulses having a repetition rate of 3.125 megacycles are applied via terminal 38D2 to the input of cathode follower 206. The negative output pulses of 10 millimicrosecond duration and occurring every 320 millimicroseconds at the output of cathode follower 206 are applied to the control grid of the secondary emission pentode 292 (variable width delay single shot 207, FIGS. 12A and 12G). The secondary emission pentode 292 (FIG. 12G) has associated with it a level setting cathode follower circuit including triode 291 (FIG. 12G) and a potentiometer in the grid circuit of said triode. The tap on the potentiometer in the grid circuit of triode 291 is adjusted so as to cause the secondary emission pentode 292 to render a positive output pulse, at its plate, of approximately 270 millimicroseconds in time duration in response to each negative 10 millimicrosecond pulse applied to the control grid of said secondary emission pentode. The 270 millimicrosecond positive pulse from the plate of the secondary emission pentode 292 (FIG. 12G) is differentiated by the 47 micro micro farad condenser (FIG. 12G) and the 470 ohm resistor (FIG. 12G) in the grid circuit of the cathode follower that includes triode 293 (FIG. 12G). This differentiating circuit provides a positive pulse of approximately 25 millimicrosecond time duration at the grid of triode 293 in response to the leading edge of the 270 millimicrosecond positive pulse from the plate of secondary emission pentode 292. Further, the differentiating circuit provides a 25 millimicrosecond negative pulse at the grid of triode 293 in response to the trailing edge of the 270 millimicrosecond positive pulse from secondary emission pentode 292. The application of this 25 millimicrosecond negative pulse to the grid of triode 293 results in a negative pulse from the cathode of triode 293 and this pulse is applied via a reversed biased diode 293A (FIG. 12G) to the cathode of secondary emission pentode 294 (FIG. 12G). Since the control grid of the secondary emission pentode 294 is grounded, the negative pulse applied to the cathode thereof results in a positive pulse at the dynode of pentode 294 (FIG. 12G), which in turn, is coupled through a capacitor and resistance network (FIG. 12G) to the control grid of triode 295 (FIG. 12G). The positive pulse applied to the control grid of triode 295 is of approximately 40 millimicrosecond duration and results in a negative reset pulse of approximately 40 millimicrosecond duration being applied to the reset line which is connected at the juncture of two serially connected resistors in the plate circuit of triode 295.

*Example*

Figures 13, 13A:
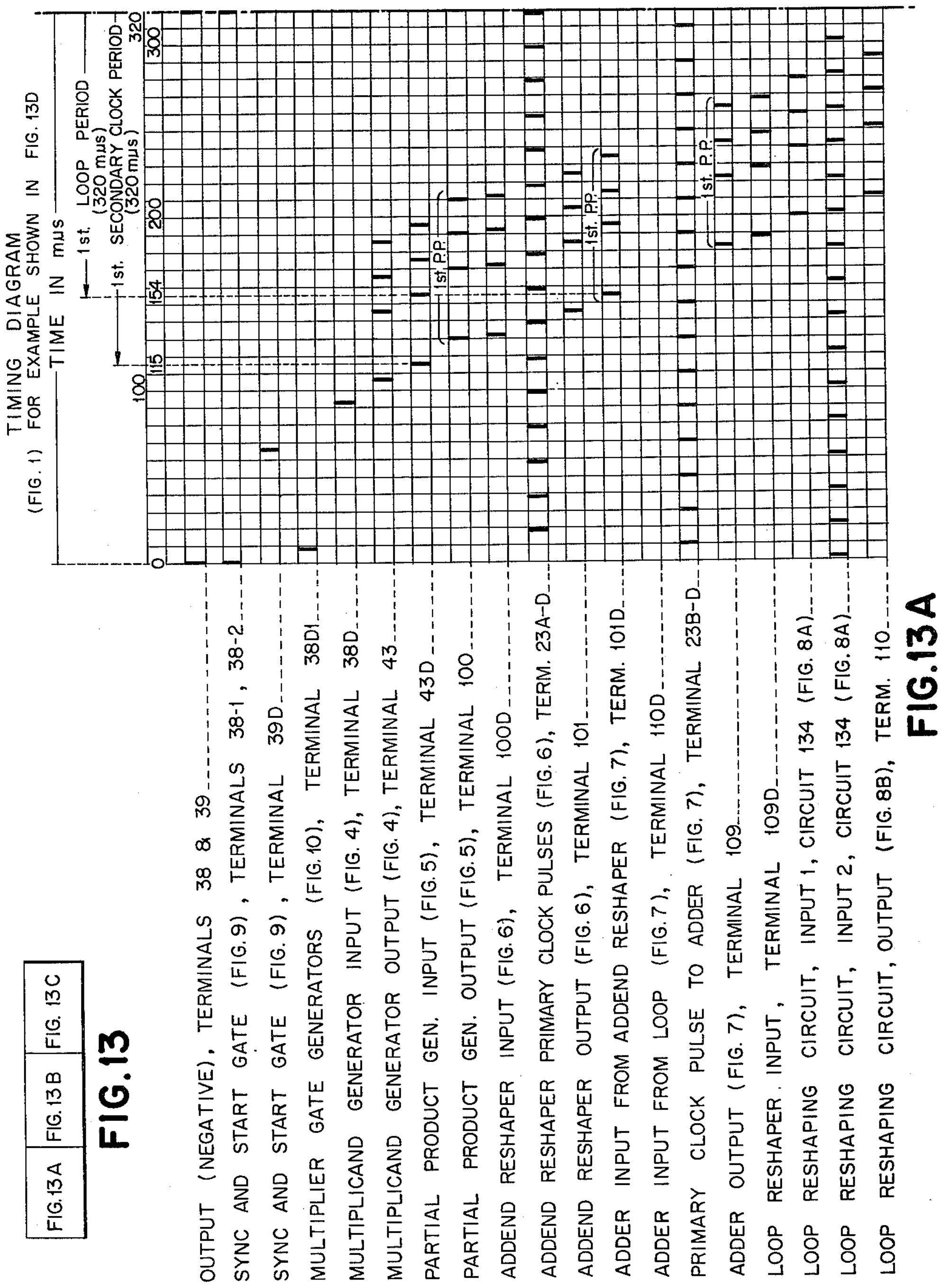
FIG. 13 is a timing chart showing the arrangement of FIGS. 13A, 13B and 13C to form a timing diagram illustrating the operation of the system shown in FIG. 1 when a particular multiplication problem is solved.
Figure 13B:
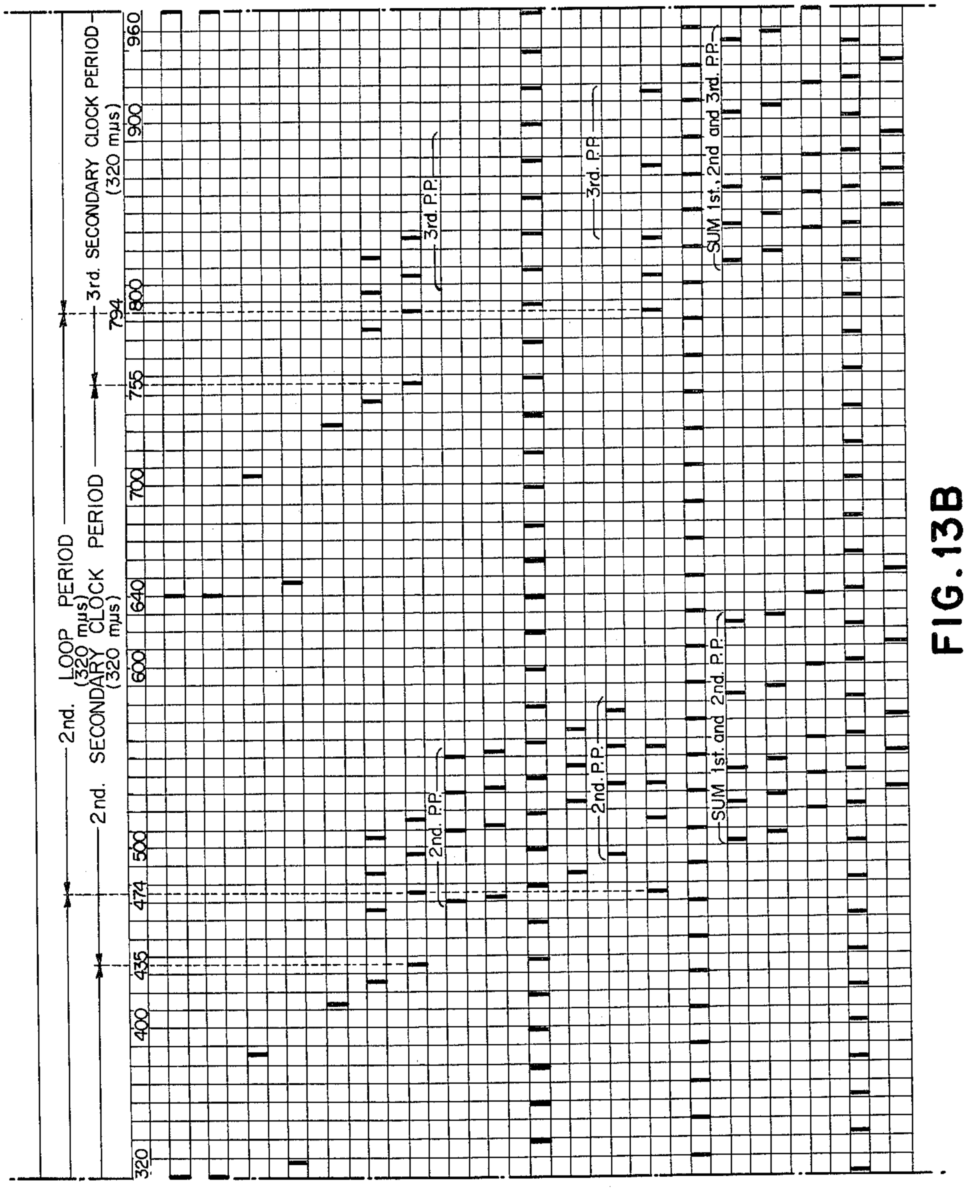
FIG. 13D is a chart illustrating the relation between the long-hand solution of the example of FIG. 13 and the operation of the system of FIG. 1 to effect its solution.
Figure 13C:
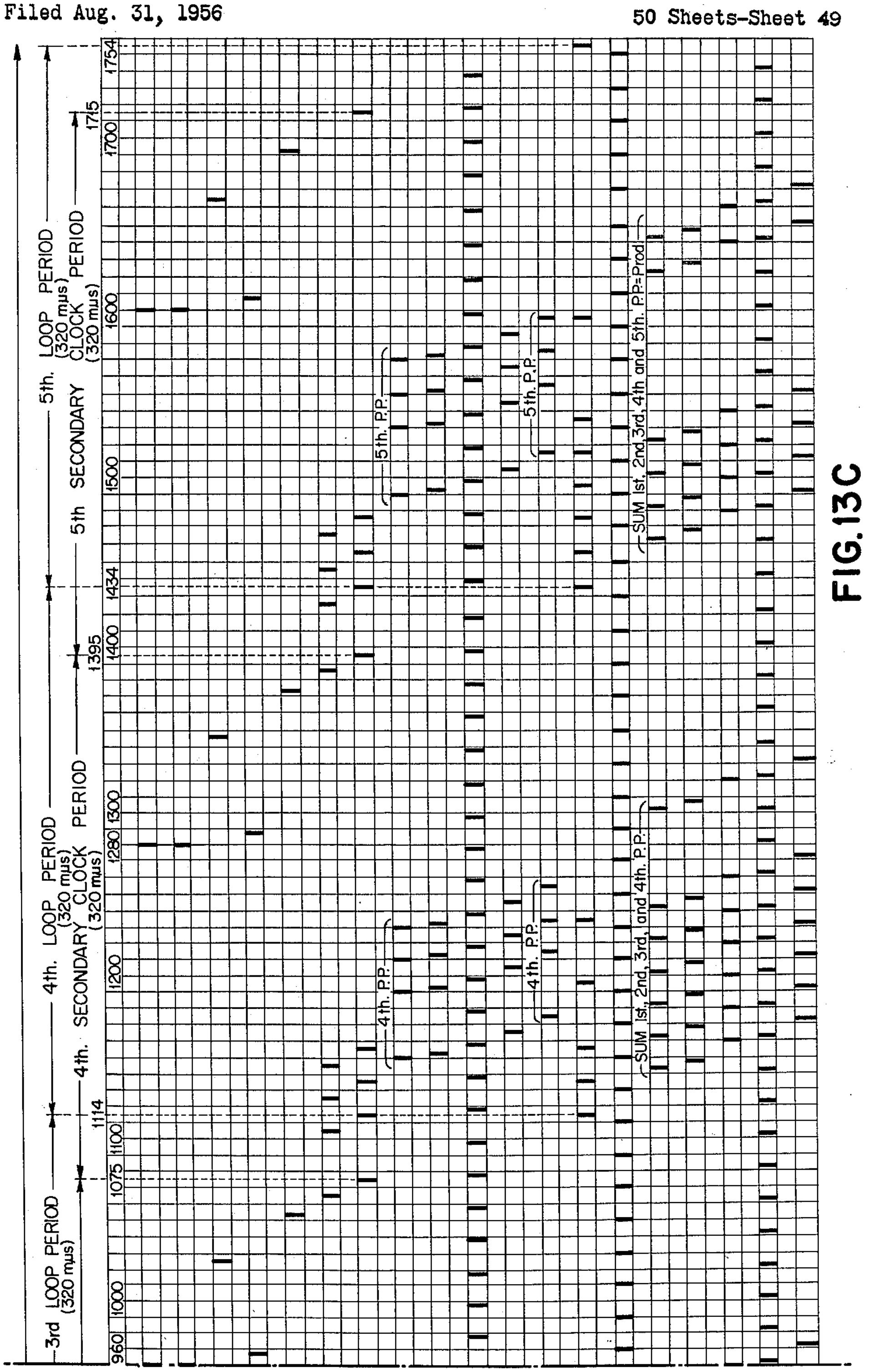

The operation of the arithmetic unit of FIG. 1 is illustrated by the timing diagram of FIG. 13 where the multiplicand 10111 is multiplied by the multiplier 11011 to provide the product 1111000011 (FIG. 13C). The actual arithmetic process performed by the multiplier system of the invention is illustrated in FIG. 13D.

In order to facilitate an understanding of the timing chart (FIG. 13), a loop period is defined as the time required for a pulse initially at either of the input terminals 101D or 110D of the adder (FIG. 1B) to traverse the dynamic storage loop and arrive at the terminal 110D of the adder. Each such loop period consumes 320 millimicroseconds. The start of the first loop period is initiated by the arrival of the lowest order digit of the first partial product at the terminal 101D of the adder at 154 time (FIG. 13A). The fifth loop period ends when the lowest order or 2° digit of the product arrives for the fifth time at terminal 110D of the adder or 1754 time (FIG. 13C). Five secondary clock periods each of 320 millimicroseconds are required to provide the product. The first such secondary clock period starts at 115 time (FIGS. 13A, 5D) and the fifth secondary clock period ends at 1715 time (FIGS. 13C, 5D). The charts of FIGS. 5D, 7H and 13E illustrate the operation of the partial product generator, dynamic storage loop and indicator register, respectively, when the arithmetic units formulate this product. The timing chart of FIG. 13 correlates the showings of FIGS. 5D, 7H, 12E and 13D and indicates the flow of information pulses through the units of FIG. 1, in performing the example, obtain the product as indicated in FIG. 13D, the primary and secondary clock pulses applied thereto, and the relation of these pulses to the loop periods and secondary clock periods.

While there have been shown and described and pointed out the fundamental novel features of the invention as applied to a preferred embodiment, it will be understood that various omissions and substitutions and changes in the form and details of the device illustrated and in its operation may be made by those skilled in the art, without departing from the spirit of the invention. It is the intention, therefore, to be limited only as indicated by the scope of the following claims.

What is claimed is:

1. In a calculator, operable at a pulse repetition rate of 50 megacycles, means for obtaining the product of a first number and a second number by adding successively obtained partial products including; first circuit means connected to receive variable phase clock pulses at a pulse repetition rate of 3.125 megacycles and provide therefrom serial pulses, ten millimicroseconds in duration, at a pulse repetition rate of 50 megacycles, representative of said first number, said first circuit means including multiplicand generator means, said multiplicand generator means consisting of an input terminal for receiving said variable phase clock pulses at a pulse repetiton rate of 3.125 megacycles, a first order binary gate including an input and an output and employing a settable bistable device and a high transconductance triode, a direct connection between the input of said multiplicand generator means and said input of said first order binary gate, a second order binary gate identical to said first order binary gate, a first twenty millimicrosecond delay connected between said input of said multiplicand generator means and said input of said second order binary gate, a third order binary gate identical to said first order binary gate, a second twenty millimicrosecond delay connected between said input of said second order binary gate and said input of said third order binary gate, a fourth order binary gate identical to said first order binary gate, a third twenty millimicrosecond delay connected between said input of said third order binary gate and said input of said fourth order binary gate, a fifth order binary gate identical to said first order binary gate, a fourth twenty millimicrosecond delay connected between said input of said fourth order binary gate and said input of said fifth order binary gate, a resistor connected between said input of said fifth order binary gate and ground, an OR circuit having an output terminal and first through fifth input terminals respectively connected to said outputs of said first through fifth binary order gates, a grounded-grid amplifier having an input connected to said output of said OR circuit and employing a secondary emission tube of the EFP 60 type, said grounded-grid amplifier having an output connected to the dynode of said secondary emission tube; grid controlled circuit means connected to said output of said grounded-grid amplifier for receiving each of said serial ten millimicrosecond pulses and including electrical conductive means connected to undergo a change in electrical condition to thereby limit the amplitude of each of said serial ten millimicrosecond pulses; second circuit means, synchronized with said first circuit means, for successively providing an electrical representation of the digit of each order of said second number at a pulse repetition rate of 3.125 megacycles, said second circuit means including multiplier gate generator means, said multiplier gate generator means consisting of first, second, third, fourth and fifth binary order delay circuit means, said first, second, third, fourth and fifth delay circuit means being respectively serially interconnected, first, second, third, fourth and fifth settable bistable devices respectively responsive to said first, second, third, fourth and fifth binary order delay circuit means, sync and clamp generator means coupled to said first, second, third, fourth and fifth delay circuit means and connected to receive variable phase clock pulses at a pulse repetition rate of 3.125 megacycles, said first, second, third, fourth and fifth delay circuit means each comprising a triode having an anode, a grid and a cathode, a first resistor, an inductance, and a second resistor serially connected in the order recited between a source of positive potential and said anode of said triode, a first capacitor connected between ground and the juncture of said first resistor and said inductance, a second capacitor and a third resistor connected between said anode and said cathode of said triode; nine millimicrosecond delay means receiving the serial ten millimicrosecond pulses from said grid controlled circuit means; and coincident circuit means for receiving each electrical representation of said second number and the output of said delay means to successively provide said partial products, in the form of serial pulses, ten millimicroseconds in duration, and at a pulse repetition rate of 50 megacycles, said coincident circuit means including partial product generator means, said partial product generator means consisting of an input terminal for receiving said serial ten millimicrosecond pulses from said nine millimicrosecond delay means and an output terminal for providing said succession of partial products, a limiter amplifier, a first cathode follower, a fifth twenty millimicrosecond delay, a sixth twenty millimicrosecond delay, a seventh twenty millimicrosecond delay, an eighth twenty millimicrosecond delay and a resistor serially connected in the order recited between said input terminal of said partial product generator means and ground; an OR circuit having first, second, third, fourth and fifth input terminals and an output terminal, first, second, third, fourth and fifth AND circuits, each of said AND circuits having first and second inputs and an output, said first, second, third, fourth and fifth AND circuits having their second inputs respectively connected to said first, second, third, fourth and fifth settable bistable devices of said multiplier gate generator means, a second cathode follower coupling said first input of said first AND circuit to said first cathode follower, a third cathode follower coupling said first input of said second AND circuit to the juncture of said fifth and sixth twenty millimicrosecond delays, a fourth cathode follower coupling said first input of said third AND circuit to the juncture of said sixth and seventh twenty millimicrosecond delays, a fifth cathode follower coupling said first input of said fourth AND circuit to the juncture of said seventh and eighth twenty millimicrosecond delays, a sixth cathode follower coupling said first input of said fifth AND circuit to the juncture of said eighth twenty millimicrosecond delay and said resistor, sixth, seventh, eighth, ninth, tenth and eleventh cathode followers respectively coupling said output of said first, second, third, fourth and fifth AND circuits to said first, second, third, fourth and fifth inputs of said OR circuit, a limiter amplifiers and a twelfth cathode follower serially interconnected between the output of said OR circuit and the output of said partial product generator means.

2. In a calculator operable at a pulse repetition rate of 50 megacycles, means for obtaining the product of a first number and a second number by adding successively obtained partial products including; first circuit means connected to receive variable phase clock pulses at a pulse repetition rate of 3.125 megacycles and provide therefrom serial pulses, ten millimicroseconds in duration, at a pulse repetition rate of 50 megacycles, representative of said first number, said first circuit means including multiplicand generator means, said multiplicand generator means consisting of an input terminal for receiving said variable phase clock pulses at a pulse repetition rate of 3.125 megacycles, a first order binary gate including an input and an output and employing a settable bistable device, a direct connection between the input of said multiplicand generator means and said input of said first order binary gate, a second order binary gate identical to said first order binary gate, a first twenty millimicrosecond delay connected between said input of said multiplicand generator means and said input of said second order binary gate, a third order binary gate identical to said first order binary gate, a second twenty millimicrosecond delay connected between said input of said second order binary gate and said input of said third order binary gate, a fourth order binary gate identical to said first order binary gate, a third twenty millimicrosecond delay connected between said input of said third order binary gate and said input of said fourth order binary gate, a fifth order binary gate identical to said first order binary gate, a fourth twenty millimicrosecond delay connected between said input of said fourth order binary gate and said input of said fifth order binary gate, a resistor connected between said input of said fifth order binary gate and ground, an OR circuit having an output terminal and first through fifth input terminals respectively connected to said outputs of said first through fifth binary order gates, a grounded-grid amplifier having an input connected to said output of said OR circuit and employing a secondary emission tube of the EFP 60 type, said grounded-grid amplifier having an output connected to the dynode of said secondary emission tube; grid controlled circuit means connected to said output of said grounded-grid amplifier for receiving each of said serial ten millimicrosecond pulses and including an electronic circuit having a multi-grid secondary emission tube connected to receive an input at one grid thereof, a resistor connected in the cathode circuit of said tube, a diode commonly connecting the cathode and another grid of said tube to ground and normally conductive, said diode having its anode connected to ground, and means applying a pulse effective to render said diode non-conductive to cause said resistor to provide degeneration to thereby provide in response to receipt of each of said serial ten millimicrosecond pulses a sharply defined limited amplitude ten millicrosecond pulse at the dynode of said tube; second circuit means, synchronized with said first circuit means, for providing, in succession, an electrical representation of the digit of each order of said second number at a pulse repetition rate of 3.125 megacycles; said second circuit means including multiplier gate generator means, said multiplier gate generator means consisting of first, second, third, fourth and fifth binary order delay circuit means, said first, second, third, fourth and fifth delay circuit means being respectively serially interconnected, first, second, third, fourth and fifth settable bistable devices respectively responsive to said first, second, third, fourth and fifth binary order delay circuit means, sync and clamp generator means coupled to said first, second, third, fourth and fifth delay circuit means and connected to receive variable phase clock pulses at a pulse repetition rate of 3.125 megacycles, said first, second, third, fourth and fifth delay circuit means each comprising a triode having an anode, a grid and a cathode, a first resistor, an inductance, and a second resistor serially connected in the order recited between a source of positive potential and said anode of said triode, a first capacitor connected between ground and the juncture of said first resistor and said inductance, a second capacitor and a third resistor connected between said anode and said cathode of said triode; nine millimicrosecond delay means receiving the serial ten millimicrosecond pulses from said grid controlled circuit means; and coincident circuit means for receiving each electrical representation of said second number and the output of said delay means to successively provide said partial products, respectively in the form of a serial pulse train of ten millimicrosecond pulses at a pulse repetition rate of 50 megacycles, said coincident circuit means including partial product generator means, said partial product generator means consisting of an input terminal for receiving said serial ten millimicrosecond pulses from said nine millimicrosecond delay means and an output terminal for providing said succession of partial products, a limiter amplifier, a first cathode follower, a fifth twenty millimicrosecond delay, a sixth twenty millimicrosecond delay, a seventh twenty millimicrosecond delay, an eighth twenty millimicrosecond delay and a resistor serially connected in the order recited between said input terminal of said partial product generator means and ground; an OR circuit having first, second, third, fourth and fifth input terminals and an output terminal, first, second, third, fourth and fifth AND circuits, each of said AND circuits having first and second inputs and an output, said first, second, third, fourth and fifth AND circuits having their second inputs respectively connected to said first, second, third, fourth and fifth settable bistable devices of said multiplier gate generator means, a second cathode follower coupling said first input of said first AND circuit to said first cathode follower, a third cathode follower coupling said first input of said second AND circuit to the juncture of said fifth and sixth twenty millimicrosecond delays, a fourth cathode follower coupling said first input of said third AND circuit to the juncture of said sixth and seventh twenty millimicrosecond delays, a fifth cathode follower coupling said first input of said fourth AND circuit to the juncture of said seventh and eighth twenty millimicrosecond delays, a sixth cathode follower coupling said first input of said fifth AND circuit to the juncture of said eighth twenty millimicrosecond delay and said resistor, sixth, seventh, eighth, ninth, tenth and eleventh cathode followers respectively coupling said outputs of said first, second, third, fourth and fifth AND circuits to said first, second, third, fourth and fifth inputs of said OR circuit, a limiter amplifier and a twelfth cathode follower serially interconnected between the output of said OR circuit and the output of said partial product generator means.

3. An electronic circuit operable at a very high frequency, namely, in the order of 50 megacycles, and having means compensating for variations of input pulse amplitudes to provide output pulses having limited amplitudes including; a multi-grid secondary emission tube connected to receive an input at one grid thereof; a resistor connected in the cathode circuit of said tube; a normally conductive diode having an anode and a cathode, said cathode of said diode being commonly connected to the cathode and another grid of said tube and said anode of said diode being connected to ground; and means applying a pulse effective to render said diode nonconductive to cause said resistor to provide degeneration to thereby cause a limited pulse to appear at the dynode of said tube.

4. A very high speed binary digital multiplication system operating at a pulse repetition rate of 50 megacycles, and employing a single variable phased 50 megacycles clock pulse source wherein multiplication is accomplished in a minimum of elapsed time due to the optimum time occurrence of inter-dependent information and variable phased 50 megacycles clock pulses, said multiplication system including; first means for manifesting a multiplier in the binary notation said first means including multiplier gate generator means, said multiplier gate generator means consisting of first, second, third, fourth, and fifth binary order delay circuit means, said first, second, third, fourth and fifth delay circuit means being respectively serially interconnected, first, second, third, fourth and fifth settable bistable devices respectively responsive to said first, second, third, fourth and fifth binary order delay circuit means, sync and clamp generator means coupled to said first, second, third, fourth and fifth delay circuit means and connected to receive said variable phase clock pulses, said first, second, third, fourth and fifth delay circuit means each comprising a triode having an anode, a grid and a cathode, a first resistor, an inductance, and a second resistor serially connected in the order recited between a source of positive potential and said anode of said triode, a first capacitor connected between ground and the juncture of said first resistor and said inductance, a second capacitor and a third resistor connected between said anode and said cathode of said triode; second means for manifesting a multiplicand in the binary notation said second means including multiplicand generator means, said multiplicand generator means consisting of an input terminal for receiving said variable phase clock pulses, a first order binary gate including an input and an output and employing a settable bistable device, a direct connection between the input of said multiplicand generator means and said input of said first order binary gate, a second order binary gate identical to said first order binary gate, a first twenty millimicrosecond delay connected between said input of said multiplicand generator means and said input of said second order binary gate, a third order binary gate identical to said first order binary gate, a second twenty millimicrosecond delay connected between said input of said second order binary gate and said input of said third order binary gate, a fourth order binary gate identical to said first order binary gate, a third twenty millimicrosecond delay connected between said input of said third order binary gate and said input of said fourth order binary gate, a fifth order binary gate identical to said first order binary gate, a fourth twenty millimicrosecond delay connected between said input of said fourth order binary gate and said input of said fifth order binary gate, a resistor connected between said input of said fifth order binary gate and ground, an OR circuit having an output terminal and first through fifth input terminals respectively connected to said outputs of said first through fifth binary order gates, a grounded-grid amplifier having an input connected to said output of said OR circuit and employing a secondary emission tube of the EFP 60 type, said grounded-grid amplifier having an output connected to the dynode of said secondary emission tube; third means connected to selectively receive the manifestations of the multiplicand and multiplier to provide a series of pulse trains, respectively consisting of pulses ten millimicroseconds in duration and at a pulse repetition rate of 50 megacycles, to be added to provide a serial product pulse train consisting of pulses ten millimicroseconds in duration and at a pulse repetition rate of 50 megacycles, said serial product pulse train being representative of the product of said multiplicand and multiplier, said third means including partial product generator means, said partial product generator means consisting of an input terminal for receiving said serial ten millimicrosecond pulses from said output of said grounded-grid amplifier and an output terminal for providing said succession of partial products, limiter amplifier means, a first cathode follower, a fifth twenty millimicrosecond delay, a sixth twenty millimicrosecond delay, a seventh twenty millimicrosecond delay, an eighth twenty millimicrosecond delay and a resistor serially connected in the order recited between said input terminal of said partial product generator means and ground; an OR circuit having first, second, third, fourth and fifth input terminals and an output terminal, first, second, third, fourth and fifth AND circuits, each of said AND circuits having first and second inputs and an output, said first, second, third, fourth and fifth AND circuits having their second inputs respectively connected to said first, second, third, fourth and fifth settable bistable devices of said multiplier gate generator means, a second cathode follower coupling said first input of said first AND circuit to said first cathode follower, a third cathode follower coupling said first input of said second AND circuit to the juncture of said fifth and sixth twenty millimicrosecond delays, a fourth cathode follower coupling said first input of said third AND circuit to the juncture of said sixth and seventh twenty millimicrosecond delays, a fifth cathode follower coupling said first input of said fourth AND circuit to the juncture of said seventh and eighth twenty millimicrosecond delays, a sixth cathode follower coupling said first input of said fifth AND circuit to the juncture of said eighth twenty millimicrosecond delay and said resistor, sixth, seventh, eighth, ninth, and tenth and eleventh cathode followers respectively coupling said outputs of said first, second, third, fourth and fifth AND circuits to said first, second, third, fourth and fifth inputs of said OR circuit, a limiter amplifier and a twelfth cathode follower serially interconnected between the output of said OR circuit and the output of said partial product generator means; a very frequency reshaper and retimer, operative at a pulse repetition rate of 50 megacycles, and conjointly responsive to the respective pulses of said series of pulse trains and said variable phased 50 megacycle clock pulses to provide in an optimum period of elapsed time a series of reformed pulses, respectively corresponding to the pulses of said series of pulse trains, to be added in a predetermined fashion to manifest said product; very high frequency regenerative storage means, operative at a pulse repetition rate of 50 megacycles, and including a full binary adder connected to be conjointly responsive to said variable phased 50 megacycle clock pulses and said reformed pulses for successively adding said series of reformed pulses to provide said serial product pulse train representative of said product, and a regenerative loop connected to receive said pulses representative of said product and apply said pulses delayed a predetermined time to said adder and having a pulse reshaper and retimer connected to be conjointly responsive to said pulses representative of said product and said variable phased 50 megacycle clock pulses to provide in an optimum time reformed pulses representative of said product; and means connected to receive the pulses in said loop and inherently responsive only to the pulses therein representing said product to thereby manifest said product.

5. In a very high speed serial binary digital computer operating at a pulse repetition rate of 50 megacycles, and employing a time-phased 50 megacycle clock pulse system for accomplishing arithmetic operations in a minimum of elapsed time, the provision of a dynamic storage loop adapted to store a binary quantity manifested by a serial train of ten millimicrosecond pulses at a pulse repetition rate of 50 megacycles, and periodically and concurrently retiming and reshaping the ten millimicrosecond pulses of said train with the time-phased 50 megacycle clock pulses of said time-phased clock pulse system, said dynamic storage loop including; a very high speed full binary adder operative at a pulse repetition rate of 50 megacycles, and having an addend input, an augend input, and a sum output terminal, for performing binary addition in less than thirty millimicroseconds per binary order; a loop reshaper and retimer circuit coupled to said binary adder and responsive to pulses from said time-phased 50 megacycle clock pulse system for repeatedly reshaping and retiming each ten millimicrosecond pulse of said pulse train by employing the time-phased 50 megacycle clock pulse most nearly concurrent therewith, said loop reshaper and retimer circuit including an interconnected AND circuit, diode and storage device; and a delay circuit coupling the output of said loop reshaper and retimer circuit to said augend input terminal of said binary adder whereby a quantity circulating in said loop may be increased by a binary quantity applied in the form of ten millimicrosecond pulses, at a pulse repetition rate of 50 megacycles, in synchronism with the quantity circulating in said loop, at the addend input terminal of said binary adder; said binary adder and said looper reshaper and retimer circuit each employing secondary emission type limiter amplifier means, said amplifier means consisting of, a secondary emission tube of the EFP 60 type having a cathode, a first grid, a second grid, a third grid, an anode, and a dynode, a first source of positive potential, a first resistor and a second resistor serially connected between said first source of positive potential and said anode, a first capacitor connected between the juncture of said first and second resistors and ground, a third resistor connected between the juncture of said first and second resistors and said second grid, an output terminal, a second source of positive potential, a fourth resistor, an inductance, and a fifth resistor serially connected in the order recited between said second source of positive potential and said output terminal, a sixth resistor connected between said output terminal and said dynode, a second capacitor connected between the juncture of said fourth resistor and said inductance, and ground, a gold bonded diode having its cathode connected in common to said cathode and said third grid of said secondary emission tube, and its anode connected to ground, a first source negative potential, and a seventh resistor connected between said cathode of said secondary emission tube and said first source of negative potential, an input terminal, a D.C. restorer and bias control circuit, said D.C. restorer and bias control circuit consisting, a common terminal, a diode having its cathode connected to the input terminal of said amplifier means and its anode connected to said common terminal, an eighth resistor connected between the input of said amplifier means and said common terminal, a third capacitor connected between said common terminal and ground, a ninth resistor connected between said common terminal and ground, a tenth resistor connected between said common terminal and a second source of negative potential, whereby an input pulse train of ten millimicrosecond varying amplitude pulses, at a pulse repetition rate of 50 megacycles, impressed on said input terminal of said secondary emission type limiter amplifier means will result in an output pulse train of ten millimicrosecond, predetermined constant amplitude pulses, at a pulse repetition rate of 50 megacycles appearing at said output terminal.

6. An electronic circuit operable at a very high frequency, namely in the order of 50 megacycles, and having means compensating for variations of input pulse amplitudes to provide output pulses having predetermined limited amplitudes including: a multi-grid secondary emission tube connected to receive a ten millimicrosecond input pulse of varying amplitude at one grid thereof; a resistor connected between a source of negative potential and the cathode of said tube; a normally conductive gold bonded diode having an anode and a cathode, said cathode of said diode being commonly connected to the cathode and another grid of said tube and said anode of said diode being connected to ground; and means for applying a ten millimicrosecond input pulse of varying amplitude to said one grid whereby said gold bonded diode is rendered non-conductive and said resistor provides degeneration to thereby cause a predetermined limited amplitude ten millimicrocrosecond pulse to appear at the dynode of said tube.

7. In a very high speed binary computing system employing information pulse trains consisting of pulses ten millimicroseconds in duration and at a pulse repetition rate of 50 megacycles, secondary emission type limiter amplifier means, said amplifier means consisting of: a secondary emission tube of the EFP 60 type having a cathode, a first grid, a second grid, a third grid, an anode, and a dynode; a first source of positive potential; a first resistor and a second resistor serially connected between said first source of positive potential and said anode; a first capacitor connected between the juncture of said first and second resistors and ground; a third resistor connected between the juncture of said first and second resistors and said second grid; an output terminal; a second source of positive potential; a fourth resistor, an inductance, and a fifth resistor serially connected in the order recited between said second source of positive potential and said output terminal; a sixth resistor connector connected between said output terminal and said dynode; a second capacitor connected between the juncture of said fourth resistor and said inductance, and ground; a gold bonded diode having its cathode connected in common to said cathode and said third grid of said secondary emission tube, and its anode connected to ground; a first source negative potential; a seventh resistor connected between said cathode of said secondary emission tube and said first source of negative potential; an input terminal; and a D.C. restorer and bias control circuit, said D.C. restorer and bias control circuit consisting of, a common terminal, a diode having its cathode connected to the input terminal of said amplifier means and its anode connected to said common terminal, an eighth resistor connected between the input of said amplifier means and said common terminal, a third capacitor connected between said common terminal and ground, a ninth resistor connected between said common terminal and ground, a tenth resistor connected between said common terminal and a second source of negative potential, whereby an input pulse train of ten millimicrosecond varying amplitude pulses, at a pulse repetition rate of 50 megacycles, impressed on said input terminal of said secondary emission type limiter amplifier means will result in an output pulse train of ten millimicrosecond, predetermined constant amplitude pulses, at a pulse repetition rate of 50 megacycles appearing at said output terminal.

8. A very high speed binary electronic multiplying system for obtaining the product, expressed in binary notation, of a multiplicand, expressed in binary notation, and a multiplier expressed in binary notation, said system comprising, in combination: first means for providing a source of primary clock pulses having a pulse repetition rate of 50 megacycles; second means synchronized with, and cooperating with said first means for providing a source of secondary clock pulses having a pulse repetition rate of 3.125 megacycles; multiplicand generating means cooperating with said first means for rendering an electrical manifestation of said multiplicand in the form of a serial pulse train of ten millimicrosecond pulses at a pulse repetition rate of 50 megacycles, said multiplicand generating means consisting of an input terminal for receiving said variable phase clock pulses at a pulse repetition rate of 3.125 megacycles, a first order binary gate including an input and an output and employing a settable bistable device, a direct connection between the input of said multiplicand generating means and said input of said first order binary gate, a second order binary gate identical to said first order binary gate, a first twenty millimicrosecond delay connected between said input of said multiplicand generating means and said input of said second order binary gate, a third order binary gate identical to said first order binary gate, a second twenty millimicrosecond delay connected between said input of said second order binary gate and said input of said third order binary gate, a fourth order binary gate identical to said first order binary gate, a third twenty millimicrosecond delay connected between said input of said third order binary gate and said input of said fourth order binary gate, a fifth order binary gate identical to said first order binary gate, a fourth twenty millimicrosecond delay connected between said input of said fourth order binary gate and said input of said fifth order binary gate, a resistor connected between said input of said fifth order binary gate and ground, an OR circuit having an output terminal and first through fifth input terminals respectively connected to said outputs of said first through fifth binary order gates, a grounded-grid amplifier having an input connected to said output of said OR circuit and employing a secondary emission tube of the EFP 60 type, said grounded-grid amplifier having an output connected to the dynode of said secondary emission tube; multiplier generating means, cooperating with said second means, for rendering an electrical manifestation of said multiplier in the form of a serial pulse train of 320 millimicrosecond pulses at a pulse repetition rate of 3.125 megacycles, said multiplier generating means consisting of first, second, third, fourth and fifth binary order delay circuit means, said first, second, third, fourth and fifth delay circuit means being respectively serially interconnected, first, second, third, fourth and fifth settable bistable devices respectively responsive to said first, second, third, fourth and fifth binary order delay circuit means, sync and clamp generator means coupled to said first, second, third, fourth and fifth delay circuit means and connected to receive variable phase clock pulses at a pulse repetition rate of 3.125 megacycles, said first, second, third, fourth and fifth delay circuit means each comprising a triode having an anode, a grid and a cathode, a first resistor, an inductance, and a second resistor serially connected in the order recited between a source of positive potential and said anode of said triode, a first capacitor connected between ground and the juncture of said first resistor and said inductance, a second capacitor and a third resistor connected between said anode and said cathode of said triode; and additional means, cooperating with all of the above recited means, for providing an electrical manifestation representative of said product in the form of a serial pulse train of precisely timed, constant amplitude, ten millimicrosecond pulses at a pulse repetition rate of 50 megacycles, said additional means including partial product generator means, said partial product generator means consisting of an input terminal for receiving said serial ten millimicrosecond pulses from said output of said grounded-grid amplifier and an output terminal for providing said succession of partial products, a limiter amplifier, a first cathode follower, a fifth twenty millimicrosecond delay, a sixth twenty millimicrosecond delay, a seventh twenty millimicrosecond delay, an eighth twenty millimicrosecond delay and a resistor serially connected in the order recited between said input terminal of said partial product generator means and ground; an OR circuit having first, second, third, fourth and fifth input terminals and an output terminal, first, second, third, fourth and fifth AND circuits, each of said AND circuits having first and second inputs and an output, said first, second, third, fourth and fifth AND circuits having their second inputs respectively connected to said first, second, third, fourth and fifth settable bistable devices of said multiplier generating means a second cathode follower coupling said first input of said first AND circuit to said first cathode follower, a third cathode follower coupling said first input of said second AND circuit to the juncture of said first and sixth twenty millimicrosecond delays, a fourth cathode follower coupling said first input of said third AND circuit of the juncture of said sixth and seventh twenty millimicrosecond delays, a fifth cathode follower coupling said first input of said fourth AND circuit to the juncture of said seventh and eighth twenty millimicrosecond delays, a sixth cathode follower coupling said first input of said fifth AND circuit to the juncture of said eigth twenty millimicrosecond delay and said resistor, sixth, seventh, eighth, ninth, tenth and eleventh cathode followers respectively coupling said outputs of said first, second, third, fourth and fifth AND circuits to said first, second, third, fourth and fifth inputs of said OR circuit, a limiter amplifier and a twelfth cathode follower serially interconnected between the output of said OR circuit and the output of said partial product generator means.

References Cited in the file of this patent

UNITED STATES PATENTS

| | | |
|---|---|---|
| 2,429,228 | Herbst | Oct. 21, 1947 |
| 2,479,954 | Moore | Aug. 23, 1949 |
| 2,495,684 | Bartels | Jan. 31, 1950 |
| 2,560,576 | Hoeppner | July 17, 1951 |
| 2,564,824 | White | Aug. 21, 1951 |
| 2,617,930 | Cutler | Nov. 11, 1952 |
| 2,686,632 | Wilkinson | Aug. 17, 1954 |
| 2,700,502 | Hamilton et al. | Jan. 25, 1955 |
| 2,709,042 | Couffignal | May 24, 1955 |
| 2,745,004 | Yeo Pay Yu | May 8, 1956 |
| 2,749,037 | Stibitz | June 5, 1956 |
| 2,758,787 | Felker | Aug. 14, 1956 |
| 2,765,115 | Beloungie | Oct. 2, 1956 |
| 2,776,794 | Williams et al. | Jan. 8, 1957 |
| 2,781,968 | Chenus | Feb. 19, 1957 |
| 2,786,628 | Kilburn | Mar. 26, 1957 |

FOREIGN PATENTS

| | | |
|---|---|---|
| 736,144 | Great Britain | Sept. 7, 1955 |
| 182,249 | Austria | Jan. 29, 1959 |

OTHER REFERENCES

Wells: Fast Pulse Circuit Techniques for Scintillation Counters, Nucleonics, vol. 10, No. 4, McGraw-Hill Publishing Company, Inc., copyright 1952 (pp. 28–30 and FIG. 8). (Copy in Div. 46.)

Moody et al.: Millimicrosecond Pulse Techniques, Electronic Engineering, May 1952 (pp. 214–219).